US012809268B2

(12) United States Patent
Peter et al.

(10) Patent No.: US 12,809,268 B2
(45) Date of Patent: Nov. 24, 2026

(54) REWORK OF METAL-CONTAINING PHOTORESIST

(71) Applicant: Lam Research Corporation, Fremont, CA (US)

(72) Inventors: Daniel Peter, Sunnyvale, CA (US); Meng Xue, Milpitas, CA (US); Da Li, Newark, CA (US); Jengyi Yu, San Ramon, CA (US); Samantha SiamHwa Tan, Newark, CA (US); Wook Choi, San Jose, CA (US)

(73) Assignee: Lam Research Corporation, Fremont, CA (US)

(*) Notice: Subject to any disclaimer, the term of this patent is extended or adjusted under 35 U.S.C. 154(b) by 191 days.

(21) Appl. No.: 18/580,334

(22) PCT Filed: Jul. 20, 2022

(86) PCT No.: PCT/US2022/037733
§ 371 (c)(1),
(2) Date: Jan. 18, 2024

(87) PCT Pub. No.: WO2023/009364
PCT Pub. Date: Feb. 2, 2023

(65) Prior Publication Data

US 2025/0093781 A1 Mar. 20, 2025

Related U.S. Application Data

(60) Provisional application No. 63/203,715, filed on Jul. 29, 2021.

(51) Int. Cl.
*G03F 7/42* (2006.01)
*H10P 50/28* (2026.01)

(52) U.S. Cl.
CPC ............ *G03F 7/427* (2013.01); *H10P 50/283* (2026.01)

(58) Field of Classification Search
CPC ...... G03F 7/427; G03F 7/0042; G03F 7/0043; G03F 7/405; G03F 7/423; G03F 7/42;
(Continued)

(56) References Cited

U.S. PATENT DOCUMENTS 3,442,648 A 5/1969 Smith et al.
3,513,010 A 5/1970 Notley et al.
(Continued)

FOREIGN PATENT DOCUMENTS

CN 1495861 A 5/2004
CN 1841201 A 10/2006
(Continued)

OTHER PUBLICATIONS

Banerjee, D. et al., "Potential of Metal-Organic Frameworks for Separation of Xenon and Krypton", Accounts of Chemical Research, 2015, vol. 48, No. 2, pp. 211-219.
(Continued)

*Primary Examiner* — Duy Vu N Deo
(74) *Attorney, Agent, or Firm* — Weaver Austin Villeneuve & Sampson LLP

(57) ABSTRACT

Photoresist rework of metal-containing photoresist is disclosed. Rework can be accomplished using a thermal process by exposing a substrate to an elevated temperature and an etch gas. Rework can be also accomplished using a wet process by exposing the substrate to an inorganic acidic solution. Residue or other contaminants may be cleaned up from the substrate after rework by exposure to high temperatures, plasma, or wet clean.

26 Claims, 13 Drawing Sheets

(58) Field of Classification Search
CPC ......... H01L 21/31116; H01L 21/31133; H01L 21/31138; H01L 21/67109; H01L 21/67167; H01L 21/6719; H01L 21/67201; H01L 21/67259; H01L 21/6831
USPC .................................................. 438/704–714
See application file for complete search history.

(56) References Cited

U.S. PATENT DOCUMENTS

| | | | |
|---|---|---|---|
| 3,529,963 | A | 9/1970 | Marchese et al. |
| 3,576,755 | A | 4/1971 | Patella et al. |
| 3,720,515 | A | 3/1973 | Stanley |
| 4,061,829 | A | 12/1977 | Taylor |
| 4,241,165 | A | 12/1980 | Hughes et al. |
| 4,292,384 | A | 9/1981 | Straughan et al. |
| 4,314,022 | A | 2/1982 | Fisch |
| 4,328,298 | A | 5/1982 | Nester |
| 4,341,592 | A | 7/1982 | Shortes et al. |
| 4,396,704 | A | 8/1983 | Taylor |
| 4,590,149 | A | 5/1986 | Nakane et al. |
| 4,738,748 | A | 4/1988 | Kisa |
| 4,806,456 | A | 2/1989 | Katoh |
| 4,814,243 | A | 3/1989 | Ziger |
| 4,834,834 | A | 5/1989 | Ehrlich et al. |
| 4,842,989 | A | 6/1989 | Taniguchi et al. |
| 4,845,053 | A | 7/1989 | Zajac |
| 4,940,854 | A | 7/1990 | Debe |
| 5,077,085 | A | 12/1991 | Schnur et al. |
| 5,094,936 | A | 3/1992 | Misium et al. |
| 5,108,875 | A | 4/1992 | Thackeray et al. |
| 5,206,706 | A | 4/1993 | Quinn |
| 5,322,765 | A | 6/1994 | Clecak et al. |
| 5,399,464 | A | 3/1995 | Lee |
| 5,445,988 | A | 8/1995 | Schwalke |
| 5,534,312 | A | 7/1996 | Hill et al. |
| 5,683,857 | A | 11/1997 | Shirai et al. |
| 5,761,023 | A | 6/1998 | Lue et al. |
| 5,798,203 | A | 8/1998 | Haraguchi et al. |
| 5,914,278 | A | 6/1999 | Boitnott et al. |
| 5,925,494 | A | 7/1999 | Horn |
| 6,013,418 | A | 1/2000 | Ma et al. |
| 6,017,553 | A | 1/2000 | Burrell et al. |
| 6,045,877 | A | 4/2000 | Gleason et al. |
| 6,162,577 | A | 12/2000 | Felter et al. |
| 6,171,758 | B1 | 1/2001 | Bhateja et al. |
| 6,179,922 | B1 | 1/2001 | Ishikawa et al. |
| 6,183,934 | B1 | 2/2001 | Kawamonzen |
| 6,245,650 | B1 | 6/2001 | Watanabe |
| 6,261,938 | B1 | 7/2001 | Beauvais et al. |
| 6,290,779 | B1 | 9/2001 | Saleh et al. |
| 6,313,035 | B1 | 11/2001 | Sandhu et al. |
| 6,319,654 | B1 | 11/2001 | Kim et al. |
| 6,348,239 | B1 | 2/2002 | Hill et al. |
| 6,410,421 | B1 | 6/2002 | Ghandehari et al. |
| 6,448,097 | B1 | 9/2002 | Singh et al. |
| 6,566,276 | B2 | 5/2003 | Maloney et al. |
| 6,573,030 | B1 | 6/2003 | Fairbairn et al. |
| 6,607,867 | B1 | 8/2003 | Kim et al. |
| 6,666,986 | B1 | 12/2003 | Vaartstra |
| 6,797,439 | B1 | 9/2004 | Alpay |
| 6,833,306 | B2 | 12/2004 | Lyding et al. |
| 6,841,341 | B2 | 1/2005 | Fairbairn et al. |
| 6,841,943 | B2 | 1/2005 | Vahedi et al. |
| 6,867,086 | B1 | 3/2005 | Chen et al. |
| 7,112,489 | B1 | 9/2006 | Lyons et al. |
| 7,169,440 | B2 | 1/2007 | Balasubramaniam et al. |
| 7,223,526 | B2 | 5/2007 | Fairbairn et al. |
| 7,232,742 | B1 | 6/2007 | Maekawa |
| 7,307,695 | B2 | 12/2007 | Hazenberg et al. |
| 7,335,462 | B2 | 2/2008 | Fairbairn et al. |
| 7,438,534 | B2 | 10/2008 | Holland et al. |
| 7,608,367 | B1 | 10/2009 | Aigeldinger et al. |
| 8,083,862 | B2 | 12/2011 | Brown |
| 8,227,182 | B2 | 7/2012 | Lee et al. |
| 8,383,316 | B2 | 2/2013 | Cooper et al. |
| 8,465,903 | B2 | 6/2013 | Weidman et al. |
| 8,536,068 | B2 | 9/2013 | Weidman et al. |
| 8,552,334 | B2 | 10/2013 | Tappan et al. |
| 8,664,124 | B2 | 3/2014 | Graff |
| 8,664,513 | B2 | 3/2014 | Pfenninger et al. |
| 8,703,386 | B2 | 4/2014 | Bass et al. |
| 8,808,561 | B2 | 8/2014 | Kanarik |
| 8,826,926 | B2 | 9/2014 | Chalom et al. |
| 8,883,028 | B2 | 11/2014 | Kanarik |
| 8,883,405 | B2 | 11/2014 | Shiobara |
| 9,023,731 | B2 | 5/2015 | Ji et al. |
| 9,261,784 | B2 | 2/2016 | Wuister et al. |
| 9,281,207 | B2 | 3/2016 | Stowers et al. |
| 9,310,684 | B2 | 4/2016 | Meyers et al. |
| 9,551,924 | B2 | 1/2017 | Burkhardt et al. |
| 9,576,811 | B2 | 2/2017 | Kanarik et al. |
| 9,632,411 | B2 | 4/2017 | Michaelson et al. |
| 9,719,169 | B2 | 8/2017 | Mohn et al. |
| 9,735,002 | B2 | 8/2017 | Kawaguchi et al. |
| 9,778,561 | B2 | 10/2017 | Marks et al. |
| 9,790,595 | B2 | 10/2017 | Jung et al. |
| 9,823,564 | B2 | 11/2017 | Stowers et al. |
| 9,829,805 | B2 | 11/2017 | Michaelson et al. |
| 9,996,004 | B2 | 6/2018 | Smith et al. |
| 10,025,179 | B2 | 7/2018 | Meyers et al. |
| 10,074,543 | B2 | 9/2018 | Mahorowala et al. |
| 10,228,618 | B2 | 3/2019 | Meyers et al. |
| 10,304,668 | B2 | 5/2019 | Coppa et al. |
| 10,416,554 | B2 | 9/2019 | Meyers et al. |
| 10,461,229 | B1 * | 10/2019 | West .................... H10H 20/856 |
| 10,514,598 | B2 | 12/2019 | Marks et al. |
| 10,515,812 | B1 | 12/2019 | Wang et al. |
| 10,566,212 | B2 | 2/2020 | Kanarik |
| 10,580,585 | B2 | 3/2020 | Snaith et al. |
| 10,627,719 | B2 | 4/2020 | Waller et al. |
| 10,642,153 | B2 | 5/2020 | Meyers et al. |
| 10,649,328 | B2 | 5/2020 | Stowers et al. |
| 10,679,843 | B2 | 6/2020 | Jeong et al. |
| 10,732,505 | B1 | 8/2020 | Meyers et al. |
| 10,763,083 | B2 | 9/2020 | Yang et al. |
| 10,775,696 | B2 | 9/2020 | Meyers et al. |
| 10,782,610 | B2 | 9/2020 | Stowers et al. |
| 10,787,466 | B2 | 9/2020 | Edson et al. |
| 10,796,912 | B2 | 10/2020 | Shamma et al. |
| 10,815,391 | B2 | 10/2020 | Lee et al. |
| 10,831,096 | B2 | 11/2020 | Marks et al. |
| 11,079,682 | B1 | 8/2021 | Han et al. |
| 11,209,729 | B2 | 12/2021 | Marks et al. |
| 11,257,674 | B2 | 2/2022 | Shamma et al. |
| 11,314,168 | B2 | 4/2022 | Tan et al. |
| 11,462,417 | B2 | 10/2022 | Delmas et al. |
| 11,988,965 | B2 | 5/2024 | Tan et al. |
| 12,105,422 | B2 | 10/2024 | Tan et al. |
| 12,183,604 | B2 | 12/2024 | Yu et al. |
| 12,211,691 | B2 | 1/2025 | Volosskiy et al. |
| 12,278,125 | B2 | 4/2025 | Yu et al. |
| 12,346,035 | B2 | 7/2025 | Dictus et al. |
| 12,436,464 | B2 | 10/2025 | Weidman et al. |
| 12,474,640 | B2 | 11/2025 | Lee et al. |
| 12,504,692 | B2 | 12/2025 | Li et al. |
| 12,510,825 | B2 | 12/2025 | Tan et al. |
| 12,510,826 | B2 | 12/2025 | Tan et al. |
| 12,601,974 | B2 | 4/2026 | Weidman et al. |
| 12,601,976 | B2 | 4/2026 | Li et al. |
| 2001/0024769 | A1 | 9/2001 | Donoghue et al. |
| 2001/0055731 | A1 | 12/2001 | Irie |
| 2002/0015855 | A1 | 2/2002 | Sajoto et al. |
| 2002/0017243 | A1 | 2/2002 | Pyo |
| 2002/0123221 | A1 | 9/2002 | Jost et al. |
| 2002/0180372 | A1 | 12/2002 | Yamazaki |
| 2002/0185067 | A1 | 12/2002 | Upham |
| 2002/0197556 | A1 | 12/2002 | Huang et al. |
| 2003/0008246 | A1 | 1/2003 | Cheng et al. |
| 2003/0027060 | A1 | 2/2003 | Lederer |
| 2003/0049571 | A1 | 3/2003 | Hallock et al. |
| 2003/0134231 | A1 | 7/2003 | Tsai et al. |
| 2003/0183244 | A1 | 10/2003 | Rossman |
| 2004/0067444 | A1 | 4/2004 | Wakabayashi et al. |
| 2004/0084412 | A1 | 5/2004 | Waldfried et al. |

(56) References Cited

U.S. PATENT DOCUMENTS

2004/0097388 A1 5/2004 Brask et al.
2004/0113087 A1 6/2004 Ikeda et al.
2004/0115956 A1 6/2004 Ishida
2004/0121264 A1 6/2004 Liegl et al.
2004/0175631 A1 9/2004 Crocker et al.
2004/0178076 A1 9/2004 Stonas et al.
2004/0191423 A1 9/2004 Ruan et al.
2004/0203256 A1 10/2004 Yang et al.
2004/0209201 A1 10/2004 Nakano et al.
2004/0213563 A1 10/2004 Irie
2004/0229169 A1 11/2004 Sandstrom
2004/0233401 A1 11/2004 Irie
2004/0241561 A1 12/2004 Chen et al.
2005/0142885 A1 6/2005 Shinriki
2005/0167617 A1 8/2005 Derra et al.
2005/0170655 A1* 8/2005 Bencher .................... G03F 1/46 430/311
2005/0208389 A1 9/2005 Ishibashi et al.
2005/0250052 A1 11/2005 Nguyen
2005/0253077 A1 11/2005 Ikeda et al.
2005/0257747 A1 11/2005 Wakabayashi et al.
2006/0001064 A1 1/2006 Hill et al.
2006/0046470 A1 3/2006 Becknell et al.
2006/0068173 A1 3/2006 Kajiyama et al.
2006/0128127 A1 6/2006 Seo et al.
2006/0147818 A1 7/2006 Lee
2006/0151462 A1 7/2006 Lee et al.
2006/0166537 A1 7/2006 Thompson et al.
2006/0172530 A1 8/2006 Cheng et al.
2006/0175558 A1 8/2006 Bakker et al.
2006/0228897 A1 10/2006 Timans
2006/0246713 A1 11/2006 Tsai et al.
2006/0287207 A1 12/2006 Park et al.
2007/0017386 A1 1/2007 Kamei
2007/0037357 A1 2/2007 Culp
2007/0037410 A1 2/2007 Chang et al.
2007/0074541 A1 4/2007 Badding et al.
2007/0117040 A1 5/2007 Brock et al.
2007/0181816 A1 8/2007 Ikeda et al.
2007/0212889 A1 9/2007 Abatchev et al.
2007/0259492 A1 11/2007 Roh, II et al.
2007/0287073 A1 12/2007 Goodwin
2008/0004203 A1 1/2008 Scheuing et al.
2008/0070128 A1 3/2008 Wu et al.
2008/0145793 A1 6/2008 Patel et al.
2008/0157011 A1 7/2008 Nagai et al.
2008/0236620 A1 10/2008 Shih et al.
2009/0041650 A1 2/2009 Watanabe et al.
2009/0134119 A1 5/2009 Matsumaru et al.
2009/0153826 A1 6/2009 Sewell et al.
2009/0197086 A1 8/2009 Rathi et al.
2009/0208880 A1 8/2009 Nemani et al.
2009/0239155 A1 9/2009 Levinson et al.
2009/0286402 A1 11/2009 Xia et al.
2009/0305174 A1 12/2009 Shiobara et al.
2009/0317742 A1 12/2009 Toriumi et al.
2009/0321707 A1 12/2009 Metz et al.
2009/0325387 A1 12/2009 Chen et al.
2010/0009274 A1 1/2010 Yamamoto
2010/0022078 A1 1/2010 Rockenberger et al.
2010/0051446 A1 3/2010 Wang et al.
2010/0068660 A1 3/2010 Shibazaki et al.
2010/0075508 A1 3/2010 Seino et al.
2010/0086880 A1 4/2010 Saito et al.
2010/0131093 A1 5/2010 Yokoyama et al.
2010/0197135 A1 8/2010 Ishizaka
2010/0209855 A1 8/2010 Tanaka
2010/0216310 A1 8/2010 Metz et al.
2010/0260994 A1 10/2010 Groenen et al.
2010/0266969 A1 10/2010 Shiraishi et al.
2010/0297847 A1 11/2010 Cheng et al.
2010/0304027 A1 12/2010 Lee et al.
2010/0310790 A1 12/2010 Chang et al.
2010/0330503 A1 12/2010 Bae et al.
2011/0028000 A1 2/2011 Rogojina et al.
2011/0104595 A1 5/2011 Hayashi et al.
2011/0117702 A1 5/2011 Rietzler et al.
2011/0174606 A1 7/2011 Funk et al.
2011/0184139 A1 7/2011 Malik et al.
2011/0195142 A1 8/2011 Mitamura et al.
2011/0195362 A1 8/2011 Watanabe et al.
2011/0198756 A1 8/2011 Thenappan et al.
2011/0200953 A1 8/2011 Arima et al.
2011/0209725 A1 9/2011 Kim et al.
2011/0242508 A1 10/2011 Kobayashi
2011/0244402 A1 10/2011 Carcasi et al.
2011/0244680 A1 10/2011 Tohnoe et al.
2011/0266252 A1 11/2011 Thadani et al.
2011/0292356 A1 12/2011 Tsukinoki et al.
2011/0308942 A1 12/2011 Liu et al.
2012/0024388 A1 2/2012 Burrows et al.
2012/0068347 A1 3/2012 Isobayashi et al.
2012/0088193 A1 4/2012 Weidman et al.
2012/0088369 A1 4/2012 Weidman et al.
2012/0090547 A1 4/2012 Wang et al.
2012/0126358 A1 5/2012 Arnold et al.
2012/0161405 A1 6/2012 Mohn et al.
2012/0183689 A1 7/2012 Suzuki et al.
2012/0193762 A1 8/2012 Lin et al.
2012/0202357 A1 8/2012 Sato et al.
2012/0208125 A1 8/2012 Hatakeyama
2012/0223418 A1 9/2012 Stowers et al.
2012/0322011 A1 12/2012 Wu et al.
2013/0023124 A1 1/2013 Nemani et al.
2013/0029270 A1 1/2013 Hatakeyama
2013/0129995 A1 5/2013 Ouattara et al.
2013/0157177 A1 6/2013 Yu et al.
2013/0164691 A1 6/2013 Shiobara
2013/0177847 A1 7/2013 Chatterjee et al.
2013/0183609 A1 7/2013 Seon et al.
2013/0224652 A1 8/2013 Bass et al.
2013/0273733 A1 10/2013 Tang et al.
2013/0299089 A1 11/2013 Kim et al.
2013/0323652 A1 12/2013 Fernandez et al.
2013/0330928 A1 12/2013 Ishikawa et al.
2013/0330932 A1 12/2013 Rangarajan et al.
2014/0014745 A1 1/2014 Burrows et al.
2014/0120688 A1 5/2014 Booth, Jr. et al.
2014/0134827 A1 5/2014 Swaminathan et al.
2014/0170563 A1 6/2014 Hatakeyama
2014/0170853 A1 6/2014 Shamma et al.
2014/0175617 A1 6/2014 Antonelli et al.
2014/0193580 A1 7/2014 Tiron et al.
2014/0206200 A1 7/2014 Nelson
2014/0209015 A1 7/2014 Yamada et al.
2014/0220489 A1 8/2014 Kozuma et al.
2014/0220495 A1 8/2014 Bozano et al.
2014/0239462 A1 8/2014 Shamma et al.
2014/0255844 A1 9/2014 Iwao et al.
2014/0263172 A1 9/2014 Xie et al.
2014/0268082 A1 9/2014 Michaelson et al.
2014/0272726 A1 9/2014 Chang
2015/0020848 A1 1/2015 Kim et al.
2015/0041809 A1 2/2015 Arnold et al.
2015/0056542 A1 2/2015 Meyers et al.
2015/0077733 A1 3/2015 Huang et al.
2015/0079393 A1 3/2015 Freedman et al.
2015/0096683 A1 4/2015 Deshmukh et al.
2015/0125679 A1 5/2015 Ishikawa
2015/0132965 A1 5/2015 Devilliers et al.
2015/0152551 A1 6/2015 Yamaguchi et al.
2015/0170957 A1 6/2015 Tsao
2015/0194343 A1 7/2015 Chi et al.
2015/0217330 A1 8/2015 Haukka et al.
2015/0218695 A1 8/2015 Odedra
2015/0221519 A1 8/2015 Marks et al.
2015/0243520 A1 8/2015 Park et al.
2015/0270148 A1 9/2015 Shinoda et al.
2015/0303064 A1 10/2015 Singer et al.
2015/0332922 A1 11/2015 Chien et al.
2015/0355549 A1 12/2015 Xie et al.
2016/0011505 A1 1/2016 Stowers et al.
2016/0011516 A1 1/2016 Devilliers
2016/0021660 A1 1/2016 Krishnamurthy

(56) References Cited

U.S. PATENT DOCUMENTS

2016/0035631 A1 2/2016 Lee et al.
2016/0041471 A1 2/2016 Briend et al.
2016/0062232 A1* 3/2016 Hong .................... G03F 7/0397 430/325
2016/0086864 A1 3/2016 Fischer et al.
2016/0116839 A1* 4/2016 Meyers ................. G03F 7/0042 430/326
2016/0118246 A1 4/2016 Kang et al.
2016/0126106 A1 5/2016 Shimizu et al.
2016/0135274 A1 5/2016 Fischer et al.
2016/0179005 A1 6/2016 Shamma et al.
2016/0216606 A1 7/2016 Meyers et al.
2016/0260588 A1 9/2016 Park et al.
2016/0284559 A1 9/2016 Kikuchi et al.
2016/0293405 A1 10/2016 Matsumoto et al.
2016/0314964 A1 10/2016 Tang et al.
2016/0343544 A1 11/2016 Watanabe et al.
2016/0357103 A1 12/2016 Nagahara et al.
2016/0357107 A1 12/2016 Buchberger, Jr. et al.
2016/0365248 A1 12/2016 Mebarki et al.
2016/0379824 A1 12/2016 Wise et al.
2017/0004974 A1 1/2017 Manna et al.
2017/0010535 A1 1/2017 Fujitani et al.
2017/0018506 A1 1/2017 Cao et al.
2017/0066225 A1 3/2017 Chen et al.
2017/0069462 A1 3/2017 Kanarik et al.
2017/0084475 A1 3/2017 Wagner et al.
2017/0092495 A1 3/2017 Chen et al.
2017/0097569 A1 4/2017 Yang et al.
2017/0097570 A1 4/2017 Tagawa
2017/0102612 A1 4/2017 Meyers et al.
2017/0146909 A1 5/2017 Smith et al.
2017/0154766 A1 6/2017 Ogihara et al.
2017/0168398 A1 6/2017 Zi et al.
2017/0176858 A1 6/2017 Hirano
2017/0184961 A1 6/2017 Nakagawa et al.
2017/0192357 A1 7/2017 Carcasi et al.
2017/0229325 A1 8/2017 Lubomirsky et al.
2017/0261850 A1 9/2017 Stowers et al.
2017/0342553 A1 11/2017 Yu et al.
2018/0004083 A1 1/2018 Marks et al.
2018/0012759 A1 1/2018 Smith et al.
2018/0023192 A1 1/2018 Chandra et al.
2018/0039172 A1 2/2018 Stowers et al.
2018/0039182 A1 2/2018 Zi et al.
2018/0046086 A1* 2/2018 Waller .................... G03F 7/168
2018/0061663 A1 3/2018 Chandrashekar et al.
2018/0093306 A1 4/2018 Kang et al.
2018/0096840 A1 4/2018 Jeong et al.
2018/0122648 A1 5/2018 Kim et al.
2018/0149976 A1 5/2018 Liu et al.
2018/0151350 A1 5/2018 Li
2018/0164689 A1 6/2018 Sano et al.
2018/0166278 A1 6/2018 Belyansky et al.
2018/0173096 A1 6/2018 Zi et al.
2018/0204727 A1* 7/2018 Hee ...................... H10D 30/681
2018/0224744 A1 8/2018 Bae et al.
2018/0233362 A1 8/2018 Glodde et al.
2018/0233398 A1 8/2018 Van Cleemput et al.
2018/0307137 A1 10/2018 Meyers et al.
2018/0308687 A1 10/2018 Smith et al.
2018/0314167 A1 11/2018 Chang et al.
2018/0323064 A1 11/2018 Jung et al.
2018/0337046 A1 11/2018 Shamma et al.
2018/0354804 A1 12/2018 Venkatasubramanian et al.
2018/0356731 A1 12/2018 Tagawa
2019/0027357 A1 1/2019 Girard et al.
2019/0041755 A1 2/2019 Tanaka et al.
2019/0043694 A1* 2/2019 Park .................. H01J 37/32091
2019/0043731 A1 2/2019 Bristol et al.
2019/0056914 A1 2/2019 Ma et al.
2019/0094685 A1 3/2019 Marks et al.
2019/0129307 A1 5/2019 Kwon et al.
2019/0131130 A1 5/2019 Smith et al.
2019/0137870 A1 5/2019 Meyers et al.
2019/0146337 A1 5/2019 Zi et al.
2019/0153001 A1 5/2019 Cardineau et al.
2019/0163056 A1 5/2019 Maes et al.
2019/0163065 A1 5/2019 Hatakeyama et al.
2019/0172714 A1 6/2019 Bobek et al.
2019/0187556 A1 6/2019 Park et al.
2019/0189428 A1 6/2019 De Silva et al.
2019/0198338 A1 6/2019 Kim et al.
2019/0204749 A1 7/2019 Tel et al.
2019/0244809 A1 8/2019 Ono
2019/0258160 A1 8/2019 Satoh et al.
2019/0259601 A1 8/2019 De Silva et al.
2019/0308998 A1 10/2019 Cardineau et al.
2019/0315781 A1 10/2019 Edson et al.
2019/0315782 A1 10/2019 Edson et al.
2019/0332014 A1 10/2019 Ookubo et al.
2019/0333777 A1 10/2019 Hsieh et al.
2019/0348292 A1 11/2019 Dutta et al.
2019/0352776 A1 11/2019 Parikh
2019/0369489 A1 12/2019 Meyers et al.
2019/0382890 A1 12/2019 Lerner et al.
2019/0391486 A1 12/2019 Jiang et al.
2020/0041897 A1 2/2020 Moon et al.
2020/0041901 A1 2/2020 Namgung et al.
2020/0050109 A1 2/2020 Ho et al.
2020/0064733 A1 2/2020 Meyers et al.
2020/0066536 A1 2/2020 Yaegashi
2020/0089104 A1 3/2020 Marks et al.
2020/0096870 A1 3/2020 Ma et al.
2020/0124970 A1 4/2020 Kocsis et al.
2020/0133131 A1 4/2020 Ouyang
2020/0133133 A1 4/2020 Park et al.
2020/0166845 A1 5/2020 Berendsen et al.
2020/0174374 A1 6/2020 Liao et al.
2020/0176246 A1 6/2020 Huotari et al.
2020/0209756 A1 7/2020 Waller et al.
2020/0239498 A1 7/2020 Clark et al.
2020/0241413 A1 7/2020 Clark et al.
2020/0257196 A1 8/2020 Meyers et al.
2020/0292937 A1 9/2020 Stowers et al.
2020/0326627 A1 10/2020 Jiang et al.
2020/0393765 A1 12/2020 Sakanishi
2021/0005425 A1 1/2021 Yang et al.
2021/0013034 A1 1/2021 Wu et al.
2021/0013037 A1 1/2021 Sun et al.
2021/0041784 A1 2/2021 Chen et al.
2021/0063871 A1 3/2021 Kobayashi et al.
2021/0111025 A1 4/2021 Zyulkov et al.
2021/0216016 A1 7/2021 Tagawa
2021/0271170 A1 9/2021 Telecky et al.
2021/0287909 A1 9/2021 Zhou et al.
2021/0302833 A1 9/2021 Weng et al.
2021/0305040 A1 9/2021 Kuo et al.
2021/0349390 A1 11/2021 De Schepper et al.
2021/0397085 A1 12/2021 Weidman et al.
2022/0002882 A1 1/2022 Kalutarage et al.
2022/0020584 A1 1/2022 Volosskiy et al.
2022/0028684 A1 1/2022 Chen et al.
2022/0035247 A1 2/2022 Tan et al.
2022/0037152 A1 2/2022 Raley et al.
2022/0043334 A1 2/2022 Tan et al.
2022/0059362 A1 2/2022 Li et al.
2022/0075260 A1 3/2022 Marks et al.
2022/0122846 A1 4/2022 Shamma et al.
2022/0157617 A1 5/2022 Zhou et al.
2022/0216050 A1 7/2022 Yu et al.
2022/0244645 A1 8/2022 Tan et al.
2022/0299877 A1 9/2022 Weidman et al.
2022/0308454 A1 9/2022 Weidman et al.
2022/0308462 A1 9/2022 Berney et al.
2022/0317572 A1 10/2022 Meijer et al.
2022/0342301 A1 10/2022 Weidman et al.
2022/0344136 A1 10/2022 Peter et al.
2022/0359280 A1 11/2022 Yang et al.
2022/0365434 A1 11/2022 Nardi et al.
2022/0404713 A1 12/2022 Tapily
2023/0031955 A1 2/2023 Yu et al.
2023/0045336 A1 2/2023 Yu et al.
2023/0078946 A1 3/2023 Grzeskowiak et al.

(56) References Cited

U.S. PATENT DOCUMENTS

| | | | |
|---|---|---|---|
| 2023/0100995 | A1 | 3/2023 | Cardineau et al. |
| 2023/0107357 | A1 | 4/2023 | Dictus et al. |
| 2023/0126516 | A1 | 4/2023 | Wang et al. |
| 2023/0152701 | A1 | 5/2023 | Kanakasabapathy |
| 2023/0152705 | A1 | 5/2023 | Grzeskowiak et al. |
| 2023/0185196 | A1 | 6/2023 | Weidman et al. |
| 2023/0230811 | A1 | 7/2023 | Yu et al. |
| 2023/0259025 | A1 | 8/2023 | Hansen et al. |
| 2023/0266662 | A1 | 8/2023 | Marks et al. |
| 2023/0266664 | A1 | 8/2023 | Hansen et al. |
| 2023/0266670 | A1 | 8/2023 | Hansen et al. |
| 2023/0273516 | A1 | 8/2023 | Marks et al. |
| 2023/0288798 | A1 | 9/2023 | Hansen et al. |
| 2023/0290657 | A1 | 9/2023 | Yu et al. |
| 2023/0314946 | A1 | 10/2023 | Hansen et al. |
| 2023/0314954 | A1 | 10/2023 | Peter et al. |
| 2023/0341781 | A1 | 10/2023 | Han et al. |
| 2023/0416606 | A1 | 12/2023 | Dictus et al. |
| 2024/0027900 | A1 | 1/2024 | Hajibabaeinajafabad, I et al. |
| 2024/0036473 | A1 | 2/2024 | Fujimoto et al. |
| 2024/0036474 | A1 | 2/2024 | Peter et al. |
| 2024/0036483 | A1 | 2/2024 | Dictus et al. |
| 2024/0045332 | A1 | 2/2024 | Tapily et al. |
| 2024/0045337 | A1 | 2/2024 | Hajibabaeinajafabad, I et al. |
| 2024/0053684 | A1 | 2/2024 | Hajibabaeinajafabad, I et al. |
| 2024/0145272 | A1 | 5/2024 | Yu et al. |
| 2024/0192590 | A1 | 6/2024 | Kanakasabapathy et al. |
| 2024/0329538 | A1 | 10/2024 | Li et al. |
| 2024/0329539 | A1 | 10/2024 | Tan et al. |
| 2024/0355650 | A1 | 10/2024 | Kanakasabapathy et al. |
| 2024/0361696 | A1 | 10/2024 | Tan et al. |
| 2024/0419078 | A1 | 12/2024 | Tan et al. |
| 2025/0053080 | A1 | 2/2025 | Marks et al. |
| 2025/0053084 | A1 | 2/2025 | Hansen et al. |
| 2025/0053092 | A1 | 2/2025 | Kenane et al. |
| 2025/0060673 | A1 | 2/2025 | Wu et al. |
| 2025/0060674 | A1 | 2/2025 | Li et al. |
| 2025/0112045 | A1 | 4/2025 | Volosskiy et al. |
| 2025/0244672 | A1 | 7/2025 | Weidman et al. |
| 2025/0244677 | A1 | 7/2025 | Li et al. |
| 2025/0244678 | A1 | 7/2025 | Lee et al. |
| 2025/0246460 | A1 | 7/2025 | Yu et al. |
| 2025/0250485 | A1 | 8/2025 | Dictus et al. |
| 2025/0271766 | A1 | 8/2025 | Hansen et al. |
| 2025/0271782 | A1 | 8/2025 | Dictus et al. |
| 2025/0291255 | A1 | 9/2025 | Lee et al. |
| 2026/0036908 | A1 | 2/2026 | Lee et al. |

FOREIGN PATENT DOCUMENTS

| | | | |
|---|---|---|---|
| CN | 101828266 | A | 9/2010 |
| CN | 102027577 | A | 4/2011 |
| CN | 102610516 | A | 7/2012 |
| CN | 102834902 | A | 12/2012 |
| CN | 103119695 | A | 5/2013 |
| CN | 103243310 | A | 8/2013 |
| CN | 103943493 | A | 7/2014 |
| CN | 104637792 | A | 5/2015 |
| CN | 105047541 | A | 11/2015 |
| CN | 105489635 | A | 4/2016 |
| CN | 105579906 | A | 5/2016 |
| CN | 106876251 | A | 6/2017 |
| CN | 107153326 | A | 9/2017 |
| CN | 108351594 | A | 7/2018 |
| CN | 108388079 | A | 8/2018 |
| CN | 108780739 | A | 11/2018 |
| CN | 109521657 | A | 3/2019 |
| CN | 109976097 | A | 7/2019 |
| CN | 110609441 | A | 12/2019 |
| CN | 111254416 | A | 6/2020 |
| CN | 111258190 | A | 6/2020 |
| CN | 116009357 | A | 4/2023 |
| EP | 0197286 | A2 | 10/1986 |
| EP | 0197286 | B1 | 9/1991 |
| EP | 0465064 | A2 | 1/1992 |
| EP | 1253629 | A2 | 10/2002 |
| EP | 1123423 | B1 | 8/2007 |
| EP | 2608247 | A1 | 6/2013 |
| EP | 3230294 | A1 | 10/2017 |
| EP | 3258317 | A1 | 12/2017 |
| EP | 3451059 | A1 | 3/2019 |
| EP | 3596155 | B1 | 8/2022 |
| JP | S5119974 | A | 2/1976 |
| JP | S52144972 | A | 12/1977 |
| JP | S57205736 | A | 12/1982 |
| JP | S5883847 | A | 5/1983 |
| JP | S58108744 | A | 6/1983 |
| JP | S6112653 | U | 1/1986 |
| JP | S61234035 | A | 10/1986 |
| JP | H03228327 | A | 10/1991 |
| JP | H04226462 | A | 8/1992 |
| JP | H0572747 | A | 3/1993 |
| JP | H0637050 | A | 2/1994 |
| JP | H06169021 | A | 6/1994 |
| JP | H06232041 | A | 8/1994 |
| JP | H0745580 | A | 2/1995 |
| JP | H0757995 | A | 3/1995 |
| JP | H07106224 | A | 4/1995 |
| JP | H07161607 | A | 6/1995 |
| JP | H07244386 | A | 9/1995 |
| JP | H0831781 | A | 2/1996 |
| JP | H0869959 | A | 3/1996 |
| JP | H08316237 | A | 11/1996 |
| JP | H08330288 | A | 12/1996 |
| JP | H08339950 | A | 12/1996 |
| JP | H09172022 | A | 6/1997 |
| JP | H09312247 | A | 12/1997 |
| JP | H1041206 | A | 2/1998 |
| JP | H10172957 | A | 6/1998 |
| JP | H10209133 | A | 8/1998 |
| JP | H10301298 | A | 11/1998 |
| JP | H11119440 | A | 4/1999 |
| JP | 2000223461 | A | 8/2000 |
| JP | 2000305273 | A | 11/2000 |
| JP | 2000347413 | A | 12/2000 |
| JP | 2000356857 | A | 12/2000 |
| JP | 2001250813 | A | 9/2001 |
| JP | 2001519040 | A | 10/2001 |
| JP | 2002100558 | A | 4/2002 |
| JP | 2002118096 | A | 4/2002 |
| JP | 2003131364 | A | 5/2003 |
| JP | 2003213001 | A | 7/2003 |
| JP | 2003280155 | A | 10/2003 |
| JP | 2003532303 | A | 10/2003 |
| JP | 2004006798 | A | 1/2004 |
| JP | 2004510321 | A | 4/2004 |
| JP | 2004513515 | A | 4/2004 |
| JP | 2004259786 | A | 9/2004 |
| JP | 2005504146 | A | 2/2005 |
| JP | 2005123651 | A | 5/2005 |
| JP | 2005260015 | A | 9/2005 |
| JP | 2005317652 | A | 11/2005 |
| JP | 2006253282 | A | 9/2006 |
| JP | 2006310681 | A | 11/2006 |
| JP | 2007027617 | A | 2/2007 |
| JP | 2008091215 | A | 4/2008 |
| JP | 2009192350 | A | 8/2009 |
| JP | 2009212404 | A | 9/2009 |
| JP | 2010016083 | A | 1/2010 |
| JP | 2010016314 | A | 1/2010 |
| JP | 2010500762 | A | 1/2010 |
| JP | 2010067979 | A | 3/2010 |
| JP | 2010074065 | A | 4/2010 |
| JP | 2010123732 | A | 6/2010 |
| JP | 2010531931 | A | 9/2010 |
| JP | 2010239087 | A | 10/2010 |
| JP | 2010245327 | A | 10/2010 |
| JP | 2011511476 | A | 4/2011 |
| JP | 2011099956 | A | 5/2011 |
| JP | 2011520242 | A | 7/2011 |
| JP | 2011529126 | A | 12/2011 |
| JP | 2012142481 | A | 7/2012 |
| JP | 2012173315 | A | 9/2012 |
| JP | 2012185485 | A | 9/2012 |

(56) References Cited

FOREIGN PATENT DOCUMENTS

| | | | | |
|---|---|---|---|---|
| JP | 5055743 | B2 | 10/2012 | |
| JP | 2012191242 | A | 10/2012 | |
| JP | 2013033291 | A | 2/2013 | |
| JP | 2013047848 | A | 3/2013 | |
| JP | 2013096011 | A | 5/2013 | |
| JP | 2013526061 | A | 6/2013 | |
| JP | 2013135066 | A | 7/2013 | |
| JP | 2013145874 | A | 7/2013 | |
| JP | 2013151627 | A | 8/2013 | |
| JP | 2013542944 | A | 11/2013 | |
| JP | 2014504004 | A | 2/2014 | |
| JP | 5544914 | B2 | 7/2014 | |
| JP | 2014521111 | A | 8/2014 | |
| JP | 2015504604 | A | 2/2015 | |
| JP | 5705103 | B2 | 4/2015 | |
| JP | 2015513540 | A | 5/2015 | |
| JP | 2015106640 | A | 6/2015 | |
| JP | 2015201622 | A | 11/2015 | |
| JP | 2016072557 | A | 5/2016 | |
| JP | 2016517633 | A | 6/2016 | |
| JP | 2016131238 | A | 7/2016 | |
| JP | 2016530565 | A | 9/2016 | |
| JP | 2016208027 | A | 12/2016 | |
| JP | 2017045869 | A | 3/2017 | |
| JP | 2017508187 | A | 3/2017 | |
| JP | 2017108053 | A | 6/2017 | |
| JP | 2017116923 | A | 6/2017 | |
| JP | 2017152689 | A | 8/2017 | |
| JP | 2017532407 | A | 11/2017 | |
| JP | 2018006742 | A | 1/2018 | |
| JP | 2018502173 | A | 1/2018 | |
| JP | 2018017780 | A | 2/2018 | |
| JP | 2018025686 | A | 2/2018 | |
| JP | 2018098229 | A | 6/2018 | |
| JP | 2018518688 | A | 7/2018 | |
| JP | 2018164076 | A | 10/2018 | |
| JP | 2018200930 | A | 12/2018 | |
| JP | 2019500490 | A | 1/2019 | |
| JP | 2019024129 | A | 2/2019 | |
| JP | 2019506730 | A | 3/2019 | |
| JP | 2019053305 | A | 4/2019 | |
| JP | 2019056730 | A | 4/2019 | |
| JP | 2019095794 | A | 6/2019 | |
| JP | 2019135755 | A | 8/2019 | |
| JP | 2019192814 | A | 10/2019 | |
| JP | 2019532182 | A | 11/2019 | |
| JP | 2019532489 | A | 11/2019 | |
| JP | 2020129607 | A | 8/2020 | |
| JP | 2021005737 | A | 1/2021 | |
| JP | 2021523403 | A | 9/2021 | |
| JP | 2022502714 | A | 1/2022 | |
| JP | 2022538040 | A | 8/2022 | |
| JP | 2025105706 | A | 7/2025 | |
| KR | 890015374 | A | 10/1989 | |
| KR | 900001238 | B1 | 3/1990 | |
| KR | 950001406 | A | 1/1995 | |
| KR | 960000375 | B1 | 1/1996 | |
| KR | 19990029141 | A | 4/1999 | |
| KR | 19990070327 | A | 9/1999 | |
| KR | 20000073111 | A | 12/2000 | |
| KR | 20020000292 | A | 1/2002 | |
| KR | 100398312 | B1 | 9/2003 | |
| KR | 20050112115 | A | 11/2005 | |
| KR | 100575847 | B1 | 5/2006 | |
| KR | 20070003657 | A | 1/2007 | |
| KR | 20080046577 | A | 5/2008 | |
| KR | 100841495 | B1 | 6/2008 | |
| KR | 20090042059 | A | 4/2009 | |
| KR | 20100090643 | A | 8/2010 | |
| KR | 20110007192 | A | 1/2011 | |
| KR | 20110009739 | A | 1/2011 | |
| KR | 20120078672 | A | 7/2012 | |
| KR | 20120093781 | A | 8/2012 | |
| KR | 20130007389 | A | 1/2013 | |
| KR | 20130093038 | A | 8/2013 | |
| KR | 20140047120 | A | 4/2014 | |
| KR | 101426105 | B1 | 8/2014 | |
| KR | 20140106442 | A | 9/2014 | |
| KR | 20140109816 | A | 9/2014 | |
| KR | 20140121826 | A | 10/2014 | |
| KR | 20150008065 | A | 1/2015 | |
| KR | 20150091260 | A | 8/2015 | |
| KR | 20150127145 | A | 11/2015 | |
| KR | 20150129781 | A | 11/2015 | |
| KR | 20150143480 | A | 12/2015 | |
| KR | 20160035995 | A | 4/2016 | |
| KR | 20160082969 | A | 7/2016 | |
| KR | 20170039289 | A | 4/2017 | |
| KR | 20170066218 | A | 6/2017 | |
| KR | 20170066225 | A | 6/2017 | |
| KR | 20180036263 | A | 4/2018 | |
| KR | 20180054917 | A | 5/2018 | |
| KR | 20180116438 | A | 10/2018 | |
| KR | 20180119471 | A | 11/2018 | |
| KR | 20190060678 | A | 6/2019 | |
| KR | 20190085654 | A | 7/2019 | |
| KR | 20190139594 | A | 12/2019 | |
| KR | 20200014185 | A * | 2/2020 | ......... H01L 21/0274 |
| KR | 20200144580 | A | 12/2020 | |
| KR | 20210015639 | A | 2/2021 | |
| KR | 20210142118 | A | 11/2021 | |
| KR | 20220025020 | A | 3/2022 | |
| KR | 20220130783 | A | 9/2022 | |
| KR | 20220155111 | A | 11/2022 | |
| KR | 20230029977 | A | 3/2023 | |
| TW | 200504864 | A | 2/2005 | |
| TW | 200846333 | A | 12/2008 | |
| TW | 200903686 | A | 1/2009 | |
| TW | 200947117 | A | 11/2009 | |
| TW | 201005568 | A | 2/2010 | |
| TW | 201140230 | A | 11/2011 | |
| TW | 201145383 | A | 12/2011 | |
| TW | 201224190 | A | 6/2012 | |
| TW | I365354 | B | 6/2012 | |
| TW | 201241555 | A | 10/2012 | |
| TW | 201245918 | A | 11/2012 | |
| TW | 201246273 | A | 11/2012 | |
| TW | 201327057 | A | 7/2013 | |
| TW | 201501179 | A | 1/2015 | |
| TW | 201502696 | A | 1/2015 | |
| TW | I494689 | B | 8/2015 | |
| TW | 201539539 | A | 10/2015 | |
| TW | 201631377 | A | 9/2016 | |
| TW | 201729006 | A | 8/2017 | |
| TW | 201734025 | A | 10/2017 | |
| TW | 201734667 | A | 10/2017 | |
| TW | 201826034 | A | 7/2018 | |
| TW | 201830472 | A | 8/2018 | |
| TW | 201837066 | A | 10/2018 | |
| TW | 201903886 | A | 1/2019 | |
| TW | 201907445 | A | 2/2019 | |
| TW | 201931011 | A | 8/2019 | |
| TW | 201937545 | A | 9/2019 | |
| TW | 202001407 | A | 1/2020 | |
| TW | 202001993 | A | 1/2020 | |
| TW | 202006168 | A | 2/2020 | |
| TW | 202117468 | A | 5/2021 | |
| TW | 202308466 | A | 2/2023 | |
| TW | 202318103 | A | 5/2023 | |
| WO | WO-2002103764 | A1 | 12/2002 | |
| WO | WO-03029015 | A2 | 4/2003 | |
| WO | WO-2004095551 | A1 | 11/2004 | |
| WO | WO-2007123539 | A1 | 11/2007 | |
| WO | WO-2008019362 | A2 | 2/2008 | |
| WO | WO-2008088076 | A1 | 7/2008 | |
| WO | WO-2008139621 | A1 | 11/2008 | |
| WO | WO-2009105347 | A2 | 8/2009 | |
| WO | WO-2011081151 | A1 | 7/2011 | |
| WO | WO-2011137059 | A2 | 11/2011 | |
| WO | WO-2012075249 | A1 | 6/2012 | |
| WO | WO-2012048094 | A3 | 7/2012 | |
| WO | WO-2013007442 | A1 | 1/2013 | |
| WO | WO-2013078211 | A1 | 5/2013 | |
| WO | WO-2013119134 | A1 | 8/2013 | |

(56) References Cited

FOREIGN PATENT DOCUMENTS

| | | | | |
|---|---|---|---|---|
| WO | WO-2013128313 A1 | 9/2013 | | |
| WO | WO-2014152023 A1 | 9/2014 | | |
| WO | WO-2014172142 A1 | 10/2014 | | |
| WO | WO-2016065120 A1 | 4/2016 | | |
| WO | WO-2016144960 A1 | 9/2016 | | |
| WO | WO-2016208300 A1 | 12/2016 | | |
| WO | WO-2017002497 A1 | 1/2017 | | |
| WO | WO-2017066319 A2 | 4/2017 | | |
| WO | WO-2017109040 A1 | 6/2017 | | |
| WO | WO-2017153725 A1 | 9/2017 | | |
| WO | WO-2017198418 A1 | 11/2017 | | |
| WO | WO-2017207452 A1 * | 12/2017 | .............. | G03F 7/38 |
| WO | WO-2018004551 A1 | 1/2018 | | |
| WO | WO-2018004646 A1 | 1/2018 | | |
| WO | WO-2018061670 A1 | 4/2018 | | |
| WO | WO-2018173446 A1 | 9/2018 | | |
| WO | WO-2019023797 A1 | 2/2019 | | |
| WO | WO-2019059074 A1 | 3/2019 | | |
| WO | WO-2019125952 A1 | 6/2019 | | |
| WO | WO-2019163455 A1 | 8/2019 | | |
| WO | WO-2019217749 A1 | 11/2019 | | |
| WO | WO-2019222320 A1 | 11/2019 | | |
| WO | WO-2019230462 A1 | 12/2019 | | |
| WO | WO-2019241402 A1 | 12/2019 | | |
| WO | WO-2020014179 A1 | 1/2020 | | |
| WO | WO-2020030855 A2 | 2/2020 | | |
| WO | WO-2020033602 A1 | 2/2020 | | |
| WO | WO-2020050035 A1 | 3/2020 | | |
| WO | WO-2020102085 A1 | 5/2020 | | |
| WO | WO-2020132281 A1 | 6/2020 | | |
| WO | WO-2020190941 A1 | 9/2020 | | |
| WO | WO-2020223011 A1 | 11/2020 | | |
| WO | WO-2020223152 A1 | 11/2020 | | |
| WO | WO-2020263750 A1 | 12/2020 | | |
| WO | WO-2020264158 A1 | 12/2020 | | |
| WO | WO-2020264556 A1 | 12/2020 | | |
| WO | WO-2020264557 A1 | 12/2020 | | |
| WO | WO-2020264571 A1 | 12/2020 | | |
| WO | WO-2021067632 A2 | 4/2021 | | |
| WO | WO-2021072042 A1 | 4/2021 | | |
| WO | WO-2021146138 A1 | 7/2021 | | |
| WO | WO-2021202681 A1 | 10/2021 | | |
| WO | WO-2021262371 A1 | 12/2021 | | |
| WO | WO-2021262529 A1 | 12/2021 | | |
| WO | WO-2022005808 A1 | 1/2022 | | |
| WO | WO-2022006349 A1 | 1/2022 | | |
| WO | WO-2022016128 A1 | 1/2022 | | |
| WO | WO-2022103764 A1 | 5/2022 | | |
| WO | WO-2022103949 A1 | 5/2022 | | |
| WO | WO-2022125388 A1 | 6/2022 | | |

OTHER PUBLICATIONS

Bespalov I., et al., "Key Role of Very Low Energy Electrons in Tin-Based Molecular Resists for Extreme Ultraviolet Nanolithography," ACS Applied Materials & Interfaces, 2020, vol. 12, pp. 9881-9889.

Cardineau, B. et al., "EUV Resists Based on Tin-oxo Clusters", Advances in Patterning Materials and Processes XXXI, Proceedings of Spie, Apr. 4, 2014, vol. 9051, pp. 335-346.

Chiang C L., et al., "Secondary Electron Emission Characteristics of Oxide Electrodes in Flat Electron Emission Lamp," AIP Advances, 2016, vol. 6, 015317, 9 Pages.

Chinese First Office Action dated May 24, 2017 issued in Application No. CN 201510053668.7.

Chinese Second Office Action dated Feb. 28, 2018 issued in Application No. CN 201510053668.7.

CN Office Action dated Dec. 13, 2023 in CN Application No. 201810783756.6 with English translation.

CN Office Action dated Dec. 26, 2023 in CN Application No. 201980028279.5, with English Translation.

CN Office Action dated Jan. 3, 2024 in CN Application No. 202310318757.4 with English Translation.

CN Office Action dated Jan. 22, 2024 in CN Application No. 202080047683.X, with English Translation.

CN Office Action dated Jan. 23, 2024 in CN Application No. 202080046943.1 with English Translation.

CN Office Action dated Jun. 1, 2023, in application No. CN201810783756 with English translation.

CN Office Action dated Jun. 8, 2022 in Application No. CN202180002531.2 With English Translation.

CN Office Action dated Nov. 16, 2022, in Application No. CN202180002531.2 with English translation.

CN Office Action dated Nov. 18, 2022, in Application No. CN201810783756.6 with English translation.

Coons et al., (2010) "Comparison of EUV spectral and ion emission features from laser-produced Sn and Li plasmas," Extreme Ultraviolet (EUV) Lithography, Proc. Of SPIE, 7636:763636-1 to 763636-7.

Cui L F., et al., "Endohedral Stannaspherenes M@Sn12: A Rich Class of Stable Molecular Cage Clusters," Endohedral Tin Cages, 2007, vol. 46, pp. 742-745.

Dahuang, D., et al., Functional Thin Films and Their Deposition Preparation Techniques, Metallurgy Industrial Press, Jan. 31, 2013, pp. 450-454. [with English Translation].

Danilo D.E., et al., "Metal Containing Resist Readiness for HVM EUV Lithography", Journal of Photopolymer Science and Technology, 2016, vol. 29(3), pp. 501-507.

EP Extended European Search Report dated Jul. 13, 2023, in Application No. EP20831843.6.

EP Extended European Search report dated Jun. 23, 2023, in Application No. EP20831420.3.

EP Extended European Search report dated Jun. 26, 2023, in Application No. 20831242.1.

EP Extended European Search Report dated Jun. 26, 2023, in Application No. 20831343.7.

EP Extended European Search report dated Jun. 28, 2023, in Application No. EP 20832501.9.

EP Extended European Search report dated Nov. 29, 2023 in EP Application No. 23173688.5.

EP Extended European Search report dated Oct. 25, 2023, in Application No. EP21837274.6.

EP Extended European Search report dated Sep. 25, 2023, in Application No. EP20870849.5.

EP Partial European Search Report dated Aug. 29, 2023, in Application No. 23173688.5.

European Search Report dated Feb. 15, 2022, in Application No. EP21741104.

European Office Action dated Feb. 25, 2022 in U.S. Appl. No. 21/741,104.

Extended European Search Report dated Dec. 23, 2021, in Application No. EP19800353.5.

Fan, Y. et al., (2016) "Benchmarking Study of EUV Resists for NXE:3300B," Proc. of Spie, 9776:97760W-1 to 97760W-11 [Downloaded From http://proceedings.spiedigitallibrary.org/ on Mar. 30, 2017].

Fitzgerald C B., et al., "Magnetism in Dilute Magnetic Oxide Thin Films Based on SnO2," The American Physical Society, 2006, vol. 74, 115307, 10 Pages.

Fujifilm Corp., (Presentation) "Negative tone development process for double patterning," 5th International Symposium on Immersion Lithography, Sep. 2008, Presentation Slides No. p. 1-p. 27.

Fujifilm Corp., (Safety Data Sheet) Name of Substance: n-Butyl acetate; Trade Name of Substance: FN-DP001 Ultra Pure Developer, Revision Date: Nov. 25, 2013, MSDS file: 16328_GB_EN_V2.0, pp. 1-9.

Gangnaik, A.S. et al., (Jan. 12, 2017) "New Generation Electron Beam Resists: A Review," Chem. Mater., 29:1898-1917.

Gerritsen et al., (Apr. 1, 1986) "Laser-generated plasma as soft x-ray source," J. Appl. Phys., 59(7):2337-2344.

Gross, R.A. et al., "Biodegradable Polymers for the Environment", Science, Aug. 2, 2002, vol. 297, No. 5582, pp. 803-807.

Hamley, I.W., "Nanostructure fabrication using block copolymers", Nanotechnology. Sep. 17, 2003;14(10):R39-R54.

(56) References Cited

OTHER PUBLICATIONS

Harrisson, S. et al., "RAFT Polymerization of Vinyl Esters: Synthesis and Applications", Polymers, 2014, vol. 6, No. 5, pp. 1437-1488.
Hench, L.L. and West, J.K., "The sol-gel process," Chemical reviews, Jan. 1, 1990; 90(1) pp. 33-72.
International Preliminary Report on Patentability dated Oct. 13, 2022, in PCT Application No. PCT/US2021/023493.
International Preliminary Report on Patentability dated Oct. 13, 2022, in PCT Application No. PCT/US2021/025111.
International Search Report and Written Opinion dated Aug. 4, 2021, in PCT Application No. PCT/US2021/023493.
International Search Report and Written Opinion dated Jul. 13, 2021, in PCT Application No. PCT/US2021/023901.
International Search Report and Written Opinion dated Jul. 20, 2021, in PCT Application No. PCT/US2021/025111.
International Search Report and Written Opinion dated Mar. 4, 2022, in Application No. PCT/US2021/058647.
International Search Report and Written Opinion dated May 18, 2022, in International Application No. PCT/US2022/014984.
International Search Report and Written Opinion dated Nov. 11, 2022 in PCT Application No. PCT/US2022/037733.
International Search Report and Written Opinion dated Oct. 8, 2020 in Application No. WO2020US38968.
International Preliminary Report on Patentability dated Jul. 1, 2021 issued in Application No. PCT/US2019/067540.
International Preliminary Report on Patentability dated May 27, 2021 issued in Application No. PCT/US2019/060742.
International Search Report and Written Opinion dated May 17, 2021 issued in Application No. PCT/US2021/015656.
International Preliminary Report on Patentability dated Apr. 14, 2022 issued in Application No. PCT/US2020/053856.
International Preliminary Report on Patentability dated Aug. 18, 2022 in PCT Application No. PCT/US2021/015656.
International Preliminary Report on Patentability dated Aug. 24, 2023, in PCT Application No. PCT/US2022/014984.
International Preliminary Report on Patentability dated Jan. 27, 2021 in Application PCT/US2020/054730.
International Preliminary Report on Patentability dated Jan. 5, 2023 in PCT Application No. PCT/US2021/034019.
International Preliminary Report on Patentability dated Jan. 5, 2023 in PCT Application No. PCT/US2021/037924.
International Preliminary Report on Patentability dated Jan. 19, 2023 in PCT Application No. PCT/US2021/040381.
International Preliminary Report on Patentability dated Jan. 26, 2023 in PCT Application No. PCT/US2021/042103.
International Preliminary Report on Patentability dated Jan. 26, 2023 in PCT Application No. PCT/US2021/042104.
International Preliminary Report on Patentability dated Jan. 26, 2023 in PCT Application No. PCT/US2021/042106.
International Preliminary Report on Patentability dated Jan. 26, 2023 in PCT Application No. PCT/US2021/042107.
International Preliminary Report on Patentability dated Jan. 26, 2023 in PCT Application No. PCT/US2021/042108.
International Preliminary Report on Patentability dated Jan. 6, 2022 in PCT Application No. PCT/US2020/038968.
International Preliminary Report on Patentability dated Jan. 6, 2022 in PCT Application No. PCT/US2020/039615.
International Preliminary Report on Patentability dated Jan. 6, 2022 in PCT Application No. PCT/US2020/070171.
International Preliminary Report on Patentability dated Jan. 6, 2022 in PCT Application No. PCT/US2020/070172.
International Preliminary Report on Patentability dated Jan. 6, 2022 in PCT Application No. PCT/US2020/070187.
International Preliminary Report on Patentability dated Jul. 28, 2022 in PCT Application No. PCT/US2021/012953.
International Preliminary Report on Patentability dated Jun. 22, 2023, in Application No. PCT/US2021/061751.
International Preliminary Report on Patentability dated May 25, 2023, in Application No. PCT/US2021/058647.
International Preliminary Report on Patentability dated Nov. 11, 2021, for International Application No. PCT/US2020/028151.
International Preliminary Report on Patentability dated Nov. 28, 2019 issued in Application No. PCT/US2018/032783.
International Preliminary Report on Patentability dated Nov. 7, 2019 issued in Application No. PCT/US2018/028192.
International Preliminary Report on Patentability dated Oct. 13, 2022, in PCT Application No. PCT/US2021/023901.
International Preliminary Report on Patentability dated Sep. 7, 2023, in PCT Application No. PCT/US2022/014281.
International Preliminary Report on Patentability dated Sep. 9, 2022, in PCT Application No. PCT/US2021/019245.
International Preliminary Report on Patentability dated Sep. 30, 2021 issued in Application No. PCT/US2020/023146.
International Search Report and Written Opinion dated May 12, 2021 issued in Application No. PCT/US2021/012953.
International Search Report and Written Opinion dated Apr. 10, 2020 issued in Application No. PCT/US2019/060742.
International Search Report and Written Opinion dated Apr. 17, 2023, in Application No. PCT/US2022/081390.
International Search Report and Written Opinion dated Apr. 17, 2023 in PCT Application No. PCT/US2022/081376.
International Search Report and Written Opinion dated Apr. 19, 2023, in Application No. PCT/US2022/081845.
International Search Report and Written Opinion dated Apr. 24, 2020 issued in Application No. PCT/US2019/067540.
International Search Report and Written Opinion dated Aug. 17, 2023, in Application No. PCT/US2023/019871.
International Search Report and Written Opinion dated Aug. 22, 2019 issued in Application No. PCT/US2019/031618.
International Search Report and Written Opinion dated Aug. 8, 2018 issued in Application No. PCT/US2018/028192.
International Search Report and Written Opinion dated Jan. 10, 2024 in PCT Application No. PCT/US2023/033020.
International Search Report and Written Opinion dated Jan. 27, 2021 issued in Application No. PCT/US2020/054730.
International Search Report and Written Opinion dated Jul. 17, 2020 issued in Application No. PCT/US2020/023146.
International Search Report and Written Opinion dated Jul. 31, 2020, in PCT Application No. PCT/US2020/028151.
International Search Report and Written Opinion dated Mar. 23, 2021 issued in Application No. PCT/US2020/053856.
International Search Report and Written Opinion dated Mar. 24, 2022, for International Application No. PCT/US2021/061751.
International Search Report and Written Opinion dated May 3, 2023, in Application No. PCT/US2023/06030.
International Search Report and Written Opinion dated May 16, 2022, In International Application No. PCT/US2022/014281.
International Search Report and Written Opinion dated Nov. 3, 2021, in PCT Application No. PCT/US2021/042108.
International Search Report and Written Opinion dated Nov. 4, 2021 in PCT Application No. PCT/US2021/042103.
International Search Report and Written Opinion dated Nov. 4, 2021 in PCT Application No. PCT/US2021/042106.
International Search Report and Written Opinion dated Nov. 4, 2021 in PCT Application No. PCT/US2021/042107.
International Search Report and Written Opinion dated Nov. 7, 2022 in PCT Application No. PCT/US2022/037393.
International Search Report and Written Opinion dated Nov. 10, 2021, in PCT Application No. PCT/US2021/042104.
International Search Report and Written Opinion dated Oct. 13, 2021, in application No. PCT/US2021/037924.
International Search Report and Written Opinion dated Oct. 13, 2023 in PCT Application No. PCT/US2023/069419.
International Search Report and Written Opinion dated Oct. 16, 2018 issued in Application No. PCT/US2018/032783.
International Search Report and Written Opinion dated Oct. 16, 2020 issued in Application No. PCT/US2020/039615.
International Search Report and Written Opinion dated Oct. 16, 2020 issued in Application No. PCT/US2020/070171.
International Search Report and Written Opinion dated Oct. 16, 2020 issued in Application No. PCT/US2020/070172.

(56) References Cited

OTHER PUBLICATIONS

International Search Report and Written Opinion dated Oct. 16, 2020 issued in Application No. PCT/US2020/070187.
International Search Report and Written Opinion dated Oct. 28, 2021 in PCT Application No. PCT/US2021/040381.
International Search Report and Written Opinion dated Oct. 8, 2020 issued in Application No. PCT/US2020/038968.
International Search Report and Written Opinion dated Sep. 15, 2021, in PCT Application No. PCT/US2021/034019.
Jalife S., et al., "Noble Gas Endohedral Fullerenes," Chemical Science, 2020, vol. 11, pp. 6642-6652.
Japanese Decision to Grant dated Feb. 12, 2019 issued in Application No. JP 2015-016254.
Japanese Decision to Grant dated May 3, 2021 issued in Application No. JP 2016-220096.
Japanese First Office Action dated Oct. 30, 2018 issued in Application No. JP 2015-016254.
Japanese First Office Action dated Sep. 15, 2020 issued in Application No. JP 2016-220096.
Joo, W. et al., "Synthesis of Unzipping Polyester and a Study of its Photochemistry", Journal of the American Chemical Society, 2019, vol. 141, No. 37, pp. 14736-14741.
JP Office Action dated Jul. 26, 2022 in Application No. JP2021102822 With English translation.
JP Office Action dated Nov. 15, 2022, in Application No. JP2021-176082 with English translation.
JP Office Action dated Apr. 11, 2023 in Application No. JP2021-176082 with English translation.
JP Office Action dated Apr. 27, 2023 in Application No. JP2021-575910 with English translation.
JP Office Action dated Dec. 26, 2023 in JP Application No. 20210576241, with English Translation.
JP Office Action dated Dec. 26, 2023 in JP Application No. 2021-526240, with English Translation.
JP Office Action dated Feb. 28, 2023 in Application No. JP2020-562160 with English translation.
JP Office Action dated Jan. 9, 2024 in JP Application No. 2023-179933, with English Translation.
JP Office Action dated Jan. 9, 2024 in JP Application No. 2023-184334 with English Translation.
JP Office Action dated Jan. 17, 2023, in Application No. JP2022-552422 with English translation.
JP Office Action dated Jun. 14, 2022, in Application No. JP20190563508 with English translation.
JP Office Action dated Jun. 27, 2023, in Application No. JP2022-552422 with English translation.
JP Office Action dated Jun. 27, 2023, in application No. JP2023-63868 with English translation.
JP Office Action dated Jun. 28, 2022 in Application No. JP2021560945 with English translation.
JP Office Action dated Nov. 14, 2023, in JP Application No. 2021-0575910 with English Translation.
JP Office Action dated Nov. 14, 2023 in JP Application No. 2022-559416, with English Translation.
JP Office Action dated Oct. 3, 2023 in Application No. JP2021-176082 with English Translation.
JP Office Action dated Oct. 10, 2023 in Application No. JP2022-552422 with English Translation.
JP Office Action dated Sep. 19, 2023 in Application No. JP2020-562160 with English translation.
Klepper, K.B. et al., "Atomic Layer Deposition of Organic-inorganic Hybrid Materials Based on Saturated Linear Carboxylic Acids", Dalton Transactions, May 7, 2011, vol. 40, No. 17, pp. 4337-4748.
Komen C V., et al., "Structure-Magnetic Property Relationship Intransition Metal (M = V,Cr, Mn, Fe, Co, Ni) Doped Sno2 Nanoparticles," Journal of Applied Physics, 2008, vol. 103, 5 Pages.
Korean Decision for Grant dated Sep. 2, 2021 issued in Application No. KR 10-2015-0015184.
Korean First Office Action dated Dec. 22, 2020 issued in Application No. KR 10-2015-0015184.
Korean Second Office Action dated Jul. 27, 2021 issued in Application No. KR 10-2015-0015184.
KR Office Action dated Feb. 8, 2022, in Application No. KR10-2021-7030794 with English Translation.
KR Office Action dated Aug. 11, 2023, in Application No. KR10-2023-7011840 with English translation.
KR Office Action dated Jan. 2, 2023 in Application No. KR10-2022-7027233 with English translation.
KR Office Action dated May 9, 2022, in Application No. KR1020217030794 with English translation.
KR Office Action dated Nov. 21, 2023 in KR Application No. 10-2022-7002869 with English Translation.
KR Office Action dated Nov. 21, 2023 in KR Application No. 10-2022-7029421 with English Translation.
KR Office Action dated Sep. 28, 2022, in Application No. KR10-2022-7027233 with English translation.
KR Prior Art Search Report dated Apr. 3, 2023, in application No. KR 10-2022-7029421.
KR Prior Art Search Report dated Aug. 25, 2023, in Application No. KR10-2021-7022858.
KR Prior Art Search Report dated Nov. 14, 2023, in Application No. KR10-2023-7038357.
KR Search Report dated Oct. 30, 2023 in KR Application No. 10-2023-7036296.
Kvon V., et al., "Secondary Electron Emission of Tin and Tin-Lithium Under Low Energy Helium Plasma Exposure," Nuclear Materials and Energy, 2017, vol. 13, pp. 21-27.
Kwon, J., et al., "Substrate Selectivity of (tBu-Allyl)Co(C0)3 during Thermal Atomic Layer Deposition of Cobalt," Chemistry of Materials, Mar. 27, 2012; 24(6): pp. 1025-1030.
Lemaire, P.C., et al., "Understanding inherent substrate selectivity during atomic layer deposition: Effect of surface preparation, hydroxyl density, and metal oxide composition on nucleation mechanisms during tungsten ALD" The Journal of chemical physics, Feb. 7, 2017, 146(5):052811.
Lin Y., et al., "A New Examination of Secondary Electron Yield Data," Surface and Interface Analysis, 2005, vol. 37, pp. 895-900.
Lu, Y., et al., "Continuous formation of supported cubic and hexagonal mesoporous films by sol-gel dip-coating" Nature, Sep. 1997, 389(6649), pp. 364-368.
Mackus, A.J., et al. "The use of atomic layer deposition in advanced nanopatterning", Nanoscale. Jul. 25, 2014; 6(19):10941-60.
Mai, L. et al., "Atomic/molecular Layer Deposition of Hybrid Inorganic-organic Thin Films from Erbium Guanidinate Precursor", Journal of Materials Science, 2017, vol. 52, No. 11, pp. 6216-6224. https://doi.org/10.1007/s10853-017-0855-6.
McGinniss, Vincent D., (1978) "Light Sources," Edited by: Pappas, S. Peter, UV Curing: Science and Technology; technology marketing corporation, 642 Westover Rd., Stamford, CT, USA; pp. 96-129.
Meng, X., "An Overview of Molecular Layer Deposition for Organic and Organic-inorganic Hybrid Materials: Mechanisms, Growth Characteristics, and Promising Applications", Journal of Materials Chemistry A, 2017, vol. 5, pp. 18326-18378.
Molloy, K. C., "Precursors for the Formation of Tin (IV) Oxide and Related Materials", Journal of Chemical Research, 2008, vol. 2008, No. 10, pp. 549-554.
Nazarov, D.V., et al., "Atomic layer deposition of tin dioxide nanofilms: A review", Rev. Adv. Mater. Sci. Jun. 1, 2015; 40(3):262-75.
Notice of Allowance dated Dec. 9, 2021 in U.S. Appl. No. 17/310,635.
Ogale S B., et al., "High Temperature Ferromagnetism with Giant Magnetic Moment in Transparent Co-doped SnO2-δ," Physical Review Letters, 2003, 17 Pages.
Pedersen A., et al., "Lithiation of Tin Oxide: A Computational Study," Integrated Systems Laboratory, 2014, 20 Pages.
Rantala, et al., "New resist and underlayer approaches toward EUV lithography," Proc. SPIE 10809, International Conference on Extreme Ultraviolet Lithography 2018, pp. 108090X-1-108090X-8. (Oct. 11, 2018).

(56) References Cited

OTHER PUBLICATIONS

Rothschild, et al., "Liquid immersion lithography: Why, how, and when?" Journal Vacuum Science Technology, Nov./Dec. 2004, pp. 2877-2881.
Santillan et al., "In Situ analysis of negative-tone resist pattern formation using organic-solvent-based developer process," Applied Physics Express, vol. 7 (2014), pp. 016501-1-016501-4. [retrieved Sep. 20, 2017] URL: http:dx.doi.org/10.7567/APEX.7.016501.
Saunders M., et al., "Noble Gas Atoms Inside Fullerenes," Science, 1996, vol. 271, pp. 1693-1697.
Singh R ., "Unexpected Magnetism in Nanomaterials," Journal of Magnetism and Magnetic Materials, 2013, vol. 346, pp. 58-73.
Spitzer et al., (Mar. 1, 1986) "Conversion efficiencies from laser-produced plasmas in the extreme ultraviolet regime," J. Appl. Phys., 79(5):2251-2258.
Stowers et al.; "Directly patterned inorganic hard mask for EUV lithography"; proceedings of the SPIE 7969; Extreme Ultraviolet (EUV) Lithography 11, 796915-1-11 (Apr. 7, 2011), event: SPI E Advanced Lithography, 2011, San Jose California.
Stulen, et al., "Extreme Ultraviolet Lithography" IEEE Journal of Quantum Electronics, vol. 35, No. 5, May 1999, pp. 694-699.
Sundberg, P. et al., "Organic and Inorganic-organic Thin Film Structures by Molecular Layer Deposition: A Review", Beilstein Journal of Nanotechnology, 2014, vol. 5, pp. 1104-1136.
Taiwanese First Office Action dated Aug. 10, 2020 issued in Application No. TW 105137362.
Taiwanese First Office Action dated May 31, 2018 issued in Application No. TW 104103153.
Taiwanese Office Action dated Apr. 10, 2023 in TW Application No. TW108140940 with English translation.
Taiwanese Second Office Action dated Nov. 18, 2020 issued in Application No. TW 105137362.
Tian Y F., et al., "Oxide Magnetic Semiconductors: Materials, Properties, and Devices," Magnetism, Magnetic Materials, and Interdisciplinary Research, 2013, vol. 22(8), 2 Pages.
TW Office Action dated Jan. 9, 2023 in Application No. TW20190116155 with English translation.
TW Office Action dated Sep. 5, 2022, in Application No. TW110101388 with English translation.
TW Office Action dated Sep. 8, 2022 in Application No. TW111123386 with English translation.
TW First Office Action dated Oct. 6, 2021, in application No. TW20180116415 with English translation.
TW Office Action dated Apr. 29, 2022 in Application No. TW110118172 with English translation.
TW Office Action dated Aug. 17, 2023, in application No. TW110124741 with Translation.
TW Office Action dated Dec. 20, 2023, in TW Application No. 109121579 with English Translation.
TW Office Action dated Jan. 2, 2024 in TW Application No. 109121639, with English Translation.
TW Office Action dated Jan. 11, 2024 in TW Application No. 108146890, with English Translation.
TW Office Action dated Jan. 13, 2023, in Application No. TW110124741 with English translation.
TW Office Action dated Jan. 19, 2023 in Application No. TW110141961 with English translation.
TW Office Action dated Jun. 3, 2022, in Application No. TW110143913 with English translation.
TW Office Action dated Mar. 7, 2022, in Application No. TW110101388 with English translation.
TW Office Action dated May 16, 2023, in Application No. TW20190146890 with English translation.
TW Office Action dated Oct. 13, 2023, in application No. TW109121680 with English Translation.
TW Office Action dated Oct. 30, 2023, in application No. TW108116155 with English Translation.
U.S. Corrected Notice of Allowance dated Jan. 31, 2024 in U.S. Appl. No. 17/309,247.
US Final Office Action, dated Feb. 5, 2019 issued in U.S. Appl. No. 15/495,701.
US Final Office Action, dated May 11, 2017, issued in U.S. Appl. No. 14/610,038.
U.S. Final Office Action dated May 12, 2023 in U.S. Appl. No. 17/455,185.
U.S. Final Office Action dated Nov. 9, 2023 in U.S. Appl. No. 17/455,185.
US Final Office Action, dated Sep. 10, 2018, issued in U.S. Appl. No. 15/691,659.
U.S. Non-Final office Action dated Feb. 7, 2023 in U.S. Appl. No. 17/455,185.
U.S. Non-Final Office Action dated May 11, 2023, in U.S. Appl. No. 17/452,365.
U.S. Non-Final Office Action dated Nov. 6, 2023, in U.S. Appl. No. 17/309,587.
U.S. Non-Final Office Action dated Nov. 20, 2023 in U.S. Appl. No. 18/377,245.
U.S. Non-Final Office Action dated Oct. 13, 2023, in U.S. Appl. No. 18/184,545.
U.S. Non-Final Office Action dated Oct. 20, 2023, in U.S. Appl. No. 18/297,989.
U.S. Non-Final Office Action dated Oct. 20, 2023, in U.S. Appl. No. 18/298,003.
U.S. Non-Final Office Action dated Oct. 26, 2023, in U.S. Appl. No. 17/596,648.
U.S. Non-Final Office Action dated Oct. 26, 2023, in U.S. Appl. No. 17/596,928.
U.S. Non-Final Office Action dated Sep. 13, 2023, in U.S. Appl. No. 17/596,651.
U.S. Non-Final Office Action dated Sep. 28, 2023, in U.S. Appl. No. 15/733,598.
US Notice of Allowance, dated Apr. 25, 2018 issued in U.S. Appl. No. 14/948,109.
U.S. Notice of Allowance dated Aug. 21, 2023 in U.S. Appl. No. 17/452,365.
US Notice of Allowance, dated Aug. 22, 2017, issued in U.S. Appl. No. 14/610,038.
U.S. Notice of Allowance dated Dec. 4, 2023 in U.S. Appl. No. 17/452,365.
U.S. Notice of Allowance dated Feb. 22, 2022 in U.S. Appl. No. 17/310,635.
US Notice of Allowance, dated Jul. 28, 2020, issued in U.S. Appl. No. 16/206,959.
US Notice of Allowance, dated Jun. 10, 2020 issued in U.S. Appl. No. 15/979,340.
U.S. Notice of Allowance dated Oct. 18, 2023 in U.S. Appl. No. 17/309,247.
US Notice of Allowance dated Sep. 15, 2021, issued in U.S. Appl. No. 16/691,508.
US Notice of Allowance, dated Sep. 19, 2019, issued in U.S. Appl. No. 15/691,659.
US Notice of Allowance, dated Sep. 30, 2021 issued in U.S. Appl. No. 17/008,095.
US Notice of Allowance dated Sep. 9, 2021, issued in U.S. Appl. No. 16/691,508.
US Office Action, dated Apr. 9, 2019, issued in U.S. Appl. No. 15/691,659.
US Office Action, dated Aug. 9, 2018 issued in U.S. Appl. No. 15/495,701.
US Office Action, dated Jan. 23, 2017, issued in U.S. Appl. No. 14/610,038.
US Office Action, dated Mar. 18, 2021 issued in U.S. Appl. No. 17/008,095.
US Office Action, dated Mar. 5, 2020, issued in U.S. Appl. No. 16/206,959.
US Office Action dated May 14, 2021, issued in U.S. Appl. No. 16/691,508.
US Office Action, dated May 21, 2018, issued in U.S. Appl. No. 15/691,659.
US Office Action, dated Nov. 2, 2017, issued in U.S. Appl. No. 14/948,109.

(56) References Cited

OTHER PUBLICATIONS

US Office Action, dated Nov. 6, 2019 issued in U.S. Appl. No. 15/979,340.
U.S. Appl. No. 17/905,754, inventors Kanakasabapathy et al., filed on Sep. 6, 2022.
U.S. Appl. No. 18/005,571 inventors Hansen et al., filed on Jan. 13, 2023.
U.S. Appl. No. 18/005,594, inventors Hansen et al., filed on Jan. 13, 2023.
U.S. Appl. No. 18/264,391, inventors Kanakasabapathy S K, et al., filed on Aug. 4, 2023.
U.S. Appl. No. 18/298,003, inventors Marks et al., filed on Apr. 10, 2023.
U.S. Appl. No. 18/377,245, inventors Dictus D, et al., filed on Oct. 5, 2023.
U.S. Appl. No. 18/377,267, inventors Yu J, et al., filed on Oct. 5, 2023.
U.S. Appl. No. 18/546,879, inventors Weidman T W, et al., filed on Aug. 17, 2023.
U.S. Restriction Requirement dated Nov. 14, 2022 in U.S. Appl. No. 17/455,185.
U.S. Restriction requirement dated Aug. 4, 2023, in U.S. Appl. No. 18/297,989.
U.S Restriction requirement dated Aug. 18, 2023 in U.S. Appl. No. 18/298,003.
U.S. Restriction Requirement dated Nov. 20, 2023 in U.S. Appl. No. 17/759,281.
U.S. Restriction requirement dated Sep. 7, 2023 in U.S. Appl. No. 17/309,587.
U.S. Supplemental Notice of Allowability dated Jan. 26, 2022, in U.S. Appl. No. 17/008,095.
Wang, et al., "Lithography Simulation for the Fabrication of Silicon Photonic Devices with Deep-Ultraviolet Lithography" IEEE, (2012) pp. 288-290.
Xu, et al., "Underlayer designs to enhance the performance of EUV resists," Proceedings of SPIE, vol. 7273, 2009, pp. 727311-1-727311-11.
Yoon, K. et al., "Fabrication of a New Type of Organic-inorganic Hybrid Superlattice Films Combined With Titanium Oxide and Polydiacetylene", Nanoscale Research Letters, Jan. 5, 2012, vol. 7, No. 71, 6 pages.
Zhou, H. et al., "Molecular Layer Deposition of Functional Thin Films for Advanced Lithographic Patterning", ACS Applied Materials & Interfaces, 2011, vol. 3, No. 2, pp. 505-511.
Barret M C., et al., "Copper, Zinc and Tin Hydroxypyridinones," Transition Metal Chemistry, Jan. 2015, vol. 40, pp. 241-254.
Cilibrizzi A., et al., "Hydroxypyridinone Journey into Metal Chelation," Chemical Review, Jul. 2018, vol. 118, pp. 7657-7701.
CN Office Action dated Apr. 22, 2024 in CN Application No. 201980085227.1 with English translation.
CN Office Action dated Aug. 12, 2025 in CN Application No. 202211142175.7, with English Translation.
CN Office Action dated Dec. 2, 2024 in CN Application No. 202211142175.7, with English Translation.
CN Office Action dated Jul. 23, 2024 in CN Application No. 201810783756.6 with English translation.
CN Office Action dated Jul. 26, 2024 in CN Application No. 202080047683.X with English translation.
CN Office Action dated Mar. 14, 2024 in CN Application No. 201810783756.6, with English Translation.
CN Office Action dated May 29, 2025 in CN Application No. 202211142175.7 with English translation.
CN Office Action dated Sep. 14, 2024 in CN Application No. 202310318757.4 with English translation.
CN Office Action dated Sep. 23, 2024 in CN Application No. 202080046943.1 with English translation.
EP Extended European Search report dated Apr. 15, 2025 in EP Application No. 22782195.6.
EP Extended European Search report dated Sep. 24, 2025 in EP Application No. 25172399.5.
EP Office Action dated Jan. 21, 2025 in EP Application No. 23173688.5.
EP Office Action dated Oct. 24, 2025 in EP Application No. 24775376.7.
Fitzgerald A., et al., "Determination of Trace Metals in Positive Photoresist," Journal of the Electrochemical Society, May 1992, vol. 139 (5), pp. 1413-1414.
International Preliminary Report on Patentability and Written Opinion dated Dec. 26, 2025 in PCT Application No. PCT/US2024/033522.
International Preliminary Report on Patentability and Written Opinion dated Dec. 28, 2023 in PCT Application No. PCT/US2022/033488.
International Preliminary Report on Patentability and Written Opinion dated Feb. 5, 2026 in PCT Application No. PCT/US2024/039915.
International Preliminary Report on Patentability and Written Opinion dated Feb. 8, 2024 in PCT Application No. PCT/US2022/037393.
International Preliminary Report on Patentability and Written Opinion dated Feb. 8, 2024 in PCT Application No. PCT/US2022/037733.
International Preliminary Report on Patentability and Written Opinion dated Jun. 27, 2024 in PCT Application No. PCT/US2022/081376.
International Preliminary Report on Patentability and Written Opinion dated Jun. 27, 2024 in PCT Application No. PCT/US2022/081390.
International Preliminary Report on Patentability and Written Opinion dated Jun. 27, 2024 in PCT Application No. PCT/US2022/081845.
International Preliminary Report on Patentability and Written Opinion dated Nov. 14, 2024 in PCT Application No. PCT/US2023/019871.
International Preliminary Report on Patentability and Written Opinion dated Nov. 20, 2025 in PCT Application No. PCT/US2024/028046.
International Preliminary Report on Patentability and Written Opinion dated Oct. 2, 2025 in PCT Application No. PCT/US2024/019555.
International Preliminary Report on Patentability dated Oct. 12, 2023, in PCT Application No. PCT/US2022/022790.
International Search Report and Written Opinion dated Aug. 28, 2024 in PCT Application No. PCT/US2024/028046.
International Search Report and Written Opinion dated Dec. 26, 2024 in PCT Application No. PCT/US2024/046887.
International Search Report and Written Opinion dated Feb. 20, 2025 in PCT Application No. PCT/US2024/054806.
International Search Report and Written Opinion dated Jul. 4, 2024 in PCT ApplicationNo. PCT/US2024/019555.
International Search Report and Written Opinion dated Jul. 22, 2022 in Application No. PCT/US2022/022790.
International Search Report and Written Opinion dated Nov. 20, 2024 in PCT Application No. PCT/US2024/039915.
International Search Report and Written Opinion dated Oct. 17, 2022 in PCT Application No. PCT/US2022/033488.
International Search Report and Written Opinion dated Sep. 13, 2024 in PCT Application No. PCT/US2024/033522.
JP Notice of Allowances dated Aug. 27, 2024 in JP Application No. 2022-559416 with English translation.
JP Notice of Allowances dated Sep. 3, 2024 in JP Application No. 2023-63868 with English translation.
JP Office Action dated Apr. 2, 2024 in JP Application No. 2022-559416, with English Translation.
JP Office Action dated Apr. 30, 2025 in JP Application No. 2022547251, with English Translation.
JP Office Action dated Aug. 5, 2025 in JP Application No. 2021-575910, with English Translation.
JP Office Action dated Aug. 6, 2024 in JP Application No. 2023-558732, with English Translation.
JP Office Action dated Aug. 19, 2025 in JP Application No. 2022-557680, with English Translation.

(56) References Cited

OTHER PUBLICATIONS

JP Office Action dated Dec. 3, 2024 in JP Application No. 2023-558732 with English translation.
JP Office Action dated Dec. 9, 2025 in JP Application No. 2024559373, with English Translation.
JP Office Action dated Feb. 13, 2024 in JP Application No. 2023-63868, with English Translation.
JP Office Action dated Feb. 18, 2025 in JP Application No. 2022-557680, with English Translation.
JP Office Action dated Jan. 7, 2025 in JP Application No. 2023-533602, with English Translation.
JP Office Action dated Jan. 20, 2026 in JP Application No. 2025-073845, with English Translation.
JP Office Action dated Jun. 10, 2025 in JP Application No. 2024-559372, with English Translation.
JP Office Action dated Jun. 24, 2025 in JP Application No. 2022577244, with English Translation.
JP Office Action dated Mar. 3, 2026 in JP Application No. 2021-575910, with English Translation.
JP Office Action dated Mar. 4, 2025 in JP Application No. 2022-577244, with English Translation.
JP Office Action dated Mar. 5, 2024 in JP Application No. 2021-575910, with English Translation.
JP Office Action dated Mar. 26, 2024 in JP Application No. 2023-558732 with English translation.
JP Office Action dated May 13, 2025 in JP Application No. 2023-502906, with English Translation.
JP Office Action dated May 14, 2024 in JP Application No. 2021-576241 with English translation.
JP Office Action dated Nov. 12, 2024 in JP Application No. 2024-522188 with English translation.
JP Office Action dated Oct. 7, 2025 in JP Application No. 2024-197800, with English Translation.
JP Office Action dated Oct. 22, 2024 in JP Application No. 2022-547251 with English translation.
JP Office Action dated Sep. 9, 2025 in JP Application No. 2023-502906, with English Translation.
KR Notice of Allowance and Search Report dated Feb. 18, 2026 in KR Application No. 10-2022-7038499, with English translation.
KR Notice of Allowance dated Aug. 1, 2024 in KR Application No. 10-2024-7012307, with English Translation.
KR Notice of Allowance dated Dec. 12, 2024 in KR Application No. 10-2016-0152489, with English Translation.
KR Notice of Allowance dated Jan. 23, 2025 in KR Application No. 10-2024-7037880, with English Translation.
KR Notice of Allowances dated Jul. 8, 2024, in KR Application No. 10-2024-7006338 with English Translation.
KR Notice of Allowances dated Oct. 16, 2024 in KR Application No. 10-2022-7002869 with English Translation.
KR Office Action dated Apr. 9, 2024 in KR Application No. 10-2023-7038357 with English Translation.
KR Office Action dated Apr. 14, 2025 in KR Application No. 10-2022-7030615, with English Translation.
KR Office Action dated Apr. 23, 2024 in KR Application No. 10-2016-0152489 with English translation.
KR Office Action dated Aug. 27, 2025 in KR Application No. 10-2022-7014896, with English Translation.
KR Office Action dated Dec. 3, 2025 in KR Application No. 10-2022-7030615, with English Translation.
KR Office Action dated Dec. 17, 2025 in KR Application No. 10-2025-7013740, with English Translation.
KR Office Action dated Dec. 19, 2025 in KR Application No. 10-2025-7012180, with English Translation.
KR Office Action dated Dec. 28, 2025 in KR Application No. 10-2022-7003371, with English Translation.
KR Office Action dated Feb. 5, 2025 in KR Application No. 10-2022-7037995, with English Translation.
KR Office Action dated Feb. 8, 2026 in KR Application No. 10-2025-7013547, with English Translation.
KR Office Action dated Feb. 11, 2026 in KR Application No. 10-2025-7015615, with English Translation.
KR Office Action dated Feb. 29, 2024 in KR Application No. 10-2022-7026649, with English Translation.
KR Office Action dated Jan. 15, 2025 in KR Application No. 10-2023-7023253, with English Translation.
KR Office Action dated Jul. 12, 2024 in KR Application No. 10-2022-7029421 with English translation.
KR Office Action dated Jul. 12, 2024 in KR Application No. 10-2023-7036296 with English translation.
KR Office Action dated Jul. 22, 2025 in KR Application No. 10-2024-7037744, with English Translation.
KR Office Action dated Jun. 12, 2025 in KR Application No. 10-2023-7001454, with English Translation.
KR Office Action dated Jun. 24, 2024 in KR Application No. 10-2022-7002869, with English Translation.
KR Office Action dated Mar. 13, 2025 in KR Application No. 10-2023-7004801, with English Translation.
KR Office Action dated Mar. 14, 2024 in KR Application No. 10-2021-7022858, with English Translation.
KR Office Action dated Mar. 19, 2025 in KR Application No. 10-2022-7038020, with English Translation.
KR Office Action dated Mar. 27, 2025 in KR Application No. 10-2022-7003371, with English Translation.
KR Office Action dated May 29, 2025 in KR Application No. 10-2022-7038499, with English Translation.
KR Office Action dated Nov. 12, 2025 in KR Application No. 10-2023-7004801, with English Translation.
KR Office Action dated Nov. 24, 2025 in KR Application No. 10-2024-7043554, with English Translation.
KR Office Action dated Nov. 26, 2025 in KR Application No. 10-2022-7038020, with English Translation.
KR Office Action dated Nov. 28, 2024 in KR Application No. 10-2022-7014896, with English Translation.
SG Search Report and Written Opinion dated Jul. 3, 2024 in SG Application No. 11202114196U.
SG Search Report and Written Opinion dated May 14, 2024 in SG Application No. 11202251864Y.
SG Written Opinion dated Aug. 30, 2024 in SG Application No. 11202114183P.
SG Written Opinion dated Jul. 31, 2024 in SG Application No. 11202307119P.
SG Written Opinion dated Jun. 30, 2025 in SG Application No. 11202114183P.
SG Written Opinion dated Jun. 30, 2025 in SG Application No. 11202251459E.
SG Written Opinion dated Nov. 7, 2025 in SG Application No. 11202251015X.
TW Office Action and Search Report dated Aug. 4, 2025 in TW Application No. 114105681, with English Translation.
TW Office Action and Search Report dated Aug. 15, 2025 in TW Application No. 114123201, with English Translation.
TW Office Action and Search Report dated Dec. 25, 2024 in TW Application No. 111112111, with English Translation.
TW Office Action and Search Report dated Jan. 12, 2026 in TW Application No. 114113726, with English Translation.
TW Office Action and Search Report dated Jan. 16, 2025 in TW Application No. 113105443, with English Translation.
TW Office Action and Search Report dated Jul. 8, 2025 in TW Application No. 110145602, with English Translation.
TW Office Action and Search Report dated Mar. 6, 2026 in TW Application No. 111121950, with English Translation.
TW Office Action and Search Report dated Nov. 6, 2025 in TW Application No. 113109390, with English Translation.
TW Office Action and Search Report dated Nov. 27, 2025 in TW Application No. 110126445, with English Translation.
TW Office Action and Search Report dated Oct. 30, 2025 in TW Application No. 111127705, with English Translation.
TW Office Action and Search Report dated Oct. 31, 2025 in TW Application No. 113128085, with English Translation.
TW Office Action dated Apr. 17, 2024 in TW Application No. 111112111 with English translation.

(56) References Cited

OTHER PUBLICATIONS

TW Office Action dated Apr. 17, 2025 in TW Application No. 113105443, with English Translation.
TW Office Action dated Apr. 17, 2025 in TW Application No. 113118322, with English Translation.
TW Office Action dated Apr. 19, 2024 in TW Application No. 112146727 with English translation.
TW Office Action dated Apr. 22, 2024 in TW Application No. 112126160 with English translation.
TW Office Action dated Aug. 6, 2024 in TW Application No. 110122525, with English Translation.
TW Office Action dated Aug. 8, 2024 in TW Application No. 111112111, with English Translation.
TW Office Action dated Feb. 24, 2026 in TW Application No. 114123201, with English Translation.
TW Office Action dated Jan. 9, 2026 in TW Application No. 113118322, with English Translation.
TW Office Action dated Jan. 13, 2026 in TW Application No. 114115269, with English Translation.
TW Office Action dated Jan. 20, 2025 in TW Application No. 108146890, with English Translation.
TW Office Action dated Jul. 2, 2024 in TW Application No. 109134940 with English translation.
TW Office Action dated Jul. 9, 2024 in TW Application No. 110111086 with English translation.
TW Office Action dated Jul. 23, 2024 in TW Application No. 110111878, with English Translation.
TW Office Action dated Jul. 24, 2025 in TW Application No. 113118322, with English Translation.
TW Office Action dated Jun. 27, 2024 in TW Application No. 110103944, with English Translation.
TW Office Action dated Jun. 27, 2024 in TW Application No. 113107490 with English translation.
TW Office Action dated Mar. 11, 2024 in TW Application No. 109121649, with English Translation.
TW Office Action dated Mar. 11, 2025 in TW Application No. 110126445, with English Translation.
TW Office Action dated Mar. 21, 2024 in TW Application No. 108146890, with English Translation.
TW Office Action dated Nov. 7, 2024 in TW Application No. 111112111, with English Translation.
TW Office Action dated Nov. 26, 2024 in TW Application No. 110126445, with English Translation.
TW Office Action dated Oct. 4, 2024 in TW Application No. 109121649 with English translation.
TW Office Action dated Sep. 25, 2024 in TW Application No. 110111136 with English translation.
U. S. Final Office Action dated Dec. 4, 2025 in U.S. Appl. No. 18/005,571.
U.S. Advisory Action dated Apr. 16, 2024 in U.S. Appl. No. 17/596,648.
U.S. Advisory Action dated Jan. 16, 2026 in U.S. Appl. No. 17/753,110.
U.S. Advisory Action dated Jun. 27, 2025 in U.S. Appl. No. 17/596,858.
U.S. Corrected Notice of Allowance dated Mar. 20, 2025 in U.S. Appl. No. 18/377,245.
U.S. Final Office Action dated Apr. 21, 2025 in U.S. Appl. No. 17/596,858.
U.S. Final Office Action dated Aug. 11, 2025 in U.S. Appl. No. 18/550,733.
U.S. Final Office Action dated Aug. 20, 2025 in U.S. Appl. No. 18/769,038.
U.S. Final Office Action dated Aug. 22, 2025 in U.S. Appl. No. 18/769,048.
U.S. Final Office Action dated Dec. 12, 2025 in U.S. Appl. No. 17/758,567.
U.S. Final Office Action dated Feb. 2, 2026 in U.S. Appl. No. 17/905,632.
U.S. Final Office Action dated Feb. 18, 2026 in U.S. Appl. No. 17/905,754.
U.S. Final Office Action dated Feb. 27, 2024 in U.S. Appl. No. 18/298,003.
U.S. Final Office Action dated Jul. 1, 2025 in U.S. Appl. No. 18/850,628.
U.S. Final Office Action dated Jun. 6, 2025 in U.S. Appl. No. 18/700,238.
U.S. Final Office Action dated Jun. 21, 2024 in U.S. Appl. No. 18/377,267.
U.S. Final Office Action dated Jun. 27, 2024 in U.S. Appl. No. 17/759,281.
U.S. Final Office Action dated Mar. 5, 2024 in U.S. Appl. No. 17/596,648.
U.S. Final Office Action dated Mar. 12, 2024 in U.S. Appl. No. 18/377,245.
U.S. Final Office Action dated May 3, 2024 in U.S. Appl. No. 18/297,989.
U.S. Final Office Action dated May 9, 2024 in U.S. Appl. No. 17/309,587.
U.S. Final Office Action dated Nov. 17, 2025 in U.S. Appl. No. 17/753,110.
U.S. Final Office Action dated Sep. 16, 2024 in U.S. Appl. No. 18/550,733.
U.S. Non-Final Office Action dated Apr. 17, 2025 in U.S. Appl. No. 18/769,038.
US Non-Final Office Action dated Apr. 23, 2025 in U.S. Appl. No. 18/550,733.
U.S. Non-Final Office Action dated Aug. 26, 2025 in U.S. Appl. No. 17/596,858.
U.S. Non-Final Office Action dated Feb. 1, 2024 in U.S. Appl. No. 17/759,281.
U.S. Non-Final Office Action dated Feb. 20, 2025 in U.S. Appl. No. 18/700,238.
U.S. Non-Final Office Action dated Jan. 3, 2025 in U.S. Appl. No. 18/769,038.
U.S. Non-Final Office Action dated Jan. 24, 2025 in U.S. Appl. No. 18/769,048.
U.S. Non-Final Office Action dated Jan. 27, 2026 in U.S. Appl. No. 18/932,475.
U.S. Non-Final Office Action dated Jan. 28, 2026 in U.S. Appl. No. 18/550,733.
US Non-Final Office Action dated Jul. 8, 2025 in U.S. Appl. No. 17/998,354.
US Non-Final Office Action dated Jul. 14, 2025 in U.S. Appl. No. 18/005,571.
US Non-Final Office Action dated Jul. 15, 2025 in U.S. Appl. No. 18/254,787.
US Non-Final Office Action dated Jul. 16, 2025 in U.S. Appl. No. 17/905,754.
US Non-Final Office Action dated Jun. 5, 2025 in U.S. Appl. No. 17/758,567.
US Non-Final Office Action dated Jun. 18, 2025 in U.S. Appl. No. 17/753,110.
U.S. Non-Final Office Action dated Jun. 21, 2024 in U.S. Appl. No. 17/596,648.
U.S. Non-Final Office Action dated Mar. 4, 2024 in U.S. Appl. No. 17/758,125.
U.S. Non-Final Office Action dated Mar. 4, 2024 in U.S. Appl. No. 18/377,267.
U.S. Non-Final Office Action dated Mar. 5, 2025 in U.S. Appl. No. 18/850,628.
US Non-Final Office Action dated May 5, 2025 in U.S. Appl. No. 18/769,048.
U.S. Non-Final Office Action dated May 29, 2024 in U.S. Appl. No. 18/298,003.
U.S. Non-Final Office Action dated May 31, 2024 in U.S. Appl. No. 18/550,733.
U.S. Non-Final Office Action dated Nov. 21, 2024 in U.S. Appl. No. 17/596,858.
U.S. Non-Final Office Action dated Oct. 1, 2024 in U.S. Appl. No. 17/309,587.

(56) References Cited

OTHER PUBLICATIONS

U.S. Non-Final Office Action dated Oct. 1, 2025 in U.S. Appl. No. 17/905,632.
U.S. Non-Final Office Action dated Oct. 9, 2024 in U.S. Appl. No. 18/377,245.
U.S. Non-Final Office Action dated Sep. 17, 2024 in U.S. Appl. No. 17/995,355.
U.S. Notice of Allowance dated Apr. 9, 2025 in U.S. Appl. No. 17/995,355.
U.S. Notice of Allowance dated Apr. 9, 2025 in U.S. Appl. No. 18/850,990.
U.S. Notice of Allowance dated Aug. 7, 2024 in U.S. Appl. No. 18/184,545.
U.S. Notice of Allowance dated Aug. 16, 2024 in U.S. Appl. No. 17/596,648.
U.S. Notice of Allowance dated Dec. 4, 2025 in U.S. Appl. No. 18/850,628.
U.S. Notice of Allowance dated Dec. 11, 2025 in U.S. Appl. No. 17/998,354.
U.S. Notice of Allowance dated Dec. 13, 2024 in U.S. Appl. No. 18/377,267.
U.S. Notice of Allowance dated Dec. 30, 2025 in U.S. Appl. No. 17/596,858.
U.S. Notice of Allowance dated Jul. 8, 2025 in U.S. Appl. No. 18/850,990.
U.S. Notice of Allowance dated Mar. 6, 2024 in U.S. Appl. No. 18/184,545.
U.S. Notice of Allowance dated Mar. 7, 2025 in U.S. Appl. No. 18/377,245.
U.S. Notice of Allowance dated Mar. 13, 2024 in U.S. Appl. No. 18/184,545.
U.S. Notice of Allowance dated Nov. 14, 2024 in U.S. Appl. No. 17/309,587.
U.S. Notice of Allowance dated Nov. 24, 2025 in U.S. Appl. No. 18/254,787.
U.S. Notice of Allowance dated Oct. 17, 2025 in U.S. Appl. No. 18/769,038.
U.S. Notice of Allowance dated Oct. 17, 2025 in U.S. Appl. No. 18/769,048.
U.S. Notice of Allowance dated Sep. 16, 2025 in U.S. Appl. No. 18/700,238.
U.S. Appl. No. 19/387,102, inventors Li D et al., filed on Nov. 12, 2025.
U.S. Appl. No. 19/393,174, inventors Tan S.S et al., filed on Nov. 18, 2025.
U.S. Appl. No. 19/482,119, inventors Demuth J.J et al., filed on Nov. 6, 2025.
U.S. Appl. No. 19/490,152, inventors Agnew D. Wet al., filed on Dec. 4, 2025.
U.S. Restriction Requirement dated Apr. 3, 2025 in U.S. Appl. No. 17/758,567.
U.S. Restriction requirement dated Feb. 14, 2024, in U.S. Appl. No. 18/550,733.
U.S. Restriction Requirement dated Mar. 20, 2025 in U.S. Appl. No. 17/753,110.
U.S. Restriction Requirement dated Mar. 26, 2025 in U.S. Appl. No. 17/905,754.
U.S. Supplemental Notice of Allowance dated Mar. 17, 2025 in U.S. Appl. No. 18/377,267.
Waard H D., et al., "Observations on Implanted Xenon-133 Sources," Proceedings of the Royal Society of London. Series A, Mathematical and Physical Sciences, Jun. 1969, vol. 311 (1504), pp. 139-150.
TW Office Action and Search Report dated Apr. 16, 2026 in TW Application No. 111128103, with English Translation.
EP Extended European Search report dated May 22, 2026 in EP Application No. 23832604.5.
EP Office Action dated May 7, 2026 in EP Application No. 20831343.7.
International Preliminary Report on Patentability and Written Opinion dated Apr. 2, 2026 in PCT Application No. PCT/US2024/046887.
International Preliminary Report on Patentability and Written Opinion dated May 21, 2026 in PCT Application No. PCT/US2024/054806.
International Search Report and Written Opinion dated Apr. 20, 2026 in PCT Application No. PCT/US2025/059876.
JP Decision to Grant and Search Report dated Mar. 31, 2026 in JP Application No. 2025-69214, with English translation.
JP Office Action dated Apr. 14, 2026 in JP Application No. 2023-577298, with English Translation.
JP Office Action dated Apr. 21, 2026 in JP Application No. 2025-34150, with English Translation.
JP Office Action dated Jun. 16, 2026 in JP Application No. 2025-073845, with English Translation.
JP Office Action dated Jun. 2, 2026 in JP Application No. 2025-078352, with English translation.
KR Notice of Allowance and Search Report dated Apr. 8, 2026 in KR Application No. 10-2024-7036349, with English translation.
KR Notice of Allowance and Search Report dated Apr. 9, 2026 in KR Application No. 10-2024-7037744, with English translation.
KR Office Action dated Apr. 21, 2026 in KR Application No. 10-2024-7001033, with English Translation.
KR Office Action dated Jun. 2, 2026 in KR Application No. 10-2022-7014896, with English Translation.
KR Office Action dated Mar. 30, 2026 in KR Application No. 10-2023-7001454, with English Translation.
KR Office Action dated May 18, 2026 in KR Application No. 10-2024-7037759, with English translation.
TW Notice of Allowance and Search Report dated May 25, 2026 in TW Application No. 114115289, with English translation.
TW Office Action and Search Report dated Jun. 22, 2026 in TW Application No. 114123201, with English Translation.
U.S. Non-Final Office Action dated Apr. 1, 2026 in U.S. Appl. No. 17/753,110.
U.S. Non-Final Office Action dated Apr. 29, 2026 in U.S. Appl. No. 17/758,567.
U.S. Non-Final Office Action dated May 12, 2026 in U.S. Appl. No. 18/005,571.
U.S. Notice of Allowance dated Apr. 27, 2026 in U.S. Appl. No. 17/905,754.
U.S. Notice of Allowance dated May 13, 2026 in U.S. Appl. No. 18/550,733.
U.S. Appl. No. 19/585,056, inventors DeMuth J.J et al., filed on May 6, 2026.
JP Decision to Grant and Search Report dated Aug. 18, 2026 in JP Application No. 2025-70054, with English translation.
JP Office Action dated Aug. 4, 2026 in JP Application No. 2025-129812, with English Translation.
JP Office Action dated Aug. 4, 2026 in JP Application No. 2025-34150, with English Translation.
JP Office Action dated Aug. 25, 2026 in JP Application No. 2025-067176, with English Translation.
JP Office Action dated Jun. 30, 2026 in JP Application No. 2025-111196, with English Translation.
JP Office Action dated Sep. 8, 2026 in JP Application No. 2024503523, with English Translation.
JP Office Action dated Sep. 15, 2026 in JP Application No. 2025-183187, with English Translation.
KR Notice of Allowance and Search Report dated Aug. 7, 2026 in KR Application No. 10-2023-7004801, with English translation.
KR Notice of Allowance and Search Report dated Sep. 2, 2026 in KR Application No. 10-2024-7043554, with English translation.
KR Office Action dated Aug. 11, 2026 in KR Application No. 10-2025-7032129, with English Translation.
KR Office Action dated Jul. 10, 2026 in KR Application No. 10-2025-7023237, with English Translation.
KR Office Action dated Sep. 2, 2026 in KR Application No. 10-2025-7013547, with English Translation.
TW Office Action and Search Report dated Aug. 4, 2026 in TW Application No. 114144883, with English Translation.

(56) References Cited

OTHER PUBLICATIONS

TW Office Action and Search Report dated Aug. 26, 2026, in TW Application No. 111148087, with English Translation.
TW Office Action and Search Report dated Jul. 15, 2026 in TW Application No. 111147615, with English Translation.
TW Office Action and Search Report dated Jul. 20, 2026 in TW Application No. 114115671, with English Translation.
TW Office Action and Search Report dated Jul. 29, 2026 in TW Application No. 111148104, with English Translation.
U.S. Final Office Action dated Aug. 24, 2026 in U.S. Appl. No. 17/753,110.
U.S. Final Office Action dated Sep. 3, 2026 in U.S. Appl. No. 18/005,571.
U.S. Non-Final Office Action dated Aug. 26, 2026 in U.S. Appl. No. 18/569,213.
U.S. Appl. No. 19/775,627, inventors Peter D, et al., filed on Aug. 13, 2026.
JP Office Action dated Sep. 15, 2026 in JP Application No. 2024-504920, with English Translation.
TW Office Action and Search Report dated Jul. 13, 2026 in TW Application No. 111128103, with English Translation.

* cited by examiner

REWORK OF METAL-CONTAINING PHOTORESIST

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

FIELD

The present disclosure relates to removal of photoresist material in semiconductor fabrication, and more particularly to rework of patternable metal-containing photoresist material in semiconductor fabrication.

BACKGROUND

The fabrication of semiconductor devices, such as integrated circuits, is a multi-step process involving photolithography. In general, the process includes the deposition of material on a wafer, and patterning the material through lithographic techniques to form structural features (e.g., transistors and circuitry) of the semiconductor device. The steps of a typical photolithography process known in the art include: preparing the substrate; applying a photoresist, such as by spin coating, exposing the photoresist to light in a desired pattern, causing the exposed areas of the photoresist to become more or less soluble in a developer solution; developing by applying a developer solution to remove either the exposed or the unexposed areas of the photoresist; and subsequent processing to create features on the areas of the substrate from which the photoresist has been removed, such as by etching or material deposition.

The evolution of semiconductor design has created the need, and has been driven by the ability, to create ever smaller features on semiconductor substrate materials. This progression of technology has been characterized in "Moore's Law" as a doubling of the density of transistors in dense integrated circuits every two years. Indeed, chip design and manufacturing has progressed such that modern microprocessors may contain billions of transistors and other circuit features on a single chip. Individual features on such chips may be on the order of 22 nanometers (nm) or smaller, in some cases less than 10 nm.

One challenge in manufacturing devices having such small features is the ability to reliably and reproducibly create photolithographic masks having sufficient resolution. Current photolithography processes typically use 193 nm ultraviolet (UV) light to expose a photoresist. The fact that the light has a wavelength significantly greater than the desired size of the features to be produced on the semiconductor substrate creates inherent issues. Achieving feature sizes smaller than the wavelength of the light requires use of complex resolution enhancement techniques, such as multipatterning. Thus, there is significant interest and research effort in developing photolithographic techniques using shorter wavelength light, such as extreme ultraviolet radiation (EUV), having a wavelength of from 10 nm to 15 nm, e.g., 13.5 nm.

EUV photolithographic processes can present challenges, however, including low power output and loss of light during patterning. Traditional organic chemically amplified resists (CAR) similar to those used in 193 nm UV lithography have potential drawbacks when used in EUV lithography, particularly as they have low absorption coefficients in EUV region and the diffusion of photo-activated chemical species can result in blur or line edge roughness. Furthermore, in order to provide the etch resistance required to pattern underlying device layers, small features patterned in conventional CAR materials can result in high aspect ratios at risk of pattern collapse. Accordingly, there remains a need for improved EUV photoresist materials, having such properties as decreased thickness, greater absorbance, and greater etch resistance.

The background description provided herein is for the purpose of generally presenting the context of the present technology. Work of the presently named inventors, to the extent it is described in this background section, as well as aspects of the description that may not otherwise qualify as prior art at the time of filing, are neither expressly nor impliedly admitted as prior art against the present technology.

SUMMARY

Provided herein is a method of removing metal-containing resist. The method includes providing in a process chamber a metal-containing resist on an underlayer of a semiconductor substrate, and exposing the metal-containing resist to an etch gas comprising a halide at a first elevated temperature to remove the metal-containing resist.

In some implementations, exposing the metal-containing resist to the etch gas comprises selectively removing the metal-containing resist relative to the underlayer. In some implementations, exposing the metal-containing resist to the etch gas is performed without exposure to plasma. In some implementations, exposing the metal-containing resist to the etch gas is performed with exposure to plasma. In some implementations, the method further includes exposing the underlayer and residual halides to removal gas to remove the underlayer and the residual halides after removing the metal-containing resist, where the removal gas includes an oxidizing gas or hydrogen gas at a second elevated temperature greater than the first elevated temperature. In some implementations, the method further includes exposing the underlayer and residual halides to plasma to remove the underlayer and the residual halides after removing the metal-containing resist, where the plasma includes ions and/or radicals of an oxidizing gas or hydrogen gas. In some implementations, the method further includes exposing the underlayer to plasma to treat a surface of the underlayer after removing the metal-containing resist. In some implementations, the method further includes exposing the semiconductor substrate to an aqueous solution of dilute hydrofluoric acid (dHF), and exposing the semiconductor substrate to an aqueous solution of dilute hydrochloric acid (dHCl) or a cleaning solution comprising ammonium hydroxide ($NH_4OH$) and hydrogen peroxide ($H_2O_2$). In some implementations, the metal-containing resist is a photopatterned metal-containing EUV resist. In some implementations, the etch gas comprises hydrogen fluoride (HF), hydrogen chloride (HCl), hydrogen bromide (HBr), hydrogen iodide (HI), hydrogen gas and fluorine gas ($H_2$+$F_2$), hydrogen gas and chlorine gas ($H_2$+$Cl_2$), hydrogen gas and bromine gas ($H_2$+$Br_2$), hydrogen gas and iodide gas ($H_2$+$I_2$), or bromine trichloride ($BC_3$). In some implementations, the first elevated temperature is between about 60° C. and about 250° C. In some implementations, a chamber pressure during exposure of the metal-containing resist to the etch gas is between about 100 mTorr and about 2000 mTorr, where a flow rate of the etch gas during exposure of the metal-containing resist to the etch gas is between about 100 sccm and about 5000 sccm. In some implementations, the underlayer comprises spin-on glass (SOG), spin-on carbon (SOC), amorphous or crystalline carbon, or silicon oxynitride (SiON). In some implementations, the method further includes conformally depositing a mask layer on the metal-containing resist, and removing a portion of the mask layer to expose a top surface of the metal-containing resist, where exposing the metal-containing resist to the etch gas selectively removes the metal-containing resist relative to the mask layer. In some implementations, exposing the metal-containing resist to the etch gas at the first elevated temperature comprises exposing a frontside of the semiconductor substrate to light from a plurality of light-emitting diodes (LEDs).

Also provided herein is a method of removing metal-containing resist. The method includes providing in a process chamber a metal-containing resist on an underlayer of a semiconductor substrate, and exposing the metal-containing resist to at least an aqueous solution of a dilute acid to remove the metal-containing resist.

In some implementations, exposing the metal-containing resist to at least the aqueous solution of the dilute acid comprises exposing the semiconductor substrate to an aqueous solution of dilute hydrofluoric acid (dHF), and exposing the semiconductor substrate to an aqueous solution of dilute hydrochloric acid (dHCl) or a cleaning solution comprising ammonium hydroxide ($NH_4OH$) and hydrogen peroxide ($H_2O_2$). In some implementations, the metal-containing resist is a photopatterned metal-containing EUV resist. In some implementations, exposing the metal-containing resist to at least the aqueous solution of the dilute acid selectively removes the metal-containing resist relative to the underlayer. In some implementations, the underlayer comprises spin-on glass (SOG), spin-on carbon (SOC), amorphous or crystalline carbon, or silicon oxynitride (SiON). In some implementations, exposing the metal-containing resist to at least the aqueous solution of the dilute acid comprises exposing a frontside and a backside of the semiconductor substrate to the aqueous solution of the dilute acid. In some implementations, the method further includes exposing the underlayer to plasma to treat a surface of the underlayer after removing the metal-containing resist.

DETAILED DESCRIPTION

Figure 1:
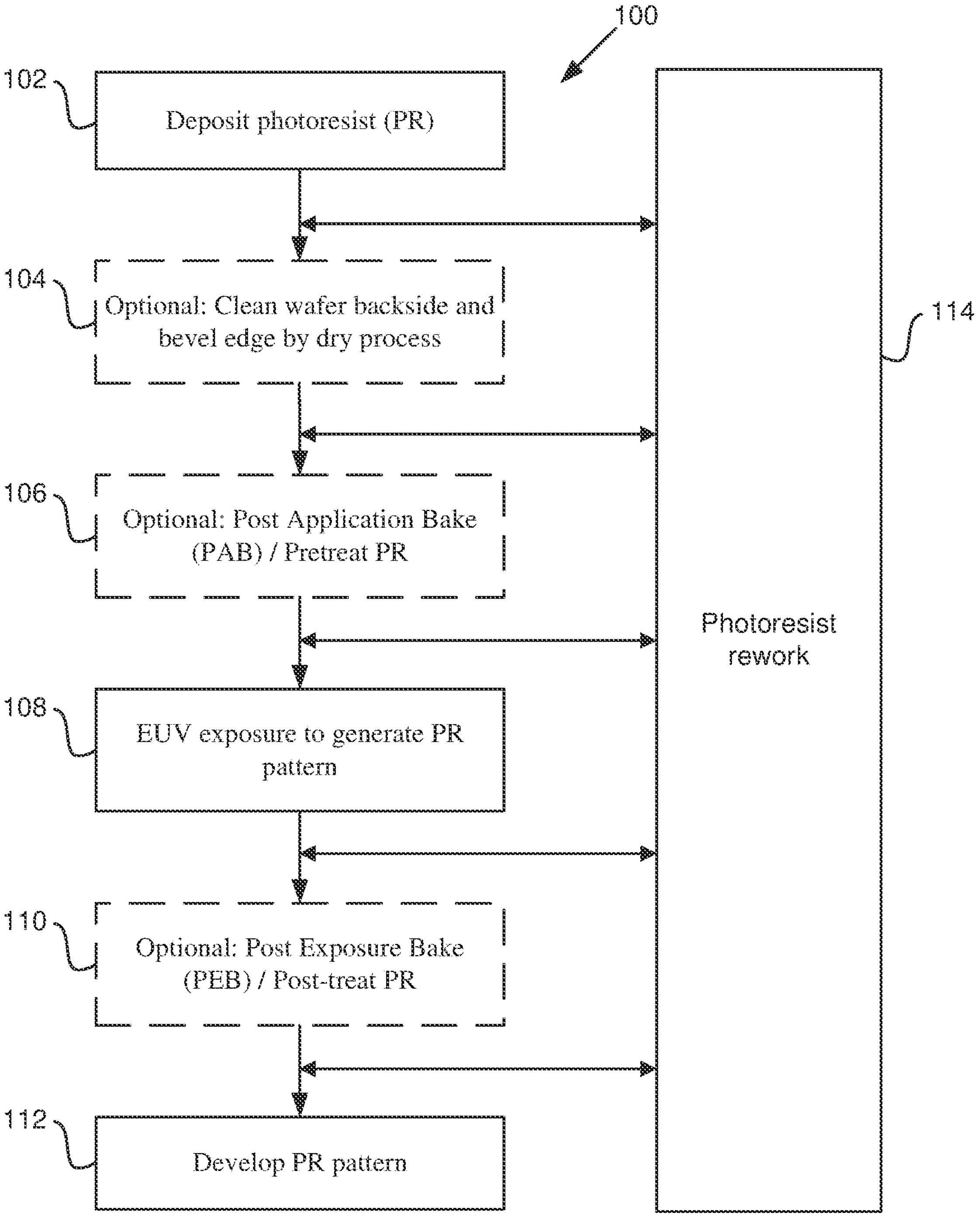
FIG. 1 presents a flow diagram of an example method for depositing and developing a photoresist according to some implementations.

Reference is made herein in detail to specific embodiments of the disclosure. Examples of the specific embodiments are illustrated in the accompanying drawings. While the disclosure will be described in conjunction with these specific embodiments, it will be understood that it is not intended to limit the disclosure to such specific embodiments. On the contrary, it is intended to cover alternatives, modifications, and equivalents as may be included within the spirit and scope of the disclosure. In the following description, numerous specific details are set forth in order to provide a thorough understanding of the present disclosure. The present disclosure may be practiced without some or all of these specific details. In other instances, well known process operations have not been described in detail so as to not unnecessarily obscure the present disclosure.

Introduction

Patterning of thin films in semiconductor processing is often an important step in the fabrication of semiconductors. Patterning involves lithography. In conventional photolithography, such as 193 nm photolithography, patterns are printed by emitting photons from a photon source onto a mask and printing the pattern onto a photosensitive photoresist, thereby causing a chemical reaction in the photoresist that, after development, removes certain portions of the photoresist to form the pattern.

Advanced technology nodes (as defined by the International Technology Roadmap for Semiconductors) include nodes 22 nm, 16 nm, and beyond. In the 16 nm node, for example, the width of a typical via or line in a Damascene structure is typically no greater than about 30 nm. Scaling of features on advanced semiconductor integrated circuits (ICs) and other devices is driving lithography to improve resolution.

Extreme ultraviolet (EUV) lithography can extend lithography technology by moving to smaller imaging source wavelengths than would be achievable with conventional photolithography methods. EUV light sources at approximately 10-20 nm, or 11-14 nm wavelength, for example 13.5 nm wavelength, can be used for leading-edge lithography tools, also referred to as scanners. The EUV radiation is strongly absorbed in a wide range of solid and fluid materials including quartz and water vapor, and so operates in a vacuum.

EUV lithography makes use of EUV resists that are patterned to form masks for use in etching underlying layers. EUV resists may be polymer-based chemically amplified resists (CARs) produced by liquid-based spin-on techniques. An alternative to CARs is directly photopatternable metal oxide-containing films, such as those available from Inpria Corp. (Corvallis, OR) and described, for example, in US Patent Publications US 2017/0102612, US 2016/021660, and US 2016/0116839, incorporated by reference herein at least for their disclosure of photopatternable metal oxide-containing films. Such films may be produced by spin-on techniques or dry vapor-deposited. The metal oxide-containing film can be patterned directly (i.e., without the use of a separate photoresist) by EUV exposure in a vacuum ambient providing sub-30 nm patterning resolution, for example as described in U.S. Pat. No. 9,996,004, issued Jun. 12, 2018 and titled EUV PHOTOPATTERNING OF VAPOR-DEPOSITED METAL OXIDE-CONTAINING HARDMASKS, and/or in International Patent Application No. PCT/US2019/31618, filed May 9, 2019, and titled METHODS FOR MAKING EUV PATTERNABLE HARD MASKS, the disclosures of which at least relating to the composition, deposition, and patterning of directly photopatternable metal oxide films to form EUV resist masks is incorporated by reference herein. Generally, the patterning involves exposure of the EUV resist with EUV radiation to form a photo-pattern in the resist, followed by development to remove a portion of the resist according to the photo-pattern to form the mask.

It should also be understood that the while present disclosure relates to lithographic patterning techniques and materials exemplified by EUV lithography, it is also applicable to other next generation lithographic techniques. In addition to EUV, which includes the standard 13.5 nm EUV wavelength currently in use and development, the radiation sources most relevant to such lithography are DUV (deep-UV), which generally refers to use of 248 nm or 193 nm excimer laser sources, X-ray, which formally includes EUV at the lower energy range of the X-ray range, as well as e-beam, which can cover a wide energy range. The specific methods may depend on the particular materials and applications used in the semiconductor substrate and ultimate semiconducting device. Thus, the methods described in this application are merely exemplary of the methods and materials that may be used in present technology.

Directly photopatternable EUV resists may be composed of or contain metals and/or metal oxides mixed within organic components. The metals/metal oxides are highly promising in that they can enhance the EUV photon adsorption and generate secondary electrons and/or show increased etch selectivity to an underlying film stack and device layers. These resists can be developed using a wet (solvent) approach or dry approach.

Patterned photoresists are used as masks to form patterns on a substrate during etching to protect selected areas of the substrate. After development, an inspection such as an after-develop-inspection (ADI) is performed. The inspection can ensure that the photolithography process has been performed correctly and within a specified tolerance. In some instances, the photoresists may be misaligned, may have unacceptable critical dimensions, or may embody defective patterns. A defective photoresist pattern or misaligned photoresist pattern can be detrimental to semiconductor substrate processing and even lead to device failure. Rather than discarding the entire substrate, the photoresist can be stripped, removed, or reworked when there are misalignment or other errors in the photoresist.

There are several different types of photoresist rework techniques. One method may involve burning photoresist from a substrate by an oxygen plasma, which is called oxygen plasma ashing. However, sidewall polymers and inorganic substances may still be present after the ashing process is complete. Another method may involve wet stripping, where an organic solvent may be applied. Or, wet stripping can employ a solution such as sulfuric acid ($H_2SO_4$) before metal layers, and an amine solution after metal layers. In some instances, photoresist removal may involve oxygen plasma ashing followed by wet stripping. These processes may have numerous shortcomings for photoresist rework. For example, such conventional photoresist reworking processes may have a long cycle time and large cost. Furthermore, these conventional photoresist reworking processes may not be suitable for removal of metal-containing photoresist such as photopatternable EUV resist. While the conventional photoresist removal techniques may effectively remove traditional photoresists such as spin-coated photoresists, such conventional photoresist removal techniques including oxygen plasma ashing, organic solvents, sulfuric acid solutions, etc. do not effectively remove metal-containing photoresists.

Photoresist Rework of Metal-Containing Resist

According to various aspects of the present disclosure, a photopatternable metal-containing resist is provided on a semiconductor substrate and removed using an etch gas at an elevated temperature. The metal-containing resist may be removed in a thermal environment without exposure to plasma (i.e., plasma-free etch gas). In some embodiments, however, the metal-containing resist may be removed in the thermal environment with exposure to plasma to accelerate removal of the metal-containing resist. The elevated temperature may be between about 60° C. and about 250° C. The metal-containing resist may include a photopatternable metal-containing EUV resist. The etch gas may include a halide such as hydrogen fluoride (HF), hydrogen chloride (HCl), hydrogen bromide (HBr), hydrogen iodide (HI), hydrogen gas and fluorine gas ($H_2$+$F_2$), hydrogen gas and chlorine gas ($H_2$+$Cl_2$), hydrogen gas and bromine gas ($H_2$+$Br_2$), hydrogen gas and iodide gas ($H_2$+$I_2$), and/or bromine trichloride ($BCl_3$). In some embodiments, the metal-containing resist is deposited on an underlayer, where exposing the metal-containing resist to the etch gas selectively removes the metal-containing resist relative to the underlayer. In some embodiments, the underlayer and residual halides may be removed by an oxidizing gas or hydrogen gas at a higher elevated temperature. Or, the underlayer and residual halides may be removed by plasma, where the plasma can include ions and/or radicals of an oxidizing gas or hydrogen gas. The underlayer may include spin-on glass (SOG), spin-on carbon, amorphous or crystalline carbon, or silicon oxynitride (SiON).

According to various aspects of the present disclosure, a photopatternable metal-containing resist is provided on a semiconductor substrate and removed using a wet process. The wet process may include at least an aqueous solution of a dilute acid to remove the metal-containing resist. Exposure to an aqueous solution of dilute acid may include exposure to dilute hydrofluoric acid (dHF) and exposure to dilute hydrochloric acid (dHCl), or exposure to dilute hydrofluoric acid and exposure to a cleaning solution comprising ammonium hydroxide ($NH_4OH$) and hydrogen peroxide ($H_2O_2$). The metal-containing resist may include a photopatternable metal-containing EUV resist. In some embodiments, the metal-containing resist is deposited on an underlayer, where exposing the metal-containing resist to the aqueous solution of dilute acid selectively removes the metal-containing resist relative to the underlayer. The underlayer may include spin-on glass, spin-on carbon, amorphous or crystalline carbon, or silicon oxynitride.

FIG. 1 presents a flow diagram of an example method for depositing and developing a photoresist according to some implementations. The operations of a process 100 may be performed in different orders and/or with different, fewer, or additional operations. Aspects of the process 100 may be described with reference to FIGS. 2, 3, 4A-4F, 5A-5C, and 6A-6C. One or more operations of the process 100 may be performed using an apparatus described in any one of FIGS. 7-11. In some implementations, the operations of the process 100 may be implemented, at least in part, according to software stored in one or more non-transitory computer readable media. In some implementations, photoresist rework may be performed after photoresist deposition, backside and bevel edge clean, post application bake, light exposure, post exposure bake, or development (patterning).

At block 102 of the process 100, a layer of photoresist is deposited. This may be either a dry deposition process such as a vapor deposition process or a wet process such as a spin-on deposition process.

The photoresist may be a metal-containing EUV resist. An EUV-sensitive metal or metal oxide-containing film may be deposited on a semiconductor substrate by any suitable technique, including wet (e.g., spin-on) or dry (e.g., CVD) deposition techniques. For example, described processes have been demonstrated for EUV photoresist compositions based on organotin oxides, being applicable to both commercially spin-coatable formulations (e.g., such as are available from Inpria Corp, Corvallis, OR) and formulations applied using dry vacuum deposition techniques, further described below.

Semiconductor substrates may include any material construct suitable for photolithographic processing, particularly for the production of integrated circuits and other semiconducting devices. In some implementations, semiconductor substrates are silicon wafers. Semiconductor substrates may be silicon wafers upon which features have been created ("underlying features"), having an irregular surface topography. As referred to herein, the "surface" is a surface onto which a film of the present disclosure is to be deposited or that is to be exposed to EUV during processing. Underlying features may include regions in which material has been removed (e.g., by etching) or regions in which materials have been added (e.g., by deposition) during processing prior to conducting a method of this disclosure. Such prior processing may include methods of this disclosure or other processing methods in an iterative process by which two or more layers of features are formed on the substrate.

EUV-sensitive thin films may be deposited on the semiconductor substrate, such films being operable as resists for subsequent EUV lithography and processing. Such EUV-sensitive thin films comprise materials which, upon exposure to EUV, undergo changes, such as the loss of bulky pendant substituents bonded to metal atoms in low density M-OH rich materials, allowing their crosslinking to denser M-O-M bonded metal oxide materials. Through EUV patterning, areas of the film are created that have altered physical or chemical properties relative to unexposed areas. These properties may be exploited in subsequent processing, such as to dissolve either unexposed or exposed areas, or to selectively deposit materials on either the exposed or unexposed areas. In some implementations, the unexposed film has a more hydrophobic surface than the exposed film under the conditions at which such subsequent processing is performed. For example, the removal of material may be performed by leveraging differences in chemical composition, density and cross-linking of the film. Removal may be by wet processing or dry processing, as further described below.

The thin films are, in various implementations, organometallic materials, for example organotin materials comprising tin oxide, or other metal oxide materials/moieties. The organometallic compounds may be made in a vapor phase reaction of an organometallic precursor with a counter reactant. In various implementations, the organometallic compounds are formed through mixing specific combinations of organometallic precursors having bulky alkyl groups or fluoroalkyl groups with counter-reactants and polymerizing the mixture in the vapor phase to produce a low-density, EUV-sensitive material that deposits onto the semiconductor substrate.

In various implementations, organometallic precursors comprise at least one alkyl group on each metal atom that can survive the vapor-phase reaction, while other ligands or ions coordinated to the metal atom can be replaced by the counter-reactants. Organometallic precursors include those of the formula.

$$M_aR_bL_c \quad \text{(Formula 1)}$$

wherein: M is an element with a high patterning radiation-absorption cross-section; R is alkyl, such as $C_nH_{2n+1}$, preferably wherein n=1-6; L is a ligand, ion or other moiety which is reactive with the counter-reactant; a≥1; b≥1; and c≥1. In various implementations, M has an atomic absorption cross section equal to or greater than $1\times10^7$ cm$^2$/mol. M may be, for example, selected from the group consisting of tin, hafnium, tellurium, bismuth, indium, antimony, iodine, germanium, and combinations thereof. In some implementations, M is tin. R may be fluorinated, e.g., having the formula $C_nF_xH_{(2n+1)}$. In various implementations, R has at least one beta-hydrogen or beta-fluorine. For example, R may be selected from the group consisting of methyl, ethyl, i-propyl, n-propyl, t-butyl, i-butyl, n-butyl, sec-butyl, n-pentyl, i-pentyl, t-pentyl, sec-pentyl, and mixtures thereof. L may be any moiety readily displaced by a counter-reactant to generate an M-OH moiety, such as a moiety selected from the group consisting of amines (such as dialkylamino, monoalkylamino), alkoxy, carboxylates, halogens, and mixtures thereof.

Organometallic precursors may be any of a wide variety of candidate metal-organic precursors. For example, where M is tin, such precursors include t-butyl tris(dimethylamino) tin, i-butyl tris(dimethylamino) tin, n-butyl tris(dimethylamino) tin, sec-butyl tris(dimethylamino) tin, i-propyl(tris) dimethylamino tin, n-propyl tris(dimethylamino) tin, ethyl tris(dimethylamino) tin and analogous alkyl(tris)(t-butoxy) tin compounds such as t-butyl tris(t-butoxy) tin. In some implementations, the organometallic precursors are partially fluorinated.

Counter-reactants have the ability to replace the reactive moieties, ligands or ions (e.g., L in Formula 1, above) so as to link at least two metal atoms via chemical bonding. Counter-reactants can include water, peroxides (e.g., hydrogen peroxide), di- or polyhydroxy alcohols, fluorinated di- or polyhydroxy alcohols, fluorinated glycols, and other sources of hydroxyl moieties. In various implementations, a counter-reactant reacts with the organometallic precursor by forming oxygen bridges between neighboring metal atoms.

Other potential counter-reactants include hydrogen sulfide and hydrogen disulfide, which can crosslink metal atoms via sulfur bridges.

The thin films may include optional materials in addition to an organometallic precursor and counter-reactants to modify the chemical or physical properties of the film, such as to modify the sensitivity of the film to EUV or enhancing etch resistance. Such optional materials may be introduced, such as by doping during vapor phase formation prior to deposition on the semiconductor substrate, after deposition of the thin film, or both. In some implementations, a gentle remote $H_2$ plasma may be introduced so as to replace some Sn-L bonds with Sn—H, which can increase reactivity of the resist under EUV.

In various implementations, the EUV-patternable films are made and deposited on the semiconductor substrate using vapor deposition equipment and processes among those known in the art. In such processes, the polymerized organometallic material is formed in vapor phase or in situ on the surface of the semiconductor substrate. Suitable processes include, for example, chemical vapor deposition (CVD), atomic layer deposition (ALD), and ALD with a CVD component, such as a discontinuous, ALD-like process in which metal precursors and counter-reactants are separated in either time or space. In some implementations, the EUV-patternable films are made and deposited on the semiconductor substrate using wet deposition equipment and processes among those known in the art. For example, the organometallic material is formed by spin-coating on the surface of the semiconductor substrate. Regardless, photoresist rework and other associated lithography operations may be subsequently applied on metal-containing EUV resist irrespective of how the metal-containing EUV resist is deposited.

The thickness of the EUV-patternable film formed on the surface of the semiconductor substrate may vary according to the surface characteristics, materials used, and processing conditions. In various implementations, the film thickness may range from 0.5 nm to 100 nm, and may be a sufficient thickness to absorb most of the EUV light under the conditions of EUV patterning. The EUV-patternable film may be able to accommodate absorption equal to or greater than 30%, thereby having significantly fewer EUV photons available towards the bottom of the EUV-patternable film. Higher EUV absorption leads to more cross-linking and densification near the top of an EUV-exposed film compared to the bottom of the EUV-exposed film. Though efficient utilization of EUV photons may occur with EUV-patternable films having higher overall absorption, it will be understood that in some instances, the EUV-patternable film may be less than about 30%. For comparison, the maximum overall absorption of most other resist films is less than 30% (e.g., 10% or less, or 5% or less) so that the resist material at the bottom of the resist film is sufficiently exposed. In some implementations, the film thickness is from 10 nm to 40 nm or from 10 nm to 20 nm. Moreover, as discussed above, the deposited films may closely conform to surface features, providing advantages in forming masks over substrates, such as substrates having underlying features, without "filling in" or otherwise planarizing such features.

At block 114 of the process 100, a photoresist rework is performed after deposition of the metal-containing EUV resist thin film at block 102 of the process 100. Removal of the metal-containing EUV resist thin film may take place before patterning of the metal-containing EUV resist thin film. Removal of the metal-containing EUV resist thin film may occur in a purely thermal environment or using a wet process. In some embodiments, deposition and removal of the metal-containing EUV resist film may be performed in the same process chamber. However, it will be understood that photoresist rework may be performed in a different process chamber than the deposition operation in some implementations. In fact, the photoresist rework may be performed subsequent to a bevel edge and/or backside clean, bake, exposure, development, or etch operation, which may or may not be the same as the deposition chamber.

It is possible that the deposited EUV resist materials being removed are generally composed of Sn, O, and C, but film strip and photoresist rework can be extended to films of other metal oxide resists and materials.

At block 104, an optional cleaning process is performed to clean a backside and/or bevel edge of the semiconductor substrate. The backside and/or bevel edge clean may non-selectively etch EUV resist film to equally remove film with various levels of oxidation or crosslinking on the substrate backside and bevel edge. During application of the EUV-patternable film, either by wet deposition processing or dry deposition processing, there may be some unintended deposition of resist material on the substrate bevel edge and/or backside. The unintended deposition may lead to undesirable particles later moving to a top surface of the semiconductor substrate and becoming particle defects. Additionally, this bevel edge and backside deposition can cause downstream processing problems, including contamination of the patterning (scanner) and development tools. Removal of this bevel edge and backside deposition can be done by wet cleaning or dry cleaning techniques.

By way of an example, the substrate bevel edge and/or backside clean may be a dry clean process. In some implementations, the dry clean process involves a vapor and/or plasma having one or more of the following gases: HBr, HCl, $BC_3$, $SOCl_2$, $Cl_2$, $BBr_3$, $H_2$, $O_2$, $PCl_3$, $CH_4$, methanol, ammonia, formic acid, $NF_3$, HF. In some implementations, the dry clean process may use the same chemistries as a dry development process. For the bevel edge and/or backside clean process, the vapor and/or the plasma has to be limited to a specific region of the substrate to ensure that only the backside and the bevel are removed, without any film degradation on a frontside of the substrate.

Process conditions may be optimized for bevel edge and/or backside clean. In some implementations, higher temperature, higher pressure, and/or higher reactant flow may lead to increased etch rate. Suitable process conditions for a dry bevel edge and backside clean may be: reactant flow of 100-10000 sccm (e.g., 500 sccm HCl, HBr, HI, or $H_2$ and $Cl_2$ or $Br_2$, $BCl_3$ or $H_2$, or other halogen-containing compound), temperature of 20° C. to 140° C. (e.g., 80° C.), pressure of 20-1000 mTorr (e.g., 100 mTorr) or pressure of 50-765 Torr (e.g., 760 Torr), plasma power of 0 to 500 W at high frequency (e.g., 13.56 MHz), and for a time of about 10 to 20 seconds, dependent on the photoresist film and composition and properties. Bevel and/or backside clean may be accomplished using a Coronus® tool available from Lam Research Corporation, Fremont, CA, though a wider range of process conditions may be used according to the capabilities of the processing reactor.

Bevel edge and/or backside clean may alternatively be extended to a full photoresist removal or photoresist "rework" as described herein where an applied EUV photoresist is removed and the semiconductor substrate prepared for photoresist reapplication, such as when the original photoresist is damaged or otherwise defective. Photoresist rework is typically accomplished without damaging the underlying semiconductor substrate, so an oxygen-based etch is usually avoided. Instead, organic vapor chemistries or variants of halogen-containing chemistries as described herein may be used. It will be understood that the photoresist rework operation may be applied at any stage during the process 100. Thus, the photoresist rework operation may be applied after deposition, after bevel edge and/or backside clean, after PAB treatment, after EUV exposure, after PEB treatment, after development, or after hard bake. In some implementations, the photoresist rework may be performed for non-selective removal of exposed and unexposed regions of the photoresist but selective to an underlayer.

At block 114 of the process 100, a photoresist rework is performed after a bevel edge and/or backside clean at block 104 of the process 100. This allows for bevel edge and/or backside clean and photoresist rework to be performed in the same process chamber. However, it will be understood that the photoresist rework may be performed in a different process chamber than the bevel edge and/or backside clean in some implementations.

At block 106 of the process 100, an optional post-application bake (PAB) is performed after deposition of the metal-containing EUV resist film and prior to EUV exposure. The PAB treatment may involve a combination of thermal treatment, chemical exposure, and moisture to increase the EUV sensitivity of the metal-containing EUV resist film, reducing the EUV dose to develop a pattern in the metal-containing EUV resist film. The PAB treatment temperature may be tuned and optimized for increasing the sensitivity of the metal-containing EUV resist film. For example, the treatment temperature may be between about 90° C. and about 200° C. or between about 150° C. and about 190° C. In some implementations, the PAB treatment may be conducted with a pressure between atmospheric and vacuum, and a treatment duration of about 1 to 15 minutes, for example about 2 minutes. In some implementations, the PAB treatment is conducted at a temperature between about 100° C. to 230° C. for about 1 minute to 2 minutes.

At block 114 of the process 100, a photoresist rework operation may be performed after the PAB treatment at block 106 of the process 100. This allows for bake and photoresist rework to be performed in the same process chamber. However, it will be understood that the photoresist rework may be performed in a different process chamber than the PAB treatment in some implementations.

At block 108 of the process 100, the metal-containing EUV resist film is exposed to EUV radiation to develop a pattern. Generally speaking, the EUV exposure causes a change in the chemical composition and cross-linking in the metal-containing EUV resist film, creating a contrast in etch selectivity that can be exploited for subsequent development.

The metal-containing EUV resist film may then be patterned by exposing a region of the film to EUV light, typically under relatively high vacuum. EUV devices and imaging methods among those useful herein include methods known in the art. In particular, as discussed above, exposed areas of the film are created through EUV patterning that have altered physical or chemical properties relative to unexposed areas. For example, in exposed areas, metal-carbon bond cleavage may occur, as through a beta-hydride elimination, leaving behind reactive and accessible metal hydride functionality that can be converted to hydroxide and cross-linked metal oxide moieties via metal-oxygen bridges during a subsequent post-exposure bake (PEB) step. This process can be used to create chemical contrast for development as a negative tone resist. In general, a greater number of beta-H in the alkyl group results in a more sensitive film. This can also be explained as weaker Sn—C bonding with more branching. Following exposure, the metal-containing EUV resist film may be baked, so as to cause additional cross-linking of the metal oxide film. The difference in properties between exposed and unexposed areas may be exploited in subsequent processing, such as to dissolve unexposed areas or to deposit materials on the exposed areas. For example the pattern can be developed using a suitable method to form a metal oxide-containing mask.

In particular, in various implementations, the hydrocarbyl-terminated tin oxide present on the surface is converted to hydrogen-terminated tin oxide in the exposed region(s) of an imaging layer, particularly when the exposure is performed in a vacuum using EUV. However, removing exposed imaging layers from vacuum into air, or the controlled introduction of oxygen, ozone, $H_2O_2$, or water, can result in the oxidation of surface Sn—H into Sn—OH. The difference in properties between exposed and unexposed regions may be exploited in subsequent processing, such as by reacting the irradiated region, the unirradiated region, or both, with one or more reagents to selectively add material to or remove material from the imaging layer.

Without limiting the mechanism, function or utility of present technology, EUV exposure, for example, at doses of from 10 mJ/cm$^2$ to 100 mJ/cm$^2$ results in the cleavage of Sn—C bonds resulting in loss of the alkyl substituent, alleviating steric hindrance and allowing the low-density film to collapse. In addition, reactive metal-H bond generated in the beta-hydride elimination reactions can react with neighboring active groups such as hydroxyls in the film, leading to further cross-linking and densification, and creating chemical contrast between exposed and unexposed region(s).

Following exposure of the metal-containing EUV resist film to EUV light, a photopatterned metal-containing EUV resist is provided. The photopatterned metal-containing EUV resist includes EUV-exposed and unexposed regions.

At block 114 of the process 100, a photoresist rework operation may be performed after the EUV exposure at block 108 of the process 100. This allows for photoresist rework to take place after forming photopatterned metal-containing EUV resist. It will be understood that the photoresist rework may be performed in a different process chamber than EUV exposure in some implementations.

At block 110 of the process 100, an optional post-exposure bake (PEB) is performed to further increase contrast in etch selectivity of the photopatterned metal-containing EUV resist. The photopatterned metal-containing EUV resist can be thermally treated in the presence of various chemical species to facilitate cross-linking of the EUV-exposed regions or simply baked on a hot plate in ambient air, for example between 100° C. and 250° C. for between one and five minutes (e.g., 190° C. for two minutes).

In various implementations, a bake strategy involves careful control of the bake ambient, introduction of reactive gases, and/or careful control of the ramping rate of the bake temperature. Examples of useful reactive gases include e.g., air, $H_2O$, $H_2O_2$ vapor, $CO_2$, CO, $O_2$, $O_3$, $CH_4$, $CH_3OH$, $N_2$, $H_2$, $NH_3$, $N_2O$, NO, alcohol, acetyl acetone, formic acid, Ar, He, or their mixtures. The PEB treatment is designed to (1) drive complete evaporation of organic fragments that are generated during EUV exposure and (2) oxidize any Sn—H, Sn—Sn, or Sn radical species generated by EUV exposure into metal hydroxide, and (3) facilitate cross-linking between neighboring Sn—OH groups to form a more densely crosslinked $SnO_2$-like network. The bake temperature is carefully selected to achieve optimal EUV lithographic performance. Too low a PEB temperature would lead to insufficient cross-linking, and consequently less chemical contrast for development at a given dose. Too high a PEB temperature would also have detrimental impacts, including severe oxidation and film shrinkage in the unexposed region (the region that is removed by development of the patterned film to form the mask in this example), as well as, undesired interdiffusion at the interface between the photopatterned metal-containing EUV resist and an underlayer, both of which can contribute to loss of chemical contrast and an increase in defect density due to insoluble scum. The PEB treatment temperature may be between about 100° C. and about 300° C., between about 170° C. and about 290° C., or between about 200° C. and about 240° C. In some implementations, the PEB treatment may be conducted with a pressure between atmospheric and vacuum, and a treatment duration of about 1 to 15 minutes, for example about 2 minutes. In some implementations, PEB thermal treatment may be repeated to further increase etch selectivity.

At block 114 of the process 100, a photoresist rework operation may be performed after the PEB treatment at block 110 of the process 100. This allows for bake and photoresist rework to be performed in the same process chamber. However, it will be understood that the photoresist rework may be performed in a different process chamber than the PEB treatment in some implementations.

At block 112 of the process 100, the photopatterned metal-containing EUV resist is developed to form a resist mask. In various implementations, the exposed regions are removed (positive tone) or the unexposed regions are removed (negative tone). In some implementations, development may include selective deposition on either the exposed or unexposed regions of the photopatterned metal-containing EUV resist, followed by an etching operation. In some implementations, development may be done with exposure to dry chemistries. The development may be done without striking a plasma in some implementations. Or, development may be done with flows of dry chemistries activated in a remote plasma source or activated by exposure to remote UV radiation. The photoresist for development may include an element selected from the group consisting of tin, hafnium, tellurium, bismuth, indium, antimony, iodine, and germanium. The element may have a high patterning radiation-absorption cross-section. In some implementations, the element may have a high EUV-absorption cross-section. In some implementations, the metal-containing EUV resist may have an overall absorption greater than 30%. In an all-dry lithography process, this provides more efficient utilization of EUV photons, enabling development of thicker and more EUV-opaque resists.

Examples of processes for development involve an organotin oxide-containing EUV-sensitive photoresist thin film (e.g., 10-40 nm thick, such as 20 nm), subjected to a EUV exposure dose and post-exposure bake, and then developed. The photoresist film may be, for example, deposited based on a gas phase reaction of an organotin precursor such as isopropyl(tris)(dimethylamino)tin and water vapor, or may be a spin-on film comprising tin clusters in an organic matrix.

At block 114 of the process 100, a photoresist rework operation may be performed after development at block 112 of the process 100. This allows for development and photoresist rework to be performed in the same process chamber. However, it will be understood that the photoresist rework may be performed in a different process chamber than development in some implementations.

Figure 2:
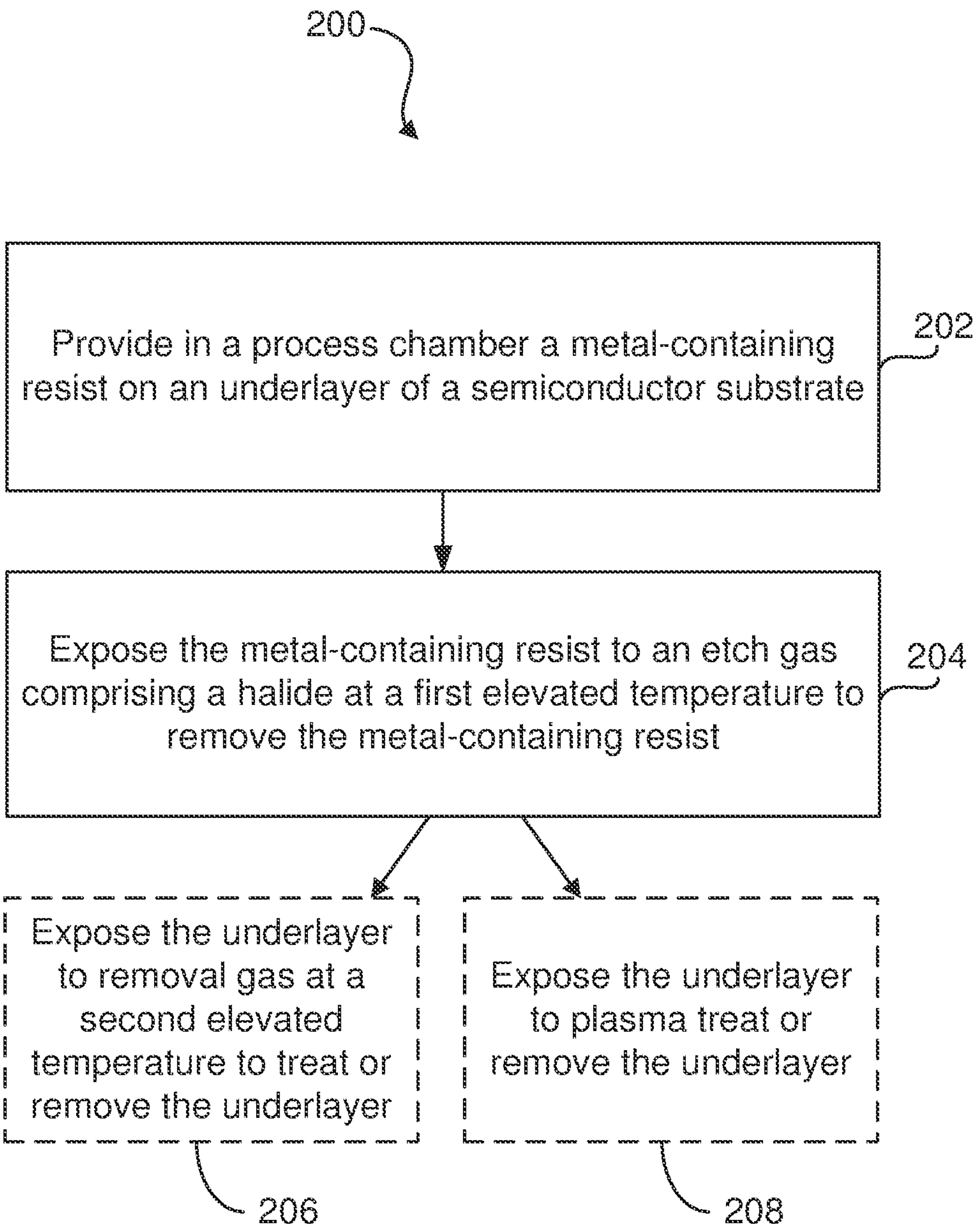
FIG. 2 presents a flow diagram of an example method of removing metal-containing resist according to some implementations.

FIG. 2 presents a flow diagram of an example method of dry developing a metal-containing resist according to some implementations. The operations of a process 200 may be performed in different orders and/or with different, fewer, or additional operations. Aspects of the process 200 may be described with reference to FIGS. 4A-4F, 5A-5C, and 6A-6C. One or more operations of the process 200 may be performed using an apparatus described in any one of FIGS. 7-11. In some implementations, the operations of the process 200 may be implemented, at least in part, according to software stored in one or more non-transitory computer readable media.

At block 202 of the process 200, a metal-containing resist is provided on an underlayer of a semiconductor substrate in a process chamber. The metal-containing resist may be deposited on the surface of the semiconductor substrate. The metal-containing resist is dry or wet deposited on the semiconductor substrate. In some implementations, the metal-containing resist is provided as a photopatterned metal-containing resist after undergoing development. In some implementations, the metal-containing resist is provided as a positive tone or negative tone resist having EUV-exposed and EUV-unexposed regions after EUV exposure. In some implementations, the metal-containing resist is provided as photopatternable metal-containing resist prior to EUV exposure and development. In some implementations, the metal-containing resist is metal-containing EUV resist, where the metal-containing EUV resist may be an organometal oxide or organo-metal-containing film. The composition of metal-containing resist material may be described, for example, in International Patent Application No. PCT/US2019/31618, filed May 9, 2019, incorporated by reference herein in its entirety and for all purposes. Methods include those where polymerized organometallic materials are produced in the vapor phase and deposited on the semiconductor substrate. For example, an element in the metal-containing resist material may be selected from a group consisting of: tin, hafnium, tellurium, bismuth, indium, antimony, iodine, germanium, and combinations thereof.

The metal-containing resist is disposed on an underlayer of the substrate. The underlayer may include a device layer to be patterned using the metal-containing resist as a mask. After development of the metal-containing resist, the underlayer may be etched according to a pattern of the metal-containing resist. In some implementations, the underlayer includes spin-on glass (SOG), spin-on carbon (SOC), amorphous or crystalline carbon, or silicon oxynitride (SiON). For example, the underlayer may include carbon such as carbon deposited by plasma-enhanced chemical vapor deposition (PECVD). The metal-containing resist is composed of a different material than the underlayer so that a subsequent photoresist rework may be selective to the metal-containing resist relative to the underlayer.

At block 204 of the process 200, the metal-containing resist is exposed to an etch gas comprising a halide at a first elevated temperature to remove the metal-containing resist. In some embodiments, photoresist rework is performed in a thermal environment without any exposure to plasma. In some alternative embodiments, photoresist rework is performed in a thermal environment with exposure to plasma to accelerate removal of the metal-containing resist. The etch gas for photoresist rework includes a halogen-containing gas. In some embodiments, the metal-containing resist is selectively removed relative to the underlayer. In some other embodiments, the metal-containing resist and the underlayer are removed together with exposure to the etch gas at the first elevated temperature.

Photoresist rework may involve vapors of halogens such as a vapor of boron trichloride ($BC_3$), hydrogen gas ($H_2$) mixed with fluorine gas ($F_2$), chlorine gas ($Cl_2$), bromine gas ($Br_2$), or iodine gas ($I_2$), or a vapor of a hydrogen halide such as hydrogen fluoride (HF), hydrogen chloride (HCl), hydrogen bromide (HBr), or hydrogen iodide (HI). However, such vapors may leave a residue or scum after development. The residue may include residual etch byproduct adsorbed on surfaces of the semiconductor substrate. For example, the vapors of halogens may react with moisture or oxygen to forming residual etch byproducts that are difficult to remove. In some cases, the residue may include high metal concentrations or particles or clusters of metal oxide (e.g., $SnO_x$) that can contaminate downstream processing tools. As photoresist rework proceeds, the clusters of metal oxide may become more concentrated. Clusters of metal oxide are generally difficult to remove. And because the residue may be difficult to remove and not readily volatile, a separate plasma step or separate chamber with plasma capability may be necessary. Otherwise, high temperature swings are performed to cause the residue to volatilize. In some embodiments, the etch gas for photoresist rework includes an organic vapor such as an organic acid. In some implementations, the organic acid includes a carboxylic acid. In some implementations, the organic acid includes trifluoroacetic acid ($CF_3COOH$), hexafluoro-acetylacetone ($CF_3CCH_2CCF_3$), trifluoroacetic acid anhydride ($(CF_3CO)_2O$), acetic acid anhydride ($(CH_3CO)_2O$), trichloroacetic acid ($CC_3COOH$), mono-fluoroacetic acid ($CFH_2COOH$), difluoroacetic acid ($CF_2HCOOH$), a mixed halide acetic acid such as chloro-difluoro-acetic acid, a sulfur-containing analogue of acetic acid, thioacetic acid ($CH_3COSH$), or thioglycolic acid ($HSCH_2CO_2H$).

Photoresist rework of the present disclosure may be performed in a plasma-free thermal process. This means that the process chamber for photoresist rework may be without plasma capability. By eliminating plasma exposure, this avoids plasma damage to the semiconductor substrate and can significantly reduce cost and increase throughput. Furthermore, internal surfaces of the process chamber may be made of materials that do not have to be resistant to plasma as well as resistant to vapors of halogens such as hydrogen halides. By applying a plasma-free thermal approach, productivity can be significantly improved as multiple wafers can be batch developed, at the same time in a low-cost thermal vacuum chamber/oven. However, in some implementations, the thermal photoresist rework process may be followed by exposure to plasma. Subsequent exposure to plasma may occur for desorption, descumming, treatment, or other processing operations. Alternatively, in some implementations, the thermal photoresist rework process may be accompanied by exposure to plasma to accelerate removal of the metal-containing resist.

In some embodiments, thermal photoresist rework may be integrated in the same platform or even the same process chamber as other photolithography operations. That way, thermal photoresist rework may be performed without introducing a vacuum break in between operations. By way of an example, the process chamber may be a rework chamber for performing photoresist rework, and the rework chamber may also be configured to perform dry development of photoresist and/or dry etch or underlying materials.

Photoresist rework of the metal-containing resist may be combined with other dry processing operations such as dry deposition (e.g., CVD) of the metal-containing resist, dry chamber clean, or dry etch of the underlayer, or dry development. In some implementations, processing of the semiconductor substrate may combine all dry steps including film formation by vapor deposition, EUV lithographic patterning, dry development, and dry photoresist rework. Bake operations, bevel edge and/or backside clean operations, and chamber clean operations may also be dry operations. Such processing operations may avoid material and productivity costs associated with wet processing operations such as wet development. Furthermore, dry processing can provide more tunability and add further critical dimension (CD) control and possible scum removal. Employing all-dry processing operations may facilitate integration within an interconnected vacuum processing chamber without exposure to and contamination by ambient air or trace contaminants contained therein.

In some implementations, the process chamber may include a showerhead for delivery of the etch gas. In some implementations, the process chamber may include gas inlets other than the showerhead for delivery of the etch gas. The gas inlets may be positioned in regions of the process chamber where etch gas is less likely to reach through delivery via a showerhead. In some implementations, the gas inlets may be positioned below the substrate support, positioned in the walls of the process chamber, and/or positioned close to an exhaust of the process chamber. Multiple gas inlets may be used for delivery of the etch gas into the process chamber. This can ensure complete removal of the metal-containing resist from the semiconductor substrate and even throughout the process chamber.

In some implementations, the process chamber may be a thermal process chamber with one or more chamber parts for temperature control. In some embodiments, the thermal process chamber may include a heating assembly positioned underneath the semiconductor substrate. In some embodiments, the heating assembly may include a plurality of independently controllable heating zones. In some embodiments, the heating assembly may include a plurality of heating elements such as light-emitting diodes (LEDs). The LEDs may form part of an LED substrate support or chuck. In some embodiments, the heating assembly may include a radiant heating assembly that may include one or more infrared (IR) lamps.

In some implementations, the thermal process chamber may include a heating assembly positioned above the semiconductor substrate. The heating assembly may face the semiconductor substrate for substrate temperature control. As a result, heat may be directed to a frontside of the semiconductor substrate rather than through a backside. This allows the metal-containing resist to be heated without requiring heat to be transferred from the backside of the semiconductor substrate. In some embodiments, the heating assembly may include a plurality of heating elements such as LEDs. The heating elements may emit radiation from outside the process chamber through a window or port to heat the semiconductor substrate. The heating elements may alternatively emit radiation from inside the process chamber, where the heating elements may be positioned around a showerhead or positioned on the showerhead. In some embodiments, the heating assembly may include a radiant heating assembly that may include one or more IR lamps.

The heating assembly may be employed for heating the semiconductor substrate to the first elevated temperature during removal of the metal-containing resist. The heating assembly may be employed for heating the semiconductor substrate for other operations. For instance, the heating assembly may be employed to heat the semiconductor substrate for dehalogenation (e.g., removal of residual halides) on the semiconductor substrate (e.g., underlayer) or elsewhere in the process chamber (e.g., chamber walls). Additionally or alternatively, the heating assembly may be employed for treating the underlayer and/or promoting volatilization of etch byproducts.

Generally, lower temperatures may increase contrast in etch selectivity while higher temperatures may decrease contrast in etch selectivity. Thus, higher temperatures may increase volatilization of etch byproducts and limit residue formation on the semiconductor substrate. Furthermore, higher temperatures may reduce etch selectivity between the metal-containing resist and the underlayer.

Substrate temperature may be tuned to promote removal of the metal-containing resist with the etch gas. Substrate temperature may influence etch selectivity between the metal-containing resist and the underlayer. The semiconductor substrate may be heated to the first elevated temperature, where the first elevated temperature may be between about 40° C. and about 300° C., between about 60° C. and about 250° C., or between about 80° C. and about 150° C. Preferably, the first elevated temperature may be about 100° C.

Chamber pressure may be tuned, where chamber pressure may influence etch selectivity between the metal-containing resist and the underlayer. Generally, higher pressures reduce etch selectivity including etch selectivity between the metal-containing resist and the underlayer. In some implementations, chamber pressure may be between about 50 mTorr and about 765 Torr (over ambient pressure), between about 100 mTorr and about 760 Torr (ambient pressure), between about 100 mTorr and about 2000 mTorr, or between about 200 mTorr and about 1000 mTorr. Preferably, the chamber pressure may be about 400 mTorr.

Gas flow rate of the etch gas may be tuned, where gas flow may influence etch selectivity between the metal-containing resist and the underlayer during photoresist rework. In some implementations, gas flow may be between about 50 sccm and about 20000 sccm, between about 100 sccm and about 10000 sccm, between about 100 sccm and about 5000 sccm, or between about 200 sccm and about 5000 sccm. Preferably, the gas flow rate of the etch gas (e.g., hydrogen halide) may be about 470 sccm.

Duration of exposure to the etch gas may be tuned in the photoresist rework process, where exposure times may influence etch selectivity between the metal-containing resist and the underlayer. Generally speaking, longer exposure times reduce etch selectivity including etch selectivity between the metal-containing resist and the underlayer. The duration of exposure may depend on the amount of metal-containing resist to be removed, etch gas chemistry, amount of crosslinking in the resist, and composition and properties of the resist, among other factors. In some implementations, duration of exposure may be between about 1 minute and about 30 minutes, between about 2 minutes and about 20 minutes, or between about 3 minutes and about 15 minutes.

As described above, etch selectivity photoresist rework is tunable by controlling process conditions such as temperature, pressure, gas flow, duration, and gas composition, among other tunable process conditions. Tuning etch selectivity in a single step or multiple steps may achieve desired outcomes. More specifically, descumming, smoothing, dehalogenation, treatment, or removal of the underlayer may depend in part on the process conditions during photoresist rework.

Photoresist rework using thermal processes of the present disclosure may effectively remove the metal-containing resist so that there would be little to no trace of defects and residues (e.g., residual halides) remaining on the semiconductor substrate. In some implementations, photoresist rework using thermal processes of the present disclosure may substantially remove the metal-containing resist so that metal atoms (e.g., tin atoms) are present in an amount fewer than about $1\times10^{10}$ atoms/cm$^2$ on the surface of the semiconductor substrate.

The photoresist rework at block 204 may be accompanied by one or more subsequent operations. Such operations may remove any remaining metal-containing resist on the semiconductor substrate in some implementations. For instance, defectivity may be improved by an additional wet clean step after exposure to the etch gas. Alternatively, the one or more subsequent operations may treat the underlayer or remove the underlayer. The aforementioned operations may utilize plasma or thermal exposure.

At block 206 of the process 200, the underlayer is optionally exposed to removal gas at a second elevated temperature to treat or remove the underlayer. The underlayer may be treated or removed after removal of the metal-containing resist or simultaneous with removal of the metal-containing resist. Treatment of the underlayer may remove residue (e.g., residual halides or clusters of metal oxide) or other contaminants on the surface of the semiconductor substrate. In some implementations, the second elevated temperature may be greater than the first elevated temperature. In some implementations, the second elevated temperature may be between about 120° C. and about 600° C., between about 160° C. and about 500° C., or between about 200° C. and about 400° C. The increased temperature reduces etch selectivity between the metal-containing resist and the underlayer. In some implementations, the removal gas may be different than the etch gas. For example, the removal gas can include an oxidizing chemistry such as oxygen ($O_2$), ozone ($O_3$), or carbon dioxide ($CO_2$). In another example, the removal gas can include a reducing chemistry such as hydrogen ($H_2$) or forming gas (mixture of $H_2$ and $N_2$).

At block 208 of the process 200, the underlayer is optionally exposed to plasma to treat or remove the underlayer. The underlayer may be treated or removed after removal of the metal-containing resist or simultaneous with removal of the metal-containing resist. The plasma may be useful for desorption, descumming, dehalogenation, and smoothing operations. Plasma treatment of the underlayer may remove residue (e.g., residual halides or clusters of metal oxide) or other contaminants from the surface of the semiconductor substrate. Plasma treatment may reactivate the surface of the semiconductor substrate for subsequent metal-containing resist deposition, which may be referred to as "surface refresh." In some instances, there may be residue or scum after photoresist rework. Residue or scum may result from slower etching components in less homogeneous EUV resist formulations, including those applied by spin-coating techniques. Such scum may include particles or clusters with high metal concentrations, which may be problematic during subsequent semiconductor processing operations. Accordingly, photoresist rework may be accompanied by treatment such as plasma treatment. During plasma treatment, the plasma power may be relatively low with high ion energy. In some implementations, the plasma power may be between about 50 W and about 1000 W, or between about 100 W and about 300 W. In some implementations, a wafer bias is between about 10 V and about 500 V, or between about 50 V and about 300 V. The duration of exposure to plasma may be relatively short so as to avoid excess plasma. In some implementations, the duration of plasma exposure is between about 0.5 seconds and about 20 seconds, or between about 1 second and about 5 seconds. In some implementations, the plasma may include ions and/or radicals of an oxidizing agent such as oxygen, ozone, or carbon dioxide. In some implementations, the plasma may include ions and/or radicals of a reducing agent such as hydrogen. In some implementations, the plasma may be generated in a plasma-generating chamber such as an inductively-coupled plasma (ICP) reactor, transformer-coupled plasma (TCP) reactor, capacitively-coupled plasma (CCP) reactor, or other reactors known in the art.

In some implementations, the process 200 further includes performing a wet clean on the semiconductor substrate to remove residual metal-containing resist from the semiconductor substrate. The wet clean may be performed after photoresist rework at block 204, after exposure to removal gas at a second elevated temperature at block 206, or after exposure to plasma at block 208. The wet clean may employ one or more inorganic acidic solutions. In some implementations, the semiconductor substrate may be exposed to an aqueous solution of a dilute acid such as dilute hydrofluoric acid (dHF) followed by exposure to another aqueous solution of a dilute acid such as dilute hydrochloric acid (dHCl). Such dilute acids may have a molar ratio (mixing ratio) of about 10:1 or more, 20:1 or more, or 100:1 or more. In some implementations, the semiconductor substrate may be exposed to an aqueous solution of a dilute acid such as dHF followed by exposure to a cleaning solution comprising ammonium hydroxide ($NH_4OH$) and hydrogen peroxide ($H_2O_2$). In addition or in the alternative, the semiconductor substrate may be exposed to sulfuric acid ($H_2SO_4$) and its mixtures with water, $H_2O_2$, and HF, which may also be referred to as DSP (dilute sulfuric peroxide) or DSP+ (dilute sulfuric peroxide-HF). In some implementations, the wet clean may employ one or more organic acids such as acetic acid. In some implementations, the wet clean may employ semi-aqueous solvents.

In some implementations, the process 200 further includes purging and/or pumping the process chamber to remove unwanted particles. A purge gas may be flowed into the process chamber to facilitate removal of unwanted particles such as metal organic precursor and residual halides in the process chamber as well as on the semiconductor substrate. A purge of metal organic precursor and residual halides may be useful to avoid undesired byproducts. The purging and/or pumping may perform dehalogenation of the process chamber and the semiconductor substrate.

Figure 3:
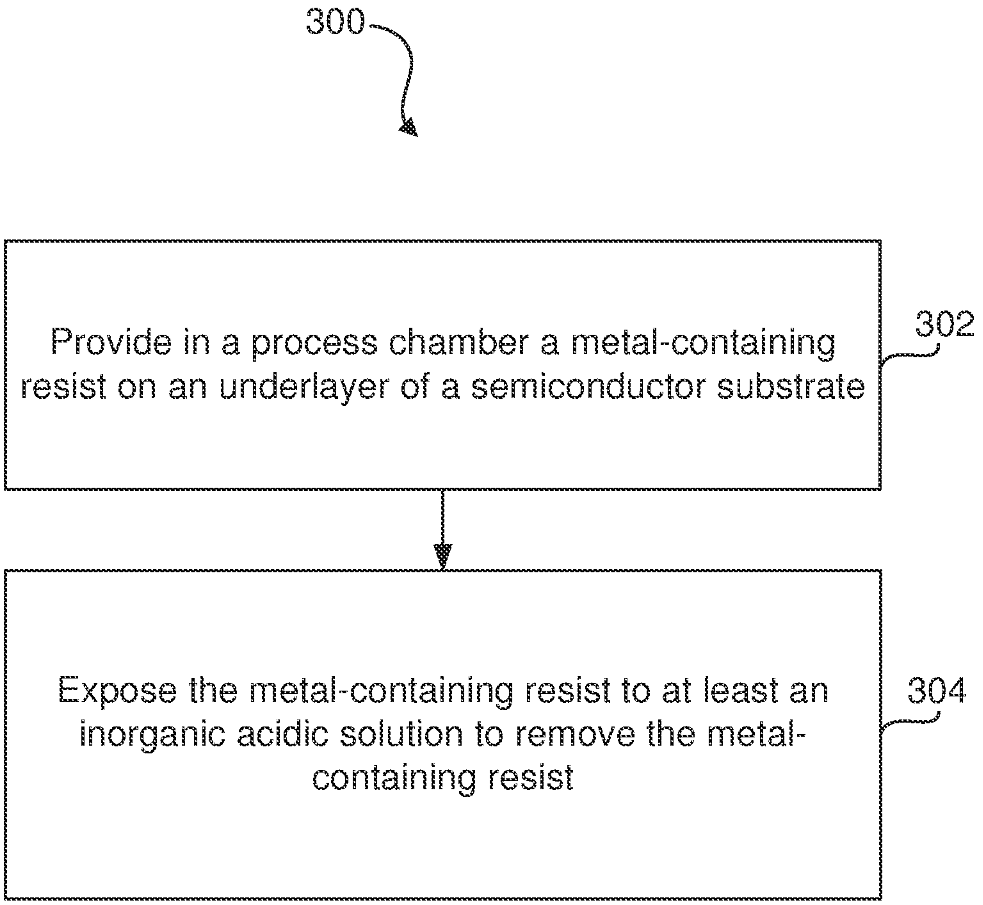
FIG. 3 presents a flow diagram of an alternative example method of removing metal-containing resist according to some implementations.

Rather than performing photoresist rework in a thermal dry environment, photoresist rework of metal-containing resist can be accomplished using wet chemistries. As such, the wet chemistries may effectively remove metal-containing resist without assistance from dry chemistries such as halogen-containing gases. FIG. 3 presents a flow diagram of an alternative example method of removing metal-containing resist according to some implementations. Aspects of the process 300 may be described with reference to FIGS. 4A-4F, 5A-5C, and 6A-6C. One or more operations of the process 300 may be performed using an apparatus described in any one of FIGS. 7-11. In some implementations, the operations of the process 300 may be implemented, at least in part, according to software stored in one or more non-transitory computer readable media.

At block 302 of the process 300, a metal-containing resist is provided on an underlayer of a semiconductor substrate in a process chamber. The metal-containing resist may be deposited on the surface of the semiconductor substrate. The metal-containing resist is dry or wet deposited on the semiconductor substrate. In some implementations, the metal-containing resist is provided as a photopatterned metal-containing resist after undergoing development. In some implementations, the metal-containing resist is provided as a positive tone or negative tone resist having EUV-exposed and EUV-unexposed regions after EUV exposure. In some implementations, the metal-containing resist is provided as photopatternable metal-containing resist prior to EUV exposure and development. In some implementations, the metal-containing resist is metal-containing EUV resist, where the metal-containing EUV resist may be an organo-metal oxide or organo-metal-containing film.

The metal-containing resist is deposited on an underlayer of the substrate. The underlayer may include a device layer to be patterned using the metal-containing resist as a mask. After development of the metal-containing resist, the underlayer may be etched according to a pattern of the metal-containing resist. In some implementations, the underlayer includes spin-on glass, spin-on carbon, amorphous or crystalline carbon, or silicon oxynitride. For example, the underlayer may include carbon such as carbon deposited by PECVD. The metal-containing resist is composed of a different material than the underlayer so that a subsequent photoresist rework may be selective to the metal-containing resist relative to the underlayer.

At block 304 of the process 300, the metal-containing resist is exposed to at least an inorganic acidic solution to remove the metal-containing resist. In particular, photoresist rework may be performed with a wet clean within a wet clean chamber as the process chamber. Thus, photoresist rework may proceed using wet chemistry without assistance from plasma or dry chemistries. The inorganic acidic solution may include a strong acid having a pKa that is equal to or less than about 3.8. In some embodiments, the metal-containing resist is selectively removed relative to the underlayer. In some other embodiments, the metal-containing resist and the underlayer are removed together with exposure to the wet chemistries. The inorganic acidic solution may be applied on one or both sides of the semiconductor substrate. For instance, exposing the metal-containing resist to the inorganic acidic solution may include exposing a frontside and a backside of the semiconductor substrate to the inorganic acidic solution.

Ordinarily, photoresists are removed using organic solvents rather than inorganic acidic solutions. Inorganic acidic solutions are not typically employed in removal of photoresists. However, the inorganic acidic solutions may be applied to metal-containing resists such as organo-metal oxide photoresists for photoresist rework. Inorganic acidic solutions may include dilute acids such as dHF and dHCl. Such dilute acids may have a molar ratio (mixing ratio) of about 2:1 or more, 5:1 or more, 10:1 or more, or 20:1 or more. Other inorganic acidic solutions may include DSP or DSP+. However, it will be understood that in some other implementations, photoresist rework by wet clean may utilize organic acidic solutions such as acetic acid or semi-aqueous solvents.

Photoresist rework using wet chemistries may proceed in a multi-step sequential manner. In some implementations, an inorganic acidic solution may be initially applied to the semiconductor substrate and followed by another inorganic acidic solution or cleaning solution. In one example, photoresist rework by wet clean may occur by exposing the semiconductor substrate to dHF followed by exposing the semiconductor substrate to dHCl. Exposure to an acidic solution such as dHF may primarily serve to remove the metal-containing resist material of the photoresist. In another example, photoresist rework by wet clean may occur by exposing the semiconductor substrate to dHF followed by exposing the semiconductor substrate to a cleaning solution comprising $NH_4OH$ and $H_2O_2$. Application of such a cleaning solution may constitute an RCA-1 clean developed by the RCA Corporation, which is also referred to as standard clean-1 ("SC-1").

Photoresist rework of the metal-containing resist may be combined with other wet processing operations such as wet deposition (e.g., spin-on techniques), wet etch of the underlayer, or wet development. In some implementations, processing of the semiconductor substrate may combine multiple wet steps including film formation by wet deposition, wet development, and wet photoresist rework.

In some implementations, the process chamber may be a wet clean chamber with one or more parts for fluid delivery. In some implementations, the process chamber may be a spin-rinse-drying (SRD) station in a semiconductor processing tool. The wet clean chamber may be equipped with one or more nozzles for discharging fluids such as the inorganic acidic solution. In some embodiments, the one or more nozzles may be movable for positioning over certain locations of the semiconductor substrate. In some embodiments, the wet clean chamber may be equipped with a rotatable substrate support or chuck so that cleaning/acidic solutions may be driven outwardly from the edge of a rotating substrate. In some embodiments, the wet clean chamber may be equipped with one or more heating elements for temperature control during wet photoresist rework. Such heating elements may include a one or more LEDs or IR lamps. In some embodiments, the one or more heating elements may be positioned under the semiconductor substrate and facing a backside of the semiconductor substrate. Heating the semiconductor substrate may promote removal of the metal-containing resist. Additionally or alternatively, heating the semiconductor substrate may promote evaporation of a liquid from the semiconductor substrate. Heating the semiconductor substrate may also promote dehalogenation, desorption, descumming, or smoothing operations. Other conditions that may be tuned to influence wet clean of the metal-containing resist may include spin speed of the rotatable substrate support, where faster spin speeds may promote removal of the metal-containing resist, and boom swing (i.e., dispenser arm location movement over the semiconductor substrate).

Photoresist rework using wet chemistries may not only remove metal-containing resist, but may also treat or remove the underlayer. In some embodiments, application of at least the inorganic acidic solution selectively removes the metal-containing resist relative to the underlayer. In other words, the inorganic acidic solution may remove the metal-containing resist while substantially preserving the underlayer. In some embodiments, the wet clean may treat the surface of the underlayer. The wet clean treatment of the underlayer may involve a dilute inorganic acidic solution or cleaning solution such as SC-1. The wet clean treatment may remove residues and various contaminants so that the surface may be reactivated for subsequent deposition of photoresist. That way, lithographic processes may be repeated on the underlayer with negligible or no significant impact after the photoresist rework using wet chemistries.

Photoresist rework using wet chemistries of the present disclosure may effectively remove the metal-containing resist so that there would be little to no trace of defects and residues remaining on the semiconductor substrate. In some implementations, photoresist rework using wet chemistries of the present disclosure may substantially remove the metal-containing resist so that metal atoms (e.g., tin atoms) are present at an amount fewer than about $1\times10^{10}$ atoms/$cm^2$ on the surface of the semiconductor substrate.

In some implementations, the process 300 may further include exposure to a thermal processor plasma process as described in the present disclosure. The thermal processor plasma process may be employed to remove the underlayer or treat the underlayer for improved defectivity.

Figure 4A:
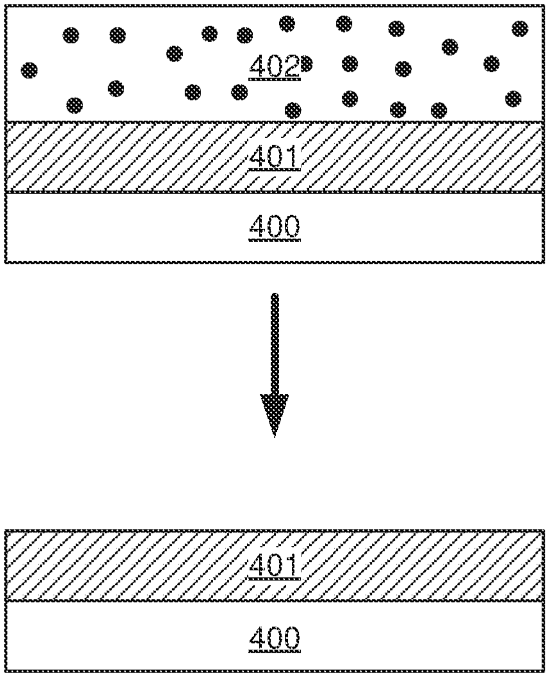
FIGS. 4A-4F show cross-sectional schematic illustrations of various processing techniques for removing metal-containing photoresist according to some implementations.

FIG. 4A shows a schematic illustration of various stages of metal-containing photoresist removal in a first implementation (case 1). In this implementation, a substrate 400 is provided with an underlayer 401 and a metal-containing photoresist 402 disposed on the underlayer 401. The metal-containing photoresist 402 may be patterned or unpatterned. In some implementations, the metal-containing photoresist 402 includes an organo-metal oxide photoresist. In FIG. 4A, the metal-containing photoresist 402 is selectively removed relative to the underlayer 401. Selective removal may occur using a thermal process without plasma exposure. For example, the thermal process may expose the semiconductor substrate 400 to an etch gas comprising a halide (e.g., hydrogen halide) at an elevated temperature greater than about 50° C., or between about 60° C. and about 250° C. Alternatively, selective removal may occur using a wet process. For instance, the wet process may expose the semiconductor substrate 400 to at least an inorganic acidic solution such as dHF, which may be followed by another inorganic acidic solution such as dHCl or a cleaning solution such as SC-1. Selective removal may achieve a level of metal atoms fewer than $1\times10^{10}$ atoms/$cm^2$ with little to no residues.

Figure 4B:
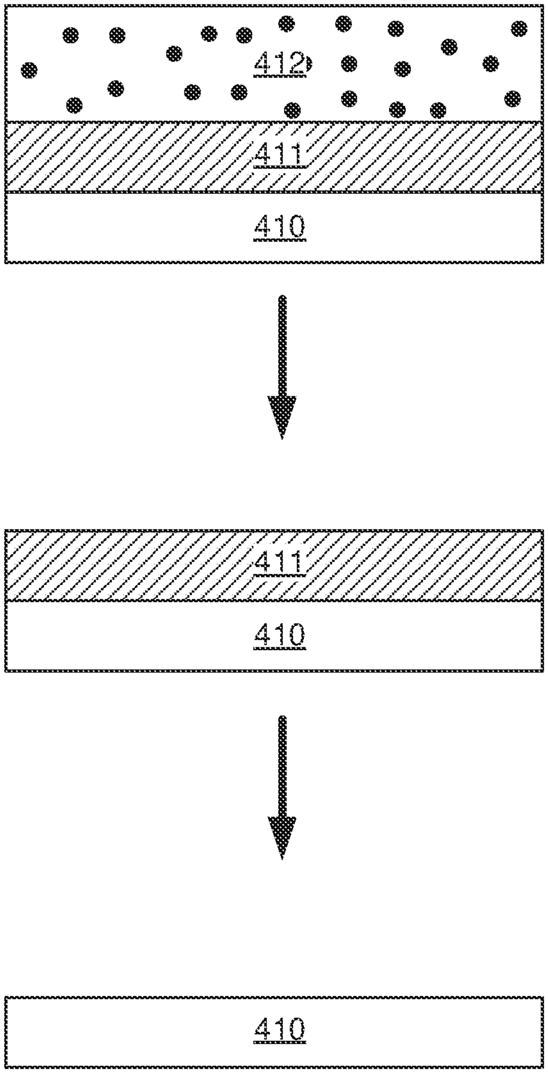

FIG. 4B shows a schematic illustration of various stages of metal-containing photoresist removal in a second implementation (case 2). In this implementation, a substrate 410 is provided with an underlayer 411 and a metal-containing photoresist 412 disposed on the underlayer 411. The metal-containing photoresist 412 may be patterned or unpatterned. In some implementations, the metal-containing photoresist 412 includes an organo-metal oxide photoresist. In FIG. 4B, the metal-containing photoresist 412 is removed in a first step and the underlayer 411 is removed in a second step. In one example, the metal-containing photoresist 412 may be removed using a thermal process in the first step and the underlayer 411 may be removed using a plasma process in the second step. If a plasma process is applied for the second step, the plasma may include ions and/or radicals of an oxidizing agent or a reducing agent. For example, an oxygen-based plasma or a hydrogen-based plasma may remove the underlayer 411 in a downstream plasma process. In another example, the metal-containing photoresist 412 may be removed using a first thermal process with a first etch gas in the first step and the underlayer 411 may be removed using a second thermal process with a second etch gas in the second step. The first thermal process may apply a temperature greater than about 50° C. or between about 60° C. and about 250° C. with a first etch gas including a halide (e.g., hydrogen halide). The second thermal process may apply a temperature greater than about 50° C. or between about 60° C. and about 250° C. with a second etch gas including an oxidizing agent or a reducing agent. In yet another example, the metal-containing photoresist 412 may be removed using a thermal process in the first step and the underlayer 411 may be removed using a wet process. The thermal process may apply a temperature greater than about 50° C. or between about 60° C. and about 250° C. with an etch gas including a halide (e.g., hydrogen halide). The wet process may apply at least an inorganic acidic solution such as dHF, which may optionally be followed by another inorganic acidic solution such as dHCl or a cleaning solution such as SC-1.

Figure 4C:
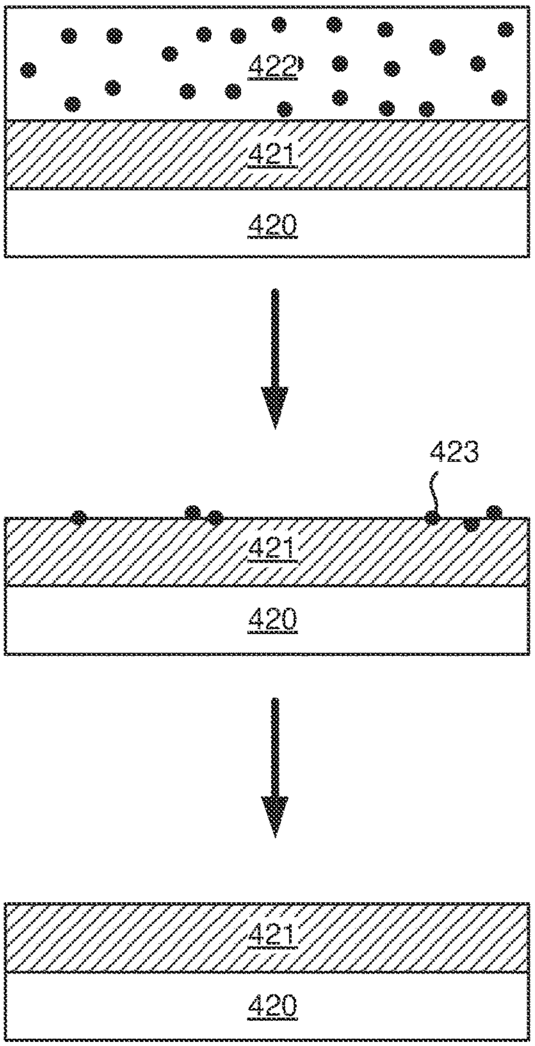

FIG. 4C shows a schematic illustration of various stages of metal-containing photoresist removal in a third implementation (case 3). In this implementation, a substrate 420 is provided with an underlayer 421 and a metal-containing photoresist 422 disposed on the underlayer 421. The metal-containing photoresist 422 may be patterned or unpatterned. In some implementations, the metal-containing photoresist 422 includes an organo-metal oxide photoresist. In FIG. 4C, the metal-containing photoresist 422 is removed in a first step and the underlayer 421 is treated for removal of particles 423 in a second step. In one example, the metal-containing photoresist 422 may be removed using a first thermal process, where the first thermal process applies a temperature greater than about 50° C. or between about 60° C. and about 250° C. and uses an etch gas including a halide (e.g., hydrogen halide). Treatment of the underlayer 421 may remove particles 423 such as residual halides, residual metal atoms or metal oxide particles, or other residual contaminants. Such treatment may involve a second thermal process, where the second thermal process applies a temperature greater than about 50° C. or between about 60° C. and about 250° C. and uses a treatment gas such as an oxidizing agent or a reducing agent. Or, such treatment may involve a plasma process, where the plasma process exposes the surface of the underlayer 421 to ions and/or radicals of an oxidizing agent or reducing agent. For instance, the surface of the underlayer 421 may be exposed to a $CO_2$ plasma. Alternatively, such treatment may involve a wet process, where the wet process exposes the surface of the underlayer 421 to at least an inorganic acidic solution such as dHF, which may optionally be followed by another inorganic acidic solution such as dHCl or a cleaning solution such as SC-1. The treatment may refresh the surface of the underlayer 421 for subsequent photolithographic processes to be repeated. In another example, the metal-containing photoresist 422 may be removed using a wet process and treated using a wet process. Specifically, the metal-containing photoresist 422 may be removed using an inorganic acidic solution such as dHF, and the particles 423 may be removed during treatment using another inorganic acidic solution such as dHCl or a cleaning solution such as SC-1.

Figure 4D:
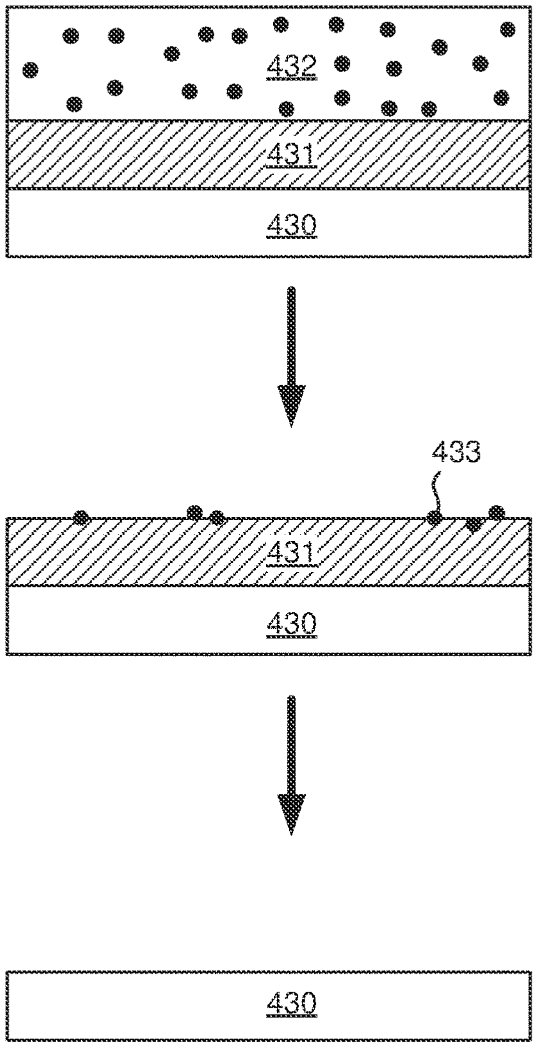

FIG. 4D shows a schematic illustration of various stages of metal-containing photoresist removal in a fourth implementation (case 4). In this implementation, a substrate 430 is provided with an underlayer 431 and a metal-containing photoresist 432 disposed on the underlayer 431. The metal-containing photoresist 432 may be patterned or unpatterned. In some implementations, the metal-containing photoresist 432 includes an organo-metal oxide photoresist. In FIG. 4D, the metal-containing photoresist 432 is removed in a first step and the underlayer 431 and residual particles 433 are removed in a second step. In one example, the metal-containing photoresist 432 may be removed using a first thermal process, where the first thermal process applies a temperature greater than about 50° C. or between about 60° C. and about 250° C. and uses an etch gas including a halide (e.g., hydrogen halide). Removal of the underlayer 431 and the residual particles 433 may involve a second thermal process, where the second thermal process applies a temperature greater than about 50° C. or between about 60° C. and about 250° C. and uses a removal gas such as an oxidizing agent or a reducing agent. Or, removal of the underlayer 431 and the residual particles 433 may involve a plasma process, where the plasma process exposes the surface of the underlayer 431 to ions and/or radicals of an oxidizing agent or reducing agent. Alternatively, removal of the underlayer 431 and the residual particles 433 may involve a wet process, where the wet process exposes the surface of the underlayer 431 to at least an inorganic acidic solution such as dHF, which may optionally be followed by another inorganic acidic solution such as dHCl or a cleaning solution such as SC-1. In another example, the metal-containing photoresist 432 may be removed using a wet process and the underlayer 431 and the residual particles 433 are removed using a wet process. In particular, the metal-containing photoresist 432 may be removed using an inorganic acidic solution such as dHF, and the underlayer 431 and the residual particles 433 may be removed using another inorganic acidic solution such as dHCl or a cleaning solution such as SC-1.

Figure 4E:
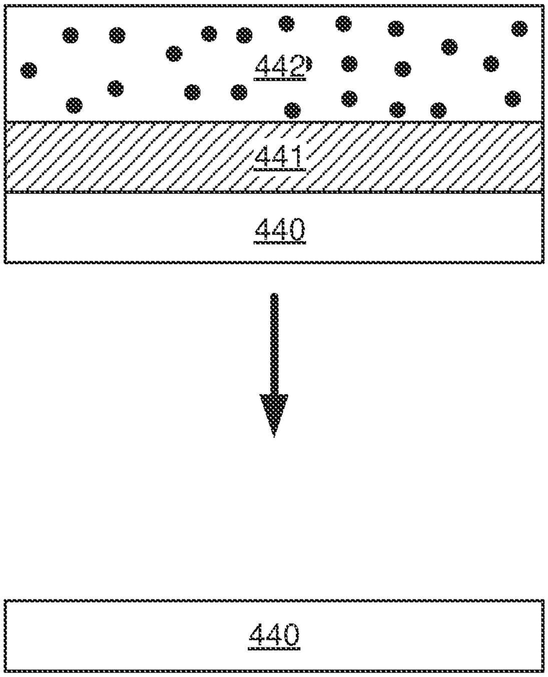

FIG. 4E shows a schematic illustration of various stages of metal-containing photoresist removal in a fifth implementation (case 5). In this implementation, a substrate 440 is provided with an underlayer 441 and a metal-containing photoresist 442 disposed on the underlayer 441. The metal-containing photoresist 442 may be patterned or unpatterned. In some implementations, the metal-containing photoresist 442 includes an organo-metal oxide photoresist. In FIG. 4E, the metal-containing photoresist 442 and the underlayer 441 are removed together. The photoresist rework is unselective to the metal-containing photoresist 442 and the underlayer 441. In one example, the metal-containing photoresist 442 and the underlayer 441 are removed using thermal process, where the thermal process applies a temperature greater than about 50° C. or between about 60° C. and about 250° C. and uses an etch gas including a halide (e.g., hydrogen halide). In another example, the metal-containing photoresist 442 and the underlayer 441 are removed using a wet process, where the wet process may apply at least an inorganic acidic solution. In some implementations, the wet process may apply an inorganic acidic solution such as dHF, which may be optionally followed by another inorganic acidic solution such as dHCl or a cleaning solution such as SC-1.

Figure 4F:
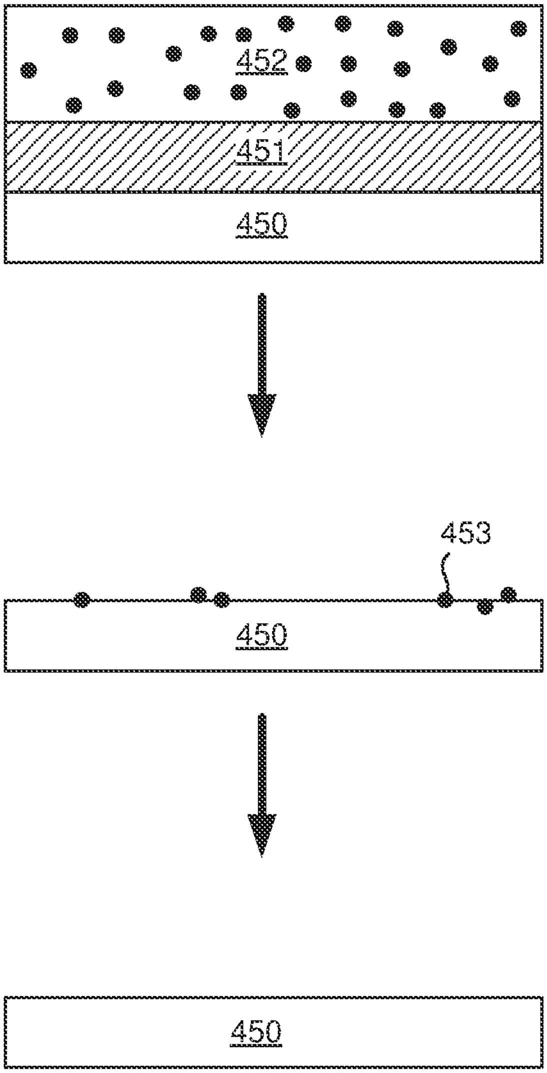

FIG. 4F shows a schematic illustration of various stages of metal-containing photoresist removal in a fifth implementation (case 6). In this implementation, a substrate 450 is provided with an underlayer 451 and a metal-containing photoresist 452 disposed on the underlayer 451. The metal-containing photoresist 452 may be patterned or unpatterned. In some implementations, the metal-containing photoresist 452 includes an organo-metal oxide photoresist. In FIG. 4F, the metal-containing photoresist 442 and the underlayer 441 are removed together in a first step and residual particles 453 on the substrate 450 are removed in a second step. In the first step, the photoresist rework is unselective to the metal-containing photoresist 452 and the underlayer 451. In one example, the metal-containing photoresist 452 and the underlayer 451 are removed using a first thermal process, where the first thermal process applies a temperature greater than about 50° C. or between about 60° C. and about 250° C. and uses an etch gas including a halide (e.g., hydrogen halide). In another example, the metal-containing photoresist 452 and the underlayer 451 are removed using a wet process, where the wet process may apply at least an inorganic acidic solution. In some implementations, the wet process may apply an inorganic acidic solution such as dHF, which may be optionally followed by another inorganic acidic solution such as dHCl or a cleaning solution such as SC-1. In the second step, treatment of the substrate 450 occurs that removes the residual particles 453. In one example, such treatment may involve applying a second thermal process, where the second thermal process applies a temperature greater than about 50° C. or between about 60° C. and about 250° C. and uses a treatment gas such as an oxidizing agent or a reducing agent. In another example, such treatment may involve applying a plasma process, where the plasma process exposes the surface of the substrate 450 to ions and/or radicals of an oxidizing agent or reducing agent. The treatment may refresh the surface of the substrate 450 for subsequent photolithographic processes to be repeated.

Figure 5A:
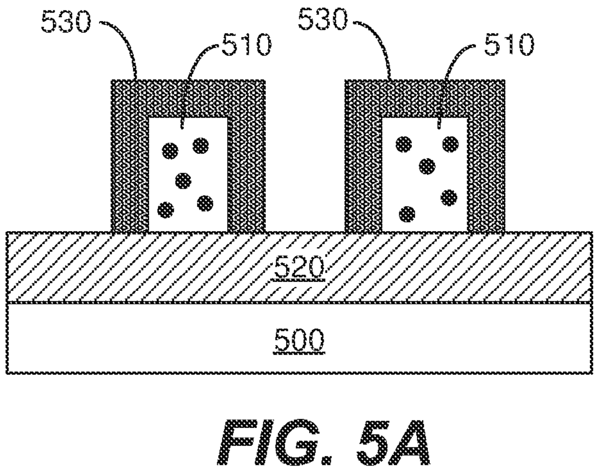
FIGS. 5A-5C show cross-sectional schematic illustrations of various stages of metal-containing resist removal and multiple patterning according to some implementations.
Figure 5B:
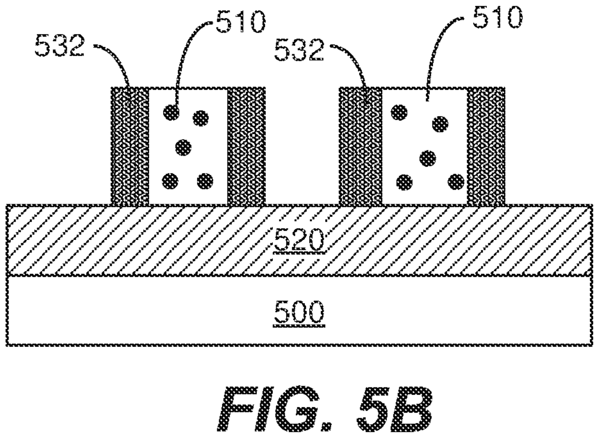
Figure 5C:
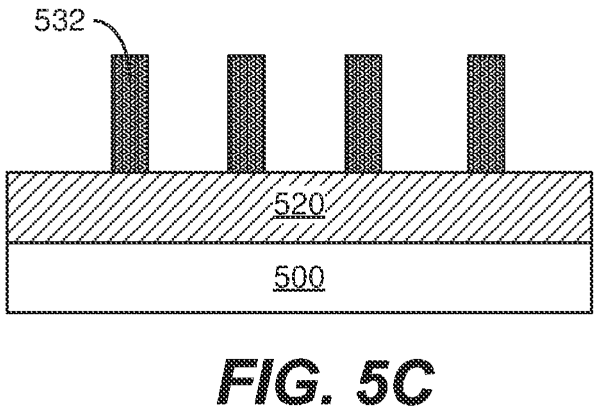

FIGS. 5A-5C show cross-sectional schematic illustrations of various stages of metal-containing resist removal and multiple patterning according to some implementations. Double patterning and quad patterning are example technologies used to extend lithographic patterning technology beyond its optical limits.

FIG. 5A shows a substrate 500 having a lithographically defined or patterned core 510 on a first material layer 520. One of ordinary skill in the art will appreciate that a multi-layer stack suitable for semiconductor processing may be underlying the first material layer 520. The patterned core 510 may include a photoresist material such as a metal-containing photoresist material. For example, the patterned core 510 may include an organo-metal oxide photoresist material. A conformal film 530 may be formed over the patterned core 510. In some embodiments, the conformal film 530 may be deposited by atomic layer deposition (ALD). In some embodiments, the conformal film 530 may be an oxide such as silicon oxide ($SiO_2$) or a nitride such as silicon nitride (SiN).

In FIG. 5B, the conformal film 530 is directionally etched or planarized to expose a top surface of the patterned core 510. Portions of the conformal film 530 are removed to form spacers 532 along sidewalls of the patterned core 510. The pattern of the spacers 532 are used to pattern subsequent layers. It will be understood that the spacers 532 refer to mask material adjacent to the patterned core 510.

In FIG. 5C, the patterned core 510 is selectively removed. Removal of the patterned core 510 may occur using a thermal process as described in the present disclosure or using a wet process as described in the present disclosure. In some implementations, the patterned core 510 is selectively removed by applying a temperature greater than about 50° C. or between about 60° C. and about 250° C. and an etch gas including a halide (e.g., hydrogen halide). In some implementations, the patterned core 510 is selectively removed by applying at least an inorganic acidic solution such as a combination of dHF and dHCl or a combination of dHF and a cleaning solution such as SC-1. Selective removal of the patterned core 510 leaves free-standing spacers 532 on the first material layer 520. The free-standing spacers 532 may serve as a mask for etching the first material layer 520. Thus, the photoresist rework of the present disclosure may be utilized in multiple patterning technologies.

Figure 6A:
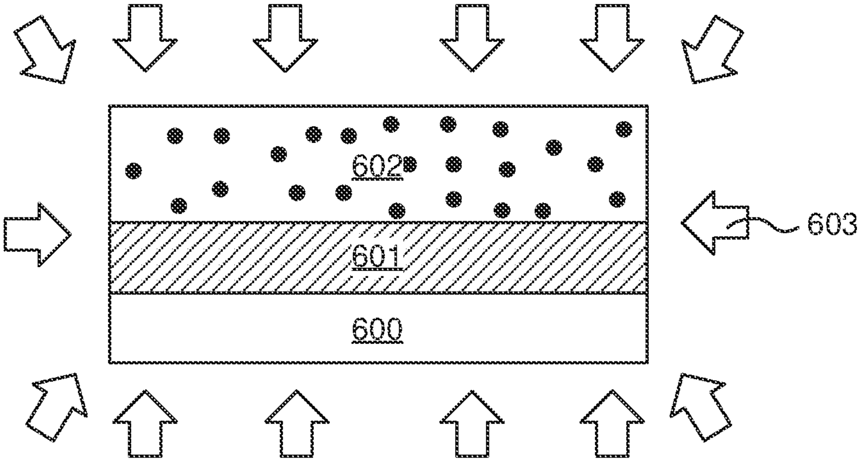
FIGS. 6A-6C show cross-sectional schematic illustrations of various stages of metal-containing photoresist removal using a wet technique according to some implementations.
Figure 6B:
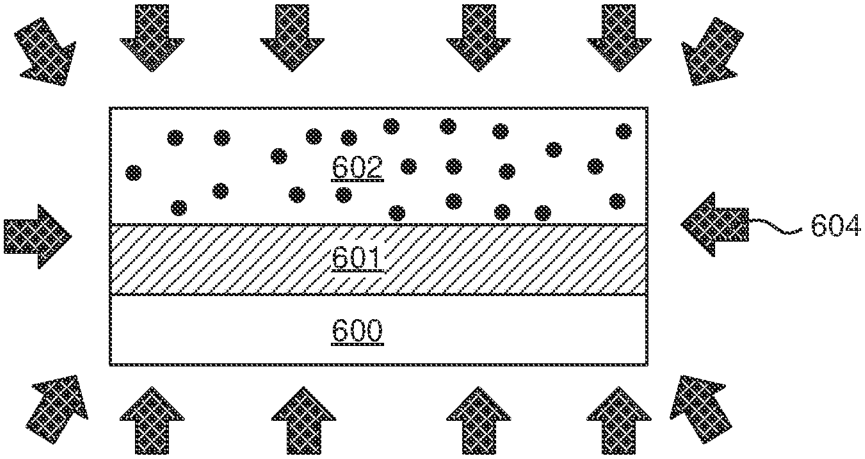
Figure 6C:
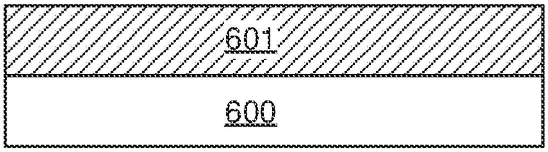

FIGS. 6A-6C show cross-sectional schematic illustrations of various stages of metal-containing photoresist removal using a wet technique according to some implementations. A substrate 600 is provided with an underlayer 601 and a metal-containing photoresist 602 disposed on the underlayer 601. The metal-containing photoresist 602 may be patterned or unpatterned. In some implementations, the metal-containing photoresist 602 includes an organo-metal oxide photoresist. In a wet process, removal of the metal-containing photoresist 602 may proceed in a multi-step sequential manner. In FIG. 6A, a first inorganic acidic solution 603 such as dHF is applied to both a frontside and a backside of the substrate 600. The first inorganic acidic solution may be 10:1 dHF and may be applied for a duration between about 30 seconds and about 600 seconds, or between about 60 seconds and about 300 seconds. In FIG. 6B, a second inorganic acidic solution 604 such as dHCl or a cleaning solution 604 such as SC-1 is applied to both the frontside and the backside of the substrate 600. The second inorganic acidic solution may be 10:1 dHCl and may be applied for a duration between about 30 seconds and about 600 seconds, or between about 60 seconds and about 300 seconds after applying the first inorganic acidic solution. In FIG. 6C, the metal-containing photoresist 602 is selectively removed from the substrate 600 after completion of the wet process. The underlayer 601 may remain on the substrate 600. A residual amount of metal atoms at the surface of the substrate 600 may be less than about $1\times10^{10}$ atoms/cm$^2$.

While this disclosure frequently refers to the removal of EUV-sensitive films that have been exposed and/or developed, the removal processes described can be extended to films of similar composition (e.g., other $MO_xR_y$-based films), for example, other films containing a metal oxide or organometallic film. In some implementations, films other than EUV resists can be removed by this method, for example hard masks, UV resists or films of similar composition having other applications; in this respect, the described removal process relates to the film's chemical composition, as opposed to its function.

Apparatus

An apparatus of the present disclosure is configured for photoresist rework of metal-containing photoresist. The apparatus may be configured for other processing operations such as deposition, bevel and backside cleaning, post-application baking, EUV scanning, post-exposure baking, development, descum, smoothing, curing, and other operations. In some implementations, the apparatus is configured to perform multiple dry operations. In some implementations, the apparatus is configured to perform a combination of wet and dry operations. The apparatus may include a single wafer chamber or multiple stations in the same process chamber. With multiple stations in the same process chamber, various processing operations such as those described in the present disclosure may be performed in different stations in the same process chamber.

The apparatus configured for photoresist rework of metal-containing photoresist includes a process chamber with a substrate support. The apparatus may include an etch gas line coupled to the process chamber for delivery of etch gas. In some implementations, the etch gas includes a halide such as a hydrogen halide. The apparatus may include one or more heaters for temperature control. Such heaters may be provided in the process chamber and/or in the substrate support. Or, such heaters may be provided outside the process chamber. The apparatus may further include one or more sensors for sensing particle count, wafer count, thickness count, or other parameters for triggering an endpoint of the photoresist rework.

In some implementations, the process chamber is made of an inexpensive material such as plastic. In some other implementations, the process chamber is made of a metal such as anodized aluminum or a ceramic such as aluminum oxide.

Figure 7:
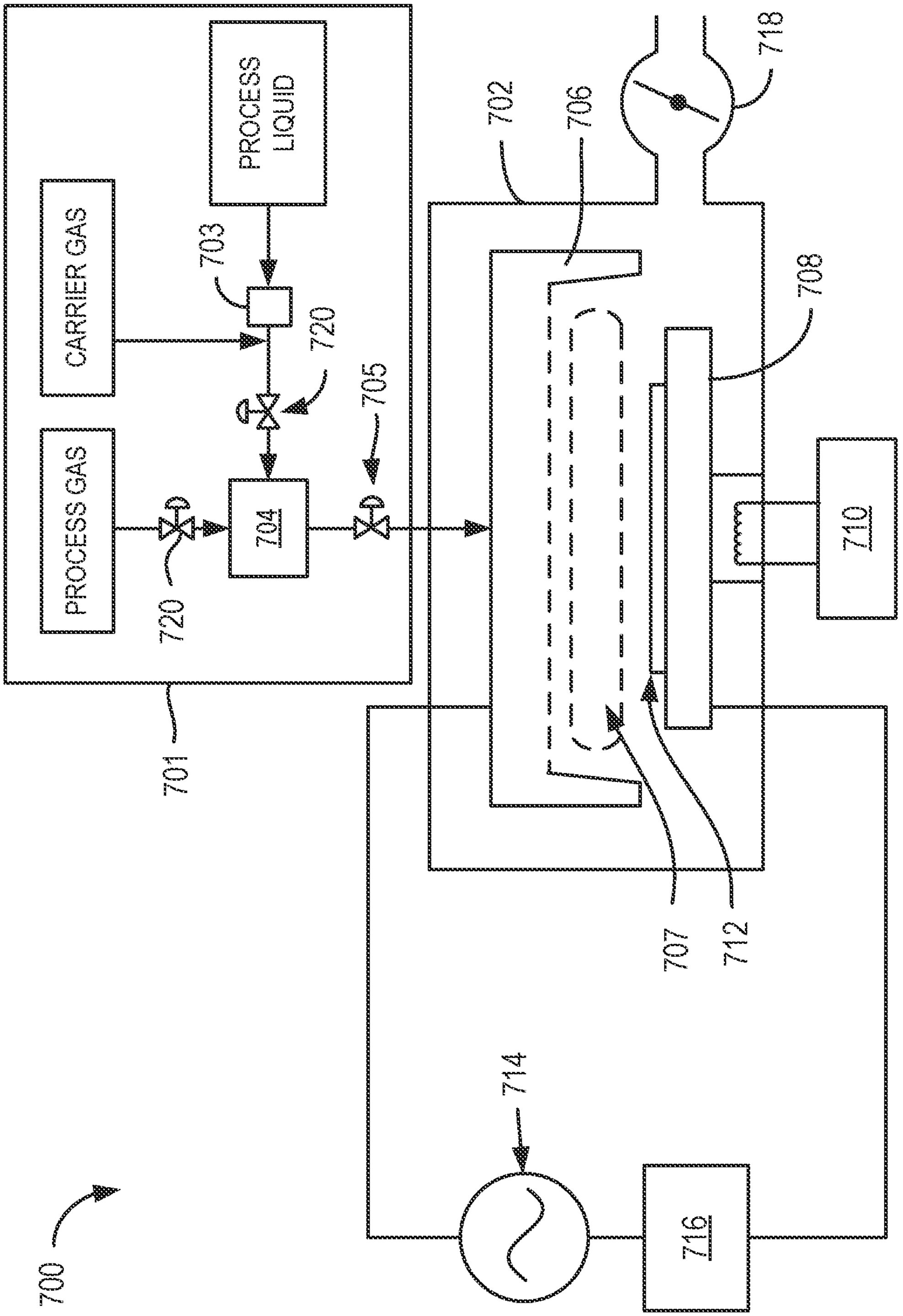
FIG. 7 depicts a schematic illustration of an example process station that is suitable for performing rework operations according to some implementations.
Figure 8:
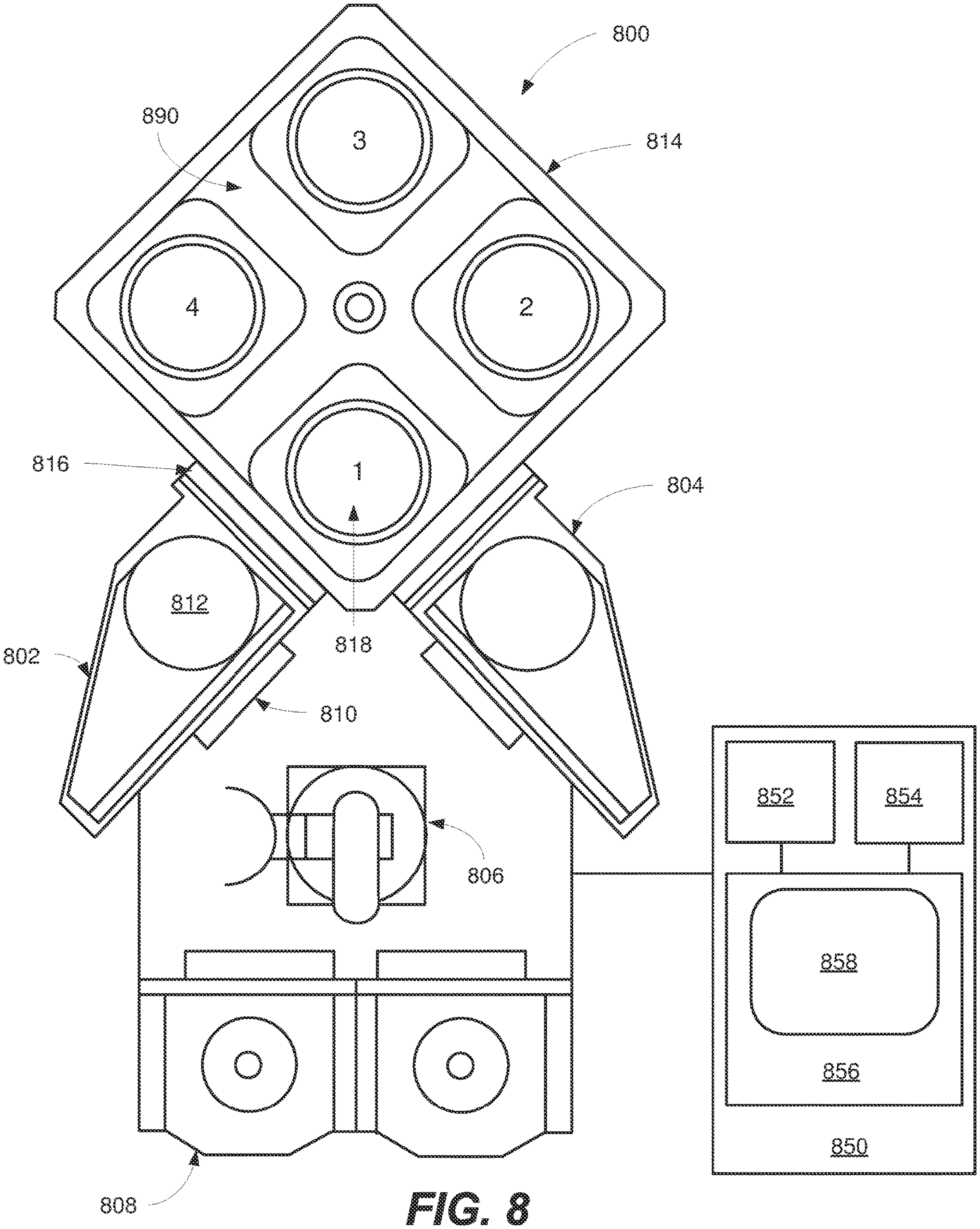
FIG. 8 depicts a schematic illustration of an example multi-station processing tool suitable for implementation of various development, clean, rework, descum, and smoothing operations described herein.

FIG. 7 depicts a schematic illustration of an example process station that is suitable for performing rework or other operations according to some implementations. A plurality of process stations 700 may be included in a common low-pressure process tool environment. For example, FIG. 8 depicts an implementation of a multi-station processing tool 800, such as a VECTOR® processing tool available from Lam Research Corporation, Fremont, CA. In some implementations, one or more hardware parameters of the process tool 800 including those discussed in detail below may be adjusted programmatically by one or more computer controllers 850.

A process station may be configured as a module in a cluster tool. FIG. 10 depicts a semiconductor process cluster tool architecture with vacuum-integrated deposition and patterning modules suitable for implementation of the implementations described herein. Such a cluster process tool architecture can include resist deposition, resist exposure (EUV scanner), resist development, resist rework, and etch modules, as described above and further below with reference to FIGS. 9 and 10.

Returning to FIG. 7, process station 700 fluidly communicates with reactant delivery system 701*a* for delivering process gases to a distribution showerhead 706. Reactant delivery system 701*a* optionally includes a mixing vessel 704 for blending and/or conditioning process gases, for delivery to showerhead 706. One or more mixing vessel inlet valves 720 may control introduction of process gases to mixing vessel 704. Where plasma exposure is used, plasma may also be delivered to the showerhead 706 or may be generated in the process station 700. As noted above, in at least some implementations, non-plasma thermal exposure is favored.

FIG. 7 includes an optional vaporization point 703 for vaporizing liquid reactant to be supplied to the mixing vessel 704. In some implementations, a liquid flow controller (LFC) upstream of vaporization point 703 may be provided for controlling a mass flow of liquid for vaporization and delivery to process station 700. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM.

Showerhead 706 distributes process gases toward substrate 712. In the implementation shown in FIG. 7, the substrate 712 is located beneath showerhead 706 and is shown resting on a pedestal 708. Showerhead 706 may have any suitable shape, and may have any suitable number and arrangement of ports for distributing process gases to substrate 712.

In some implementations, pedestal 708 may be raised or lowered to expose substrate 712 to a volume between the substrate 712 and the showerhead 706. It will be appreciated that, in some implementations, pedestal height may be adjusted programmatically by a suitable computer controller 750. In some implementations, the showerhead 706 may have multiple plenum volumes with multiple temperature controls.

In some implementations, pedestal 708 may be temperature controlled via heater 710. In some implementations, the pedestal 708 may be heated to a temperature of greater than 0° C. and up to 300° C., for example 60° C. to 250° C., such as about 80° C. to 200° C., during non-plasma thermal exposure of a metal-containing resist to halide or organic vapor chemistry, as described in disclosed implementations. In some implementations, the heater 710 of the pedestal 708 may include a plurality of independently controllable temperature control zones.

Further, in some implementations, pressure control for process station 700 may be provided by a butterfly valve 718. As shown in the implementation of FIG. 7, butterfly valve 718 throttles a vacuum provided by a downstream vacuum pump (not shown). However, in some implementations, pressure control of process station 700 may also be adjusted by varying a flow rate of one or more gases introduced to the process station 700.

In some implementations, a position of showerhead 706 may be adjusted relative to pedestal 708 to vary a volume between the substrate 712 and the showerhead 706. Further, it will be appreciated that a vertical position of pedestal 708 and/or showerhead 706 may be varied by any suitable mechanism within the scope of the present disclosure. In some implementations, pedestal 708 may include a rotational axis for rotating an orientation of substrate 712. It will be appreciated that, in some implementations, one or more of these example adjustments may be performed programmatically by one or more suitable computer controllers 750.

Where plasma may be used, for example in descumming, treatment, or smoothing operations, showerhead 706 and pedestal 708 electrically communicate with a radio frequency (RF) power supply 714 and matching network 716 for powering a plasma. In some implementations, the plasma energy may be controlled by controlling one or more of a process station pressure, a gas concentration, an RF source power, an RF source frequency, and a plasma power pulse timing. For example, RF power supply 714 and matching network 716 may be operated at any suitable power to form a plasma having a desired composition of radical species. Examples of suitable powers are up to about 500 W.

In some implementations, instructions for a controller 750 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some implementations, instructions for setting one or more reactor parameters may be included in a recipe phase. For example, a recipe phase may include instructions for setting a flow rate of an etch gas, such as a hydrogen halide, and time delay instructions for the recipe phase. In some implementations, the controller 750 may include any of the features described below with respect to system controller 850 of FIG. 8.

As described above, one or more process stations may be included in a multi-station processing tool. FIG. 8 shows a schematic view of an implementation of a multi-station processing tool 800 with an inbound load lock 802 and an outbound load lock 804, either or both of which may include a remote plasma source. A robot 806 at atmospheric pressure is configured to move wafers from a cassette loaded through a pod 808 into inbound load lock 802 via an atmospheric port 810. A wafer is placed by the robot 806 on a pedestal 812 in the inbound load lock 802, the atmospheric port 810 is closed, and the load lock is pumped down.

Where the inbound load lock 802 includes a remote plasma source, the wafer may be exposed to a remote plasma treatment to treat the substrate surface in the load lock prior to being introduced into a processing chamber 814. Further, the wafer also may be heated in the inbound load lock 802 as well, for example, to remove moisture and adsorbed gases. Next, a chamber transport port 816 to processing chamber 814 is opened, and another robot (not shown) places the wafer into the reactor on a pedestal of a first station shown in the reactor for processing. While the implementation depicted in FIG. 8 includes load locks, it will be appreciated that, in some implementations, direct entry of a wafer into a process station may be provided.

The depicted processing chamber 814 includes four process stations, numbered from 1 to 4 in the implementation shown in FIG. 8. Each station has a heated pedestal (shown at 818 for station 1), and gas line inlets. It will be appreciated that in some implementations, each process station may have different or multiple purposes. For example, in some implementations, a process station may be switchable between development and etch process modes. Additionally or alternatively, in some implementations, processing chamber 814 may include one or more matched pairs of development and etch process stations. While the depicted processing chamber 814 includes four stations, it will be understood that a processing chamber according to the present disclosure may have any suitable number of stations. For example, in some implementations, a processing chamber may have five or more stations, while in other implementations a processing chamber may have three or fewer stations.

FIG. 8 depicts an implementation of a wafer handling system 890 for transferring wafers within processing chamber 814. In some implementations, wafer handling system 890 may transfer wafers between various process stations and/or between a process station and a load lock. It will be appreciated that any suitable wafer handling system may be employed. Non-limiting examples include wafer carousels and wafer handling robots. FIG. 8 also depicts an implementation of a system controller 850 employed to control process conditions and hardware states of process tool 800. System controller 850 may include one or more memory devices 856, one or more mass storage devices 854, and one or more processors 852. Processor 852 may include a CPU or computer, analog, and/or digital input/output connections, stepper motor controller boards, etc.

In some implementations, system controller 850 controls all of the activities of process tool 800. System controller 850 executes system control software 858 stored in mass storage device 854, loaded into memory device 856, and executed on processor 852. Alternatively, the control logic may be hard coded in the controller 850. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 858 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 800. System control software 858 may be configured in any suitable way. For example, various process tool component subroutines or control objects may be written to control operation of the process tool components used to carry out various process tool processes. System control software 858 may be coded in any suitable computer readable programming language.

In some implementations, system control software 858 may include input/output control (IOC) sequencing instructions for controlling the various parameters described above. Other computer software and/or programs stored on mass storage device 854 and/or memory device 856 associated with system controller 850 may be employed in some implementations. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 818 and to control the spacing between the substrate and other parts of process tool 800.

A process gas control program may include code for controlling organic vapor composition (e.g., trifluoroacetic acid as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the implementations herein.

A pressure control program may include code for maintaining the pressure in the reaction chamber in accordance with the implementations herein.

In some implementations, there may be a user interface associated with system controller 850. The user interface may include a display screen, graphical software displays of the apparatus and/or process conditions, and user input devices such as pointing devices, keyboards, touch screens, microphones, etc.

In some implementations, parameters adjusted by system controller 850 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 850 from various process tool sensors. The signals for controlling the process may be output on the analog and digital output connections of process tool 800. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 850 may provide program instructions for implementing the above-described deposition processes. The program instructions may control a variety of process parameters, such as DC power level, RF bias power level, pressure, temperature, etc. The instructions may control the parameters to operate development, clean, and/or etch processes according to various implementations described herein.

The system controller 850 will typically include one or more memory devices and one or more processors configured to execute the instructions so that the apparatus will perform a method in accordance with disclosed implementations. Machine-readable media containing instructions for controlling process operations in accordance with disclosed implementations may be coupled to the system controller 850.

In some implementations, the system controller 850 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 850, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 850 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 850 in the form of various individual settings (or program files), defining operational parameters for carrying out a particular process on or for a semiconductor wafer or to a system. The operational parameters may, in some implementations, be part of a recipe defined by process engineers to accomplish one or more processing steps during the fabrication of one or more layers, materials, metals, oxides, silicon, silicon dioxide, surfaces, circuits, and/or dies of a wafer.

The system controller 850, in some implementations, may be a part of or coupled to a computer that is integrated with, coupled to the system, otherwise networked to the system, or a combination thereof. For example, the system controller 850 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 850 receives instructions in the form of data, which specify parameters for each of the processing steps to be performed during one or more operations. It should be understood that the parameters may be specific to the type of process to be performed and the type of tool that the system controller 850 is configured to interface with or control. Thus as described above, the system controller 850 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, an EUV lithography chamber (scanner) or module, a development chamber or module, and any other semiconductor processing systems that may be associated or used in the fabrication and/or manufacturing of semiconductor wafers.

As noted above, depending on the process step or steps to be performed by the tool, the system controller 850 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

ICP reactors which, in certain implementations, may be suitable for etch operations suitable for implementation of some implementations, are now described. Although ICP reactors are described herein, in some implementations, it should be understood that capacitively coupled plasma reactors may also be used.

Figure 9:
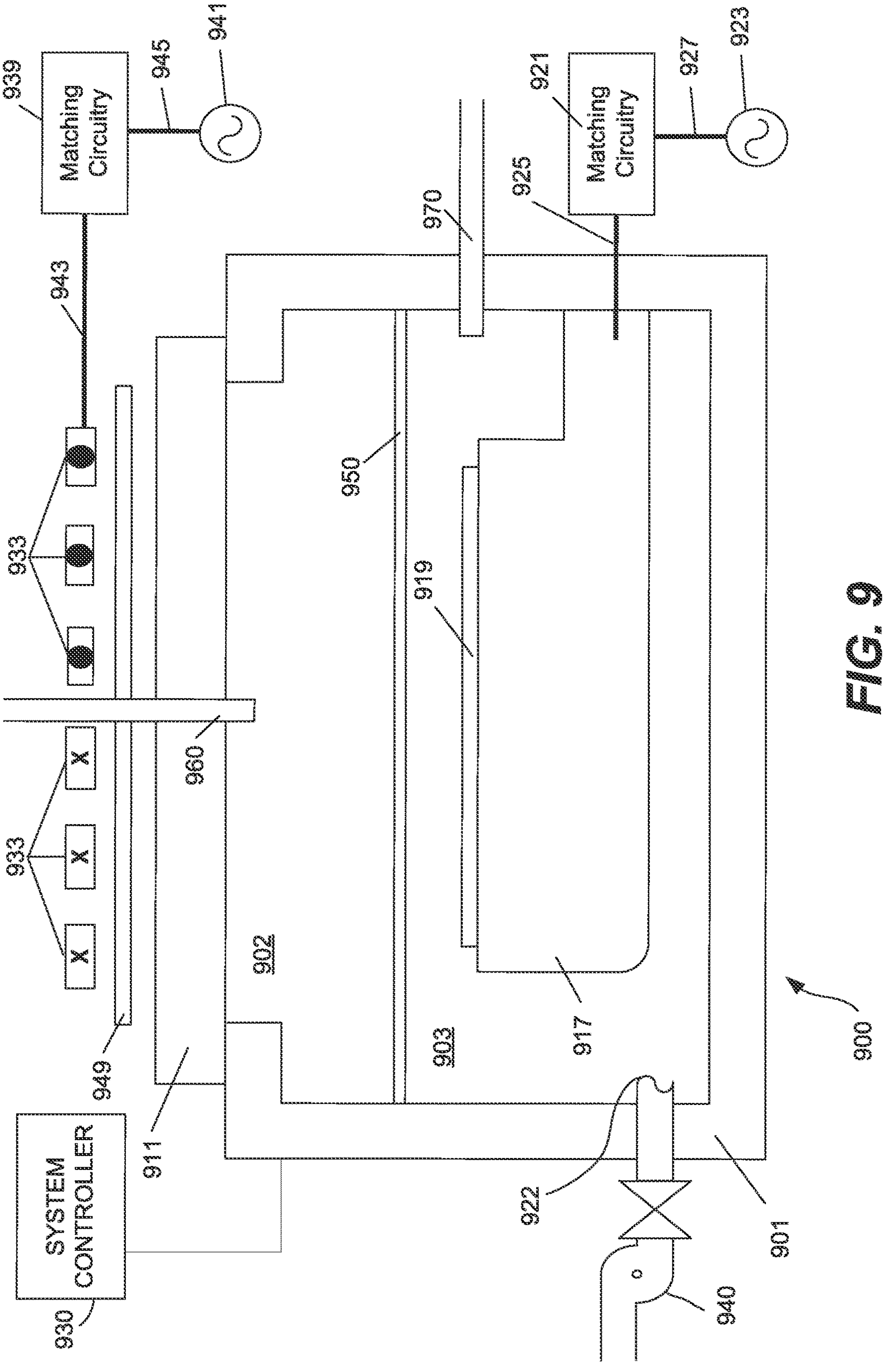
FIG. 9 shows a cross-sectional schematic view of an example inductively-coupled plasma apparatus for implementing certain implementations and operations described herein.
Figure 10:
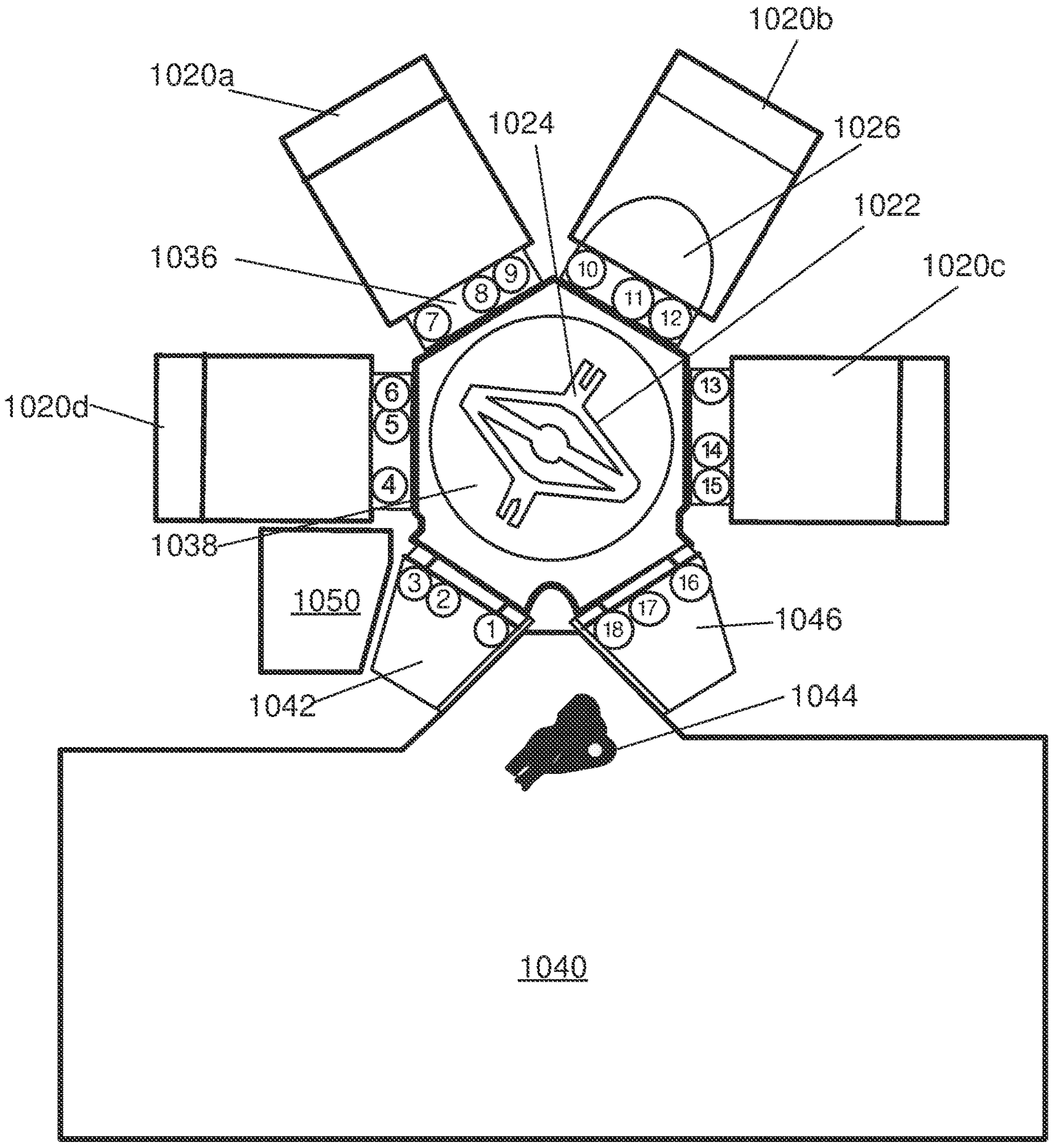
FIG. 10 depicts a semiconductor process cluster tool architecture with vacuum-integrated deposition and patterning modules that interface with a vacuum transfer module, suitable for implementations of processes described herein.

FIG. 9 schematically shows a cross-sectional view of an inductively coupled plasma apparatus 900 appropriate for implementing certain implementations or aspects of implementations such as dry development, clean, and/or etch, an example of which is a Kiyo® reactor, produced by Lam Research Corp. of Fremont, CA. In other implementations, other tools or tool types having the functionality to conduct the dry development, clean, and/or etch processes described herein may be used for implementation.

The inductively coupled plasma apparatus 900 includes an overall process chamber 924 structurally defined by chamber walls 901 and a window 911. The chamber walls 901 may be fabricated from stainless steel, aluminum, or plastic. The window 911 may be fabricated from quartz or other dielectric material. An optional internal plasma grid 950 divides the overall process chamber into an upper sub-chamber 902 and a lower sub chamber 903. In most implementations, plasma grid 950 may be removed, thereby utilizing a chamber space made of sub chambers 902 and 903. A chuck 917 is positioned within the lower sub-chamber 903 near the bottom inner surface. The chuck 917 is configured to receive and hold a semiconductor wafer 919 upon which the etching and deposition processes are performed. The chuck 917 can be an electrostatic chuck for supporting the wafer 919 when present. In some implementations, an edge ring (not shown) surrounds chuck 917, and has an upper surface that is approximately planar with atop surface of the wafer 919, when present over chuck 917. The chuck 917 also includes electrostatic electrodes for chucking and dechucking the wafer 919. A filter and DC clamp power supply (not shown) may be provided for this purpose. Other control systems for lifting the wafer 919 off the chuck 917 can also be provided. The chuck 917 can be electrically charged using an RF power supply 923. The RF power supply 923 is connected to matching circuitry 921 through a connection 927. The matching circuitry 921 is connected to the chuck 917 through a connection 925. In this manner, the RF power supply 923 is connected to the chuck 917. In various implementations, a bias power of the electrostatic chuck may be set at about 50 V or may be set at a different bias power depending on the process performed in accordance with disclosed implementations. For example, the bias power may be between about 20 Vb and about 100 V, or between about 30 V and about 150 V.

Elements for plasma generation include a coil 933 is positioned above window 911. In some implementations, a coil is not used in disclosed implementations. The coil 933 is fabricated from an electrically conductive material and includes at least one complete turn. The example of a coil 933 shown in FIG. 9 includes three turns. The cross sections of coil 933 are shown with symbols, and coils having an "X" extend rotationally into the page, while coils having a "•" extend rotationally out of the page. Elements for plasma generation also include an RF power supply 941 configured to supply RF power to the coil 933. In general, the RF power supply 941 is connected to matching circuitry 939 through a connection 945. The matching circuitry 939 is connected to the coil 933 through a connection 943. In this manner, the RF power supply 941 is connected to the coil 933. An optional Faraday shield 949*a* is positioned between the coil 933 and the window 911. The Faraday shield 949*a* may be maintained in a spaced apart relationship relative to the coil 933. In some implementations, the Faraday shield 949*a* is disposed immediately above the window 911. In some implementations, the Faraday shield 949*b* is between the window 911 and the chuck 917. In some implementations, the Faraday shield 949*b* is not maintained in a spaced apart relationship relative to the coil 933. For example, the Faraday shield 949*b* may be directly below the window 911 without a gap. The coil 933, the Faraday shield 949*a*, and the window 911 are each configured to be substantially parallel to one another. The Faraday shield 949*a* may prevent metal or other species from depositing on the window 911 of the process chamber 924.

Process gases may be flowed into the process chamber through one or more main gas flow inlets 960 positioned in the upper sub-chamber 902 and/or through one or more side gas flow inlets 970. Likewise, though not explicitly shown, similar gas flow inlets may be used to supply process gases to a capacitively coupled plasma processing chamber. A vacuum pump, e.g., a one or two stage mechanical dry pump and/or turbomolecular pump 940, may be used to draw process gases out of the process chamber 924 and to maintain a pressure within the process chamber 924. For example, the vacuum pump may be used to evacuate the lower sub-chamber 903 during a purge operation. A valve-controlled conduit may be used to fluidically connect the vacuum pump to the process chamber 924 so as to selectively control application of the vacuum environment provided by the vacuum pump. This may be done employing a closed loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus 900, one or more process gases may be supplied through the gas flow inlets 960 and/or 970. In certain implementations, process gas may be supplied only through the main gas flow inlet 960, or only through the side gas flow inlet 970. In some cases, the gas flow inlets shown in the figure may be replaced by more complex gas flow inlets, one or more showerheads, for example. The Faraday shield 949*a* and/or optional grid 950 may include internal channels and holes that allow delivery of process gases to the process chamber 924. Either or both of Faraday shield 949*a* and optional grid 950 may serve as a showerhead for delivery of process gases. In some implementations, a liquid vaporization and delivery system may be situated upstream of the process chamber 924, such that once a liquid reactant or precursor is vaporized, the vaporized reactant or precursor is introduced into the process chamber 924 via a gas flow inlet 960 and/or 970.

Radio frequency power is supplied from the RF power supply 941 to the coil 933 to cause an RF current to flow through the coil 933. The RF current flowing through the coil 533 generates an electromagnetic field about the coil 933. The electromagnetic field generates an inductive current within the upper sub-chamber 902. The physical and chemical interactions of various generated ions and radicals with the wafer 919 etch features of and selectively deposit layers on the wafer 919.

If the plasma grid 950 is used such that there is both an upper sub-chamber 902 and a lower sub-chamber 903, the inductive current acts on the gas present in the upper sub-chamber 902 to generate an electron-ion plasma in the upper sub-chamber 902. The optional internal plasma grid 950 limits the amount of hot electrons in the lower sub-chamber 903. In some implementations, the apparatus 900 is designed and operated such that the plasma present in the lower sub-chamber 903 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower sub-chamber 903 through port 922. The chuck 917 disclosed herein may operate at elevated temperatures ranging between about 10° C. and about 250° C. The temperature will depend on the process operation and specific recipe.

Apparatus 900 may be coupled to facilities (not shown) when installed in a clean room or a fabrication facility. Facilities include plumbing that provide processing gases, vacuum, temperature control, and environmental particle control. These facilities are coupled to apparatus 900, when installed in the target fabrication facility. Additionally, apparatus 900 may be coupled to a transfer chamber that allows robotics to transfer semiconductor wafers into and out of apparatus 900 using typical automation.

In some implementations, a system controller 930 (which may include one or more physical or logical controllers) controls some or all of the operations of a process chamber 924. The system controller 930 may include one or more memory devices and one or more processors. In some implementations, the apparatus 900 includes a switching system for controlling flow rates and durations when disclosed implementations are performed. In some implementations, the apparatus 900 may have a switching time of up to about 500 ms, or up to about 750 ms. Switching time may depend on the flow chemistry, recipe chosen, reactor architecture, and other factors.

In some implementations, the system controller 930 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be integrated into the system controller 930, which may control various components or subparts of the system or systems. The system controller 930, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 930 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some implementations, be part of a recipe defined by process engineers to accomplish one or more processing steps during the fabrication or removal of one or more layers, materials, metals, oxides, silicon, silicon dioxide, surfaces, circuits, and/or dies of a wafer.

The system controller 930, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 930 receives instructions in the form of data, which specify parameters for each of the processing steps to be performed during one or more operations. It should be understood that the parameters may be specific to the type of process to be performed and the type of tool that the controller is configured to interface with or control. Thus as described above, the system controller 930 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, an EUV lithography chamber (scanner) or module, a dry development chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

EUVL patterning may be conducted using any suitable tool, often referred to as a scanner, for example the TWINSCAN NXE: 3300B® platform supplied by ASML of Veldhoven, NL). The EUVL patterning tool may be a standalone device from which the substrate is moved into and out of for deposition and etching as described herein. Or, as described below, the EUVL patterning tool may be a module on a larger multi-component tool. FIG. 10 depicts a semiconductor process cluster tool architecture with vacuum-integrated deposition, EUV patterning and dry development/etch modules that interface with a vacuum transfer module, suitable for implementation of the processes described herein. While the processes may be conducted without such vacuum integrated apparatus, such apparatus may be advantageous in some implementations.

FIG. 10 depicts a semiconductor process cluster tool architecture with vacuum-integrated deposition and patterning modules that interface with a vacuum transfer module, suitable for implementations of processes described herein. The arrangement of transfer modules to "transfer" wafers among multiple storage facilities and processing modules may be referred to as a "cluster tool architecture" system. Deposition and patterning modules are vacuum-integrated, in accordance with the requirements of a particular process. Other modules, such as for etch, may also be included on the cluster.

A vacuum transport module (VTM) 1038 interfaces with four processing modules **1020*a*-1020*d*, which may be individually optimized to perform various fabrication processes. By way of example, processing modules 1020*a*-1020*d* may be implemented to perform deposition, evaporation, ELD, dry development, clean, etch, strip, and/or other semiconductor processes. For example, module 1020*a* may be an ALD reactor that may be operated to perform in a non-plasma, thermal atomic layer depositions as described herein, such as Vector tool, available from Lam Research Corporation, Fremont, CA. And module 1020***b* may be a PECVD tool, such as the Lam Vector®. It should be understood that the figure is not necessarily drawn to scale.

Airlocks 1042 and 1046, also known as a loadlocks or transfer modules, interface with the VTM 1038 and a patterning module 1040. For example, as noted above, a suitable patterning module may be the TWINSCAN NXE: 3300B® platform supplied by ASML of Veldhoven, NL). This tool architecture allows for work pieces, such as semiconductor substrates or wafers, to be transferred under vacuum so as not to react before exposure. Integration of the deposition modules with the lithography tool is facilitated by the fact that EUVL also requires a greatly reduced pressure given the strong optical absorption of the incident photons by ambient gases such as $H_2O$, $O_2$, etc.

As noted above, this integrated architecture is just one possible implementation of a tool for implementation of the described processes. The processes may also be implemented with a more conventional stand-alone EUVL scanner and a deposition reactor, such as a Lam Vector tool, either stand alone or integrated in a cluster architecture with other tools, such as etch, strip etc. (e.g., Lam Kiyo or Gamma tools), as modules, for example as described with reference to FIG. 10 but without the integrated patterning module.

Airlock 1042 may be an "outgoing" loadlock, referring to the transfer of a substrate out from the VTM 1038 serving a deposition module 1020*a* to the patterning module 1040, and airlock 1046 may be an "ingoing" loadlock, referring to the transfer of a substrate from the patterning module 1040 back in to the VTM 1038. The ingoing loadlock 1046 may also provide an interface to the exterior of the tool for access and egress of substrates. Each process module has a facet that interfaces the module to VTM 1038. For example, deposition process module 1020*a* has facet 1036. Inside each facet, sensors, for example, sensors 1-18 as shown, are used to detect the passing of wafer 1026 when moved between respective stations. Patterning module 1040 and airlocks 1042 and 1046 may be similarly equipped with additional facets and sensors, not shown.

Main VTM robot 1022 transfers wafer 1026 between modules, including airlocks 1042 and 1046. In one implementation, robot 1022 has one arm, and in another implementation, robot 1022 has two arms, where each arm has an end effector 1024 to pick wafers such as wafer 1026 for transport. Front-end robot 1044, in is used to transfer wafers 1026 from outgoing airlock 1042 into the patterning module 1040, from the patterning module 1040 into ingoing airlock 1046. Front-end robot 1044 may also transport wafers 1026 between the ingoing loadlock and the exterior of the tool for access and egress of substrates. Because ingoing airlock module 1046 has the ability to match the environment between atmospheric and vacuum, the wafer 1026 is able to move between the two pressure environments without being damaged.

It should be noted that an EUVL tool typically operates at a higher vacuum than a deposition tool. If this is the case, it is desirable to increase the vacuum environment of the substrate during the transfer between the deposition to the EUVL tool to allow the substrate to degas prior to entry into the patterning tool. Outgoing airlock 1042 may provide this function by holding the transferred wafers at a lower pressure, no higher than the pressure in the patterning module 1040, for a period of time and exhausting any off-gassing, so that the optics of the patterning module 1040 are not contaminated by off-gassing from the substrate. A suitable pressure for the outgoing, off-gassing airlock is no more than 1E−8 Torr.

In some implementations, a system controller 1050 (which may include one or more physical or logical controllers) controls some or all of the operations of the cluster tool and/or its separate modules. It should be noted that the controller can be local to the cluster architecture, or can be located external to the cluster architecture in the manufacturing floor, or in a remote location and connected to the cluster architecture via a network. The system controller 1050 may include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the controller or they may be provided over a network. In certain implementations, the system controller executes system control software.

The system control software may include instructions for controlling the timing of application and/or magnitude of any aspect of tool or module operation. System control software may be configured in any suitable way. For example, various process tool component subroutines or control objects may be written to control operations of the process tool components necessary to carry out various process tool processes. System control software may be coded in any suitable compute readable programming language. In some implementations, system control software includes input/output control (IOC) sequencing instructions for controlling the various parameters described above. For example, each phase of a semiconductor fabrication process may include one or more instructions for execution by the system controller. The instructions for setting process conditions for condensation, deposition, evaporation, patterning and/or etching phase may be included in a corresponding recipe phase, for example.

In various implementations, an apparatus for forming a negative pattern mask is provided. The apparatus may include a processing chamber for patterning, deposition and etch, and a controller including instructions for forming a negative pattern mask. The instructions may include code for, in the processing chamber, patterning a feature in a chemically amplified (CAR) resist on a semiconductor substrate by EUV exposure to expose a surface of the substrate, developing the photopatterned resist, and etching the underlying layer or layer stack using the patterned resist as a mask. Development may be performed using an organic vapor such as an organic acid.

It should be noted that the computer controlling the wafer movement can be local to the cluster architecture, or can be located external to the cluster architecture in the manufacturing floor, or in a remote location and connected to the cluster architecture via a network. A controller as described above with respect to any of FIG. 7, 8, or 9 may be implemented with the tool in FIG. 10.

Figure 11:
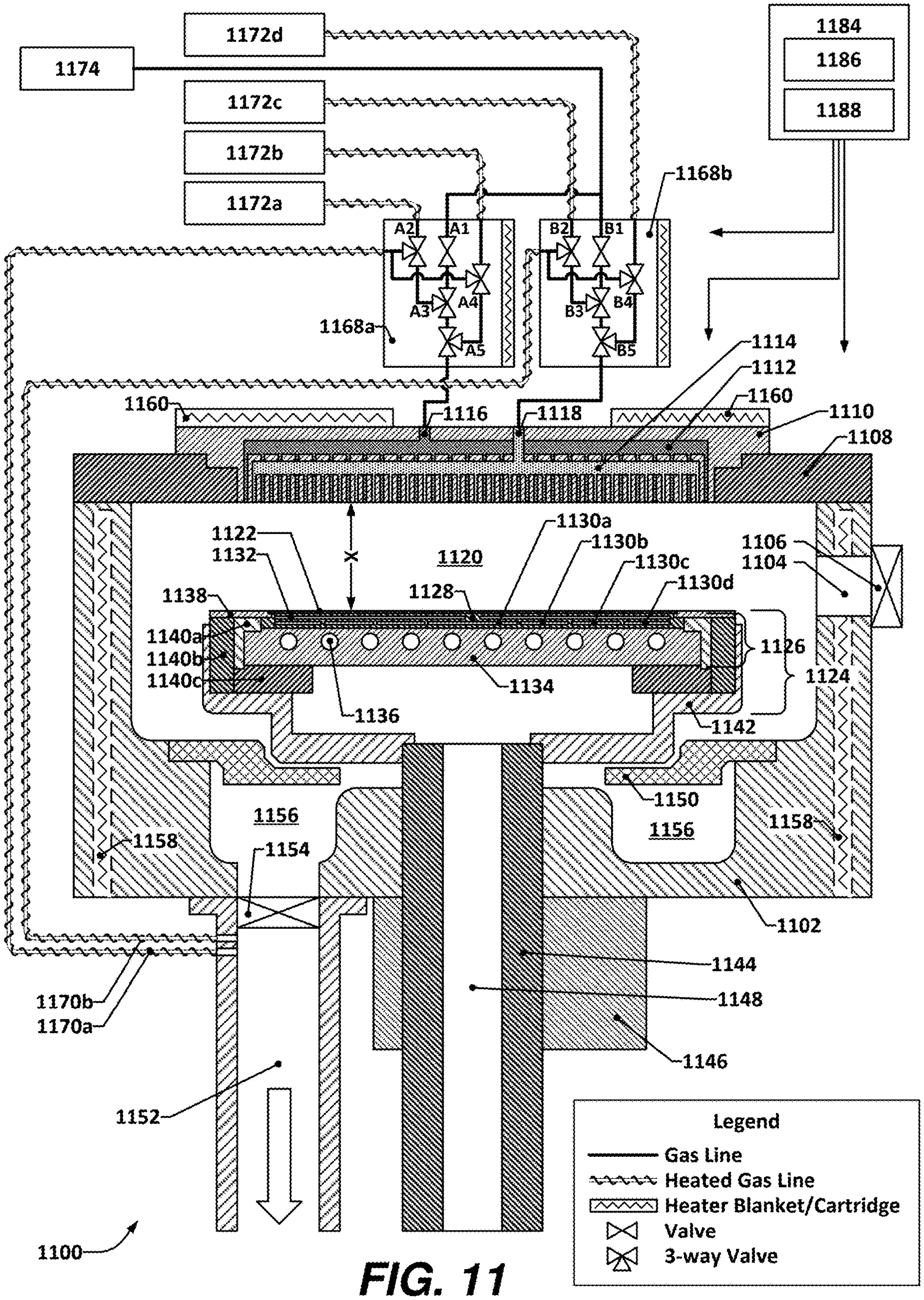
FIG. 11 depicts a cross-sectional schematic view of an example of a dry deposition apparatus according to some implementations.

FIG. 11 shows an example of a deposition chamber for vapor-based deposition of metal-containing resist material according to some implementations. As can be seen, an apparatus 1100 is depicted that has a process chamber 1102 that includes a lid 1108. The process chamber 1102 may include a wafer transfer passage 1104 through one of the walls of the process chamber 1102 that is sized to allow a substrate 1122 to be passed therethrough and into the interior of the process chamber 1102, where the substrate 1122 may be placed on a wafer support 1124. The wafer transfer passage 1104 may have a gate valve 1106 or similar door mechanism that may be operated to seal or unseal the wafer transfer passage 1104, thereby allowing the environment within the process chamber 1102 to be isolated from the environment on the other side of the gate valve 1106. For example, the process chamber 1102 may be provided substrates 1122 via a wafer handling robot that is located in an adjoining transfer chamber. Such a transfer chamber may, for example, have multiple process chambers 1102 arranged around its periphery, with each such process chamber 1102 connected with the transfer chamber via a corresponding gate valve 1106.

The wafer support 1124 may, for example, include an electrostatic chuck (ESC) 1126, which may be used to provide a wafer support surface for supporting the substrate 1122. The ESC 1126 may include, for example, a base plate 1134 that is bonded to a top plate 1128 that is placed atop the base plate 1134. The top plate 1128 may, for example, be made of a ceramic material and may have embedded within it several other components. In the depicted example, the top plate 1128 has two separate electrical systems embedded within it. One such system is an electrostatic clamping electrode system, which may have one or more clamping electrodes 1132 that may be used to generate an electric charge within the substrate 1122 that causes the substrate 1122 to be drawn against the wafer support surface of the top plate 1128. In the implementation of FIG. 11, there are two clamping electrodes 1132 that provide a bi-polar electrostatic clamping system, although some implementations may use only a single clamping electrode 1132 to provide a mono-polar electrostatic clamping system.

The other system is a thermal control system that may be used to control the temperature of the substrate 1122 during processing conditions. In FIG. 11, the thermal control system is a multi-zone thermal control system featuring four annular resistance heater traces 1130*a*, 1130*b*, 1130*c*, and 1130*d* that are concentric with one another and positioned beneath the clamping electrodes 1132. The center resistance heater traces 1130*a* may, in some implementations, fill a generally circular area, and each resistance heater trace 1130*a/b/c/d* may follow a generally serpentine or otherwise meandering path within a corresponding annular region. Each resistance heater trace 1130*a/b/c/d* may be individually controlled to provide a variety of radial heating profiles in the top plate 1128; such a four-zone heating system may, for example, be controlled to maintain the substrate 1122 so as to have a temperature uniformity of 0.5° C. in some cases. While the apparatus 1100 of FIG. 11 features a four-zone heating system in the ESC 1126, other implementations may use single-zone or multi-zone heating systems having more or fewer than four zones.

In some implementations, of, for example, temperature control mechanisms discussed above, heat pumps may be used instead of resistance heating traces. For example, in some implementations, the resistance heater traces may be replaced by, or augmented by, Peltier junctions or other, similar devices that may be controlled to "pump" heat from one side thereof to another. Such mechanisms may be used, for example, to draw heat from the top plate 1128 (and thus the substrate 1122) and direct it into the base plate 1134 and the heat exchange passages 1136, thereby allowing the substrate 1122 to be cooled more rapidly and more effectively, if desired.

The ESC 1126 may also include, for example, a base plate 1134 that may be used to provide structural support to the underside of the top plate 1128 and which may also act as a heat dispersion system. For example, the base plate 1134 may include one or more heat exchange passages 1136 that are arranged in a generally distributed fashion throughout the base plate 1134, e.g., the heat exchange passages 1136 may follow a serpentine, circular switchback, or spiral pattern around the center of the base plate 1134. A heat exchange medium, e.g., water or inert fluorinated liquid, may be circulated through the heat exchange passages 1136 during use. The flow rate and temperature of the heat exchange medium may be externally controlled so as to result in a particular heating or cooling behavior in the base plate 1134.

The ESC 1126 may, for example, be supported by a wafer support housing 1142 that is connected with, and supported by, a wafer support column 1144. The wafer support column 1144 may, for example, have a routing passage 1148 other pass-throughs for routing cabling, fluid flow conduits, and other equipment to the underside of the base plate 1134 and/or the top plate 1128. For example, while not shown in FIG. 11, cabling for providing electrical power to the resistance heater traces 1130*a/b/c/d* may be routed through the routing passage 1148, as may cabling for providing electrical power to the clamping electrodes 1132. Other cables, e.g., cables for temperature sensors, may also be routed through the routing passage 1148 to locations in the interior of the wafer support 1124. In implementations with a temperature-controllable base plate 1134, conduits for conveying heat exchange medium to and from the base plate 1134 may also be routed through the routing passage 1148. To avoid undue clutter, such cables and conduits are not depicted in FIG. 11, but it is to be understood that they would, nonetheless, be present.

The apparatus 1100 of FIG. 11 also includes a wafer support z-actuator 1146 that may provide movable support to the wafer support column 1144. The wafer support z-actuator 1146 may be actuated to cause the wafer support column 1144, and the wafer support 1124 supported thereby, to move up or down vertically, e.g., by up to several inches, within a reaction space 1120 of the process chamber 1102. In doing so, a gap distance X between the substrate 1122 and the underside of the showerhead 1110 may be tuned depending on various process conditions.

The wafer support 1124 may also include, in some implementations, one or more edge rings that may be used to control and/or fine-tune various process conditions. In FIG. 11, an upper edge ring 1138 is provided that lies on top of, for example, lower edge rings 1140*a* and 1140*b*, which, in turn, are supported by the wafer support housing 1142 and a third lower edge ring 1140*c*. The upper edge ring 1138 may, for example, be generally subjected to the same processing environment as the substrate 1122, whereas the lower edge rings 1140*a/b/c* may generally be shielded from the processing environment. Due to the increased exposure of the upper edge ring 1138, the upper edge ring 1138 may have a limited lifespan and may require more frequent replacement or cleaning as compared with the lower edge rings 1140*a/b/c*.

The apparatus 1100 may also include a system for removing process gases from the process chamber 1102 during and after processing concludes. For example, the process chamber 1102 may include an annular plenum 1156 that encircles the wafer support column 1144. The annular plenum 1156 may, in turn, be fluidically connected with a vacuum foreline 1152 that may be connected with a vacuum pump, e.g., such as may be located beneath a subfloor below the apparatus 1100. A regulator valve 1154 may be provided in between the vacuum foreline 1152 and the process chamber 1102 and actuated to control the flow into the vacuum foreline 1152. In some implementations, a baffle 1150, e.g., an annular plate or other structure that may serve to make the flow into the annular plenum 1156 more evenly distributed about the circumference of the wafer support column 1144, may be provided to reduce the chances of flow non-uniformities developing in reactants flowed across the substrate 1122.

The showerhead 1110, as shown, is a dual-plenum showerhead 1110 and includes a first plenum 1112 that is provided process gas via a first inlet 1116 and a second plenum 1114 that is provided process gas via a second inlet 1118. Generally, two plenums can be employed to maintain separation between the precursor(s) and the counter-reactant(s) prior to release of the precursor and the counter-reactant. The showerhead 1110 may, in some implementations, have more than two plenums. In some instances, a single plenum is used to deliver the precursor(s) into the reaction space 1120 of the processing chamber 1102. Each plenum may have a corresponding set of gas distribution ports that fluidically connect the respective plenum with the reaction space 1120 through the faceplate of the showerhead 1110 (the faceplate being the portion of the showerhead 1110 that is interposed between the lowermost plenum and the reaction space 1120).

The first inlet 1116 and the second inlet 1118 of the showerhead 1110 may be provided processing gases via a gas supply system, which may be configured to provide one or more precursor(s) and/or counter-reactant(s), as discussed herein. The depicted apparatus 1100 is configured to provide multiple precursors and multiple counter-reactants. For example, a first valve manifold 1168*a* may be configured to provide precursor(s) to the first inlet 1116, while a second valve manifold 1168*b* may be configured to provide other precursor(s) or other counter-reactants to the second inlet 1118.

A first valve manifold 1168*a* may be configured to provide one or more precursor(s) to the first inlet 1116, while a second valve manifold 1168*b* may be configured to provide other precursor(s) or other reactant to the second inlet 1118. In this example, the first valve manifold 1168*a*, for example, includes multiple valves A1-A5. Valve A2 may, for example, be a three-way valve that has one port fluidically connected with a first vaporizer 1172*a*, another port fluidically connected with a bypass line 1170*a*, and a third port fluidically connected with a port on another 3-way valve A3. Similarly, valve A4 may be another three-way valve that has one port fluidically connected with a second vaporizer 1172*b*, another port fluidically connected with the bypass line 1170*a*, and a third port fluidically connected with a port on another 3-way valve A5. One of the other ports on valve A5 may be fluidically connected with the first inlet 1116 while the remaining port on valve A5 may be fluidically connected with one of the remaining ports on the valve A3. The remaining port on the valve A3 may, in turn, be fluidically connected with the valve A1 which may be fluidically interposed between the valve A3 and a purge gas source 1174, e.g., nitrogen, argon, or other suitably inert gas (with respect to precursor(s) and/or counter-reactant(s)). In some implementations, only the first valve manifold is employed.

For the purposes of this disclosure, the term "fluidically connected" is used with respect to volumes, plenums, holes, etc., that may be connected with one another in order to form a fluidic connection, similar to how the term "electrically connected" is used with respect to components that are connected together to form an electric connection. The term "fluidically interposed," if used, may be used to refer to a component, volume, plenum, or hole that is fluidically connected with at least two other components, volumes, plenums, or holes such that fluid flowing from one of those other components, volumes, plenums, or holes to the other or another of those components, volumes, plenums, or holes would first flow through the "fluidically interposed" component before reaching that other or another of those components, volumes, plenums, or holes. For example, if a pump is fluidically interposed between a reservoir and an outlet, fluid that flowed from the reservoir to the outlet would first flow through the pump before reaching the outlet.

The first valve manifold 1168*a* may, for example, be controllable to cause vapors from one or both of the vaporizers 1172*a* and 1172*b* to be flowed either to the process chamber 1102 or through the first bypass line 1170*a* and into the vacuum foreline 1152. The first valve manifold 1168*a* may also be controllable to cause a purge gas to be flowed from the purge gas source 1174 and into the first inlet 1116.

For example, to flow vapor from the first vaporizer 1172*a* into the reaction space 1120, the valve A2 may be actuated to cause the vapor from the first vaporizer 1172*a* to first flow into the first bypass line 1170*a*. This flow may be maintained for a period of time sufficient to allow the flow of the vapor to reach steady state flow conditions. After sufficient time has passed (or after a flow meter, if used, indicates that the flow rate is stable), valves A2, A3, and A5 may be actuated to cause the vapor flow from the first vaporizer 1172*a* to be directed to the first inlet. Similar operations with valves A4 and A5 may be performed to deliver vapor from the second vaporizer 1172*b* to the first inlet 1116. In some instances, it may be desirable to purge one of the vapors from the first plenum 1112 by actuating the valves A1, A3, and A5 so as to cause the purge gas from the purge gas source 1174 to be flowed into the first inlet 1116. In some additional implementations, it may be desirable to simultaneously flow vapor from one of the vaporizers 1172*a* or 1172*b* in tandem with flowing gas from the purge gas into the first inlet 1116. Such implementations may be used to dilute the concentration of the reactant(s) contained in such vapor(s).

It will be appreciated that the second valve manifold 1168*b* may be controlled in a similar manner, e.g., by controlling valves B1-B5, to provide vapors from vaporizers 1172*c* and 1172*d* to the second inlet 1118 or to the second bypass line 1170*b*. It will be further appreciated that different manifold arrangements may be utilized as well, including a single unitary manifold that includes valves for controlling flow of the precursor(s), counter-reactant(s), or other reactants to the first inlet 1116 and the second inlet 1118.

As mentioned earlier, some apparatuses 1100 may feature a lesser number of vapor sources, e.g., only two vaporizers 1172, in which case the valve manifold(s) 1168 may be modified to have a lesser number of valves, e.g., only valves A1-A3.]

As discussed above, apparatuses such as apparatus 1100, which may be used to provide for dry deposition of films, may be configured to maintain particular temperature profiles within the process chamber 1102. In particular, such apparatuses 1100 may be configured to maintain the substrate 1122 at a lower temperature, e.g., at least 25° C. to 50° C. lower, than most of the equipment of the apparatus 1100 that comes into direct contact with the precursor(s) and/or counter-reactant(s). Additionally, the temperature of the equipment of the apparatus 1100 that comes into direct contact with the precursor(s) and/or counter-reactant(s) may be kept to an elevated level that is sufficiently high that condensation of the vaporized reactants on the surfaces of such equipment is discouraged. At the same time, the substrate 1122 temperature may be controlled to a level that promotes condensation, or at least deposition, of the reactants on the substrate 1122.

To provide for such temperature control, various heating systems may be included in the apparatus 1100. For example, the process chamber 1102 may have receptacles for receiving cartridge heaters 1158, e.g., for a process chamber 1102 that has a generally cylindrical interior volume but a square or rectangular external shape, vertical holes for receiving cartridge heaters 1158 may be bored into the four corners of the chamber 1102 housing. In some implementations, the showerhead 1110 may be covered with heater blankets 1160, which may be used to apply heat across the exposed upper surface of the showerhead 1110 to keep the showerhead temperature elevated. It may also be beneficial to heat various gas lines that are used to conduct the vaporized reactants from the vaporizers 1172 to the showerhead 1110. For example, resistive heater tape may be wound around such gas lines and used to heat them to an elevated temperature. As shown in FIG. 11, all of the gas lines that potentially have precursor(s) and/or counter-reactant(s) flowing through them are shown as being heated, including the bypass lines 1170. The only exceptions are the gas lines from the valve manifolds 1168 to the first inlet 1116 and the second inlet 1118, which may be quite short and may be indirectly heated by the showerhead 1110. Of course, even these gas lines may be actively heated, if desired. In some implementations, heaters may be provided proximate to the gate valve 1106 to provide heat to the gate valve as well.

The various operational systems of the apparatus 1100 may be controlled by a controller 1184, which may include one or more processors 1186 and one or more memory devices 1188 that are operatively connected with each other and that are communicatively connected with various systems and subsystems of the apparatus 1100 so as to provide for control functionality for those systems. For example, the controller 1184 may be configured to control the valves A1-A5 and B1-B5, the various heaters 1158, 1160, the vaporizers 1172, the regulator valve 1154, the gate valve 1106, the wafer support z-actuator, and so forth.

The controller 1184 may be configured, e.g., via execution of computer-executable instructions, to cause the apparatus 1100 to perform various operations consistent with the disclosure provided above.

Once the metal-containing resist film has been deposited on the substrate 1122, the substrate 1122 may, as noted above, be transferred to one or more subsequent process chambers or tool for additional operations (e.g., any described herein). Further deposition apparatuses are described in International Patent Application No. PCT/US2020/038968, filed Jun. 22, 2020, titled "APPARATUS FOR PHOTORESIST DRY DEPOSITION," which is herein incorporated by reference in its entirety.

CONCLUSION

Process and apparatus for dry development of metal and/or metal oxide photoresists, for example to form a patterning mask in the context of EUV patterning is disclosed.

It is understood that the examples and implementations described herein are for illustrative purposes only and that various modifications or changes in light thereof will be suggested to persons skilled in the art. Although various details have been omitted for clarity's sake, various design alternatives may be implemented. Therefore, the present examples are to be considered as illustrative and not restrictive, and the disclosure is not to be limited to the details given herein, but may be modified within the scope of the disclosure.

What is claimed is:

1. A method of removing metal-containing resist, the method comprising:

providing in a process chamber a metal-containing resist on an underlayer of a semiconductor substrate;

exposing the metal-containing resist to an etch gas comprising a halide at a first elevated temperature to remove an entirety of the metal-containing resist, wherein exposing the metal-containing resist to the etch gas is performed without exposure to plasma; and exposing the underlayer to plasma to remove an entirety of the underlayer, wherein the plasma comprises ions and/or radicals of an oxidizing gas or hydrogen gas.

2. The method of claim 1, wherein exposing the metal-containing resist to the etch gas comprises selectively removing the metal-containing resist relative to the underlayer.

3. The method of claim 1, wherein exposing the underlayer to plasma occurs at a second elevated temperature greater than the first elevated temperature.

4. The method of claim 1, wherein exposing the underlayer to plasma comprises exposing the underlayer and residual halides to plasma to remove the underlayer and the residual halides after removing the metal-containing resist.

5. The method of claim 1, further comprising:

exposing the semiconductor substrate to an aqueous solution of dilute hydrofluoric acid (dHF); and exposing the semiconductor substrate to an aqueous solution of dilute hydrochloric acid (dHCl) or a cleaning solution comprising ammonium hydroxide (NH4OH) and hydrogen peroxide ($H_2O_2$).

6. The method of claim 1, wherein the metal-containing resist is a photopatterned metal-containing EUV resist.

7. The method of claim 1, wherein the etch gas comprises hydrogen fluoride (HF), hydrogen chloride (HCl), hydrogen bromide (HBr), hydrogen iodide (HI), hydrogen gas and fluorine gas ($H_2$+$F_2$), hydrogen gas and chlorine gas ($H_2$+$Cl_2$), hydrogen gas and bromine gas ($H_2$+$Br_2$), hydrogen gas and iodide gas ($H_2$+$I_2$), or bromine trichloride ($BCl_3$).

8. The method of claim 1, wherein the first elevated temperature is between about 60° C. and about 250° C.

9. The method of claim 1, wherein a chamber pressure during exposure of the metal-containing resist to the etch gas is between about 100 mTorr and about 2000 mTorr, wherein a flow rate of the etch gas during exposure of the metal-containing resist to the etch gas is between about 100 sccm and about 5000 sccm.

10. The method of claim 1, wherein the underlayer comprises spin-on glass (SOG), spin-on carbon (SOC), amorphous or crystalline carbon, or silicon oxynitride (SiON).

11. The method of claim 1, further comprising:

conformally depositing a mask layer on the metal-containing resist; and removing a portion of the mask layer to expose a top surface of the metal-containing resist;

wherein exposing the metal-containing resist to the etch gas selectively removes the metal-containing resist relative to the mask layer.

12. The method of claim 1, wherein exposing the metal-containing resist to the etch gas at the first elevated temperature comprises exposing a frontside of the semiconductor substrate to light from a plurality of light-emitting diodes (LEDs).

13. A method of removing metal-containing resist, the method comprising:

providing in a process chamber a metal-containing resist on an underlayer of a semiconductor substrate; and exposing the metal-containing resist to an inorganic aqueous solution of a dilute acid to remove the metal-containing resist, wherein exposing the metal-containing resist to at least the aqueous solution of the dilute acid comprises:

exposing the semiconductor substrate to an aqueous solution of dilute hydrofluoric acid (dHF); and exposing the semiconductor substrate to an aqueous solution of dilute hydrochloric acid (dHC1) or a cleaning solution comprising ammonium hydroxide (NH4OH) and hydrogen peroxide ($H_2O_2$).

14. The method of claim 13, wherein the metal-containing resist is a photopatterned metal-containing EUV resist.

15. The method of claim 13, wherein exposing the metal-containing resist to the inorganic aqueous solution of the dilute acid selectively removes the metal- containing resist relative to the underlayer.

16. The method of claim 13, wherein the underlayer comprises spin-on glass (SOG), spin-on carbon (SOC), amorphous or crystalline carbon, or silicon oxynitride (SiON).

17. The method of claim 13, wherein exposing the metal-containing resist to the inorganic aqueous solution of the dilute acid comprises exposing a frontside and a backside of the semiconductor substrate to the inorganic aqueous solution of the dilute acid.

18. The method of claim 13, further comprising:

exposing the underlayer to plasma to treat a surface of the underlayer after removing the metal-containing resist.

19. A method of removing metal-containing resist, the method comprising:

providing in a process chamber a metal-containing resist on an underlayer of a semiconductor substrate;

exposing the metal-containing resist to an etch gas comprising a halide at a first elevated temperature to remove an entirety of the metal-containing resist;

exposing the underlayer to plasma to remove an entirety of the underlayer, wherein the plasma comprises ions and/or radicals of an oxidizing gas or hydrogen gas;

exposing the semiconductor substrate to an aqueous solution of dilute hydrofluoric acid (dHF); and exposing the semiconductor substrate to an aqueous solution of dilute hydrochloric acid (dHCl) or a cleaning solution comprising ammonium hydroxide (NH4OH) and hydrogen peroxide ($H_2O_2$).

20. The method of claim 19, wherein exposing the metal-containing resist to the etch gas comprises selectively removing the metal-containing resist relative to the underlayer.

21. The method of claim 19, wherein exposing the underlayer to plasma occurs at a second elevated temperature greater than the first elevated temperature.

22. The method of claim 19, wherein exposing the underlayer to plasma comprises exposing the underlayer and residual halides to plasma to remove the underlayer and the residual halides after removing the metal-containing resist.

23. The method of claim 19, wherein exposing the metal-containing resist to the etch gas is performed with exposure to plasma.

24. The method of claim 23, wherein the metal-containing resist is a photopatterned metal-containing EUV resist.

25. The method of claim 19, wherein the first elevated temperature is between about 60° C. and about 250° C.

26. The method of claim 19, wherein a chamber pressure during exposure of the metal-containing resist to the etch gas is between about 100 mTorr and about 2000 mTorr, wherein a flow rate of the etch gas during exposure of the metal-containing resist to the etch gas is between about 100 sccm and about 5000 sccm.

* * * * *